US012454542B2

(12) United States Patent
Stoessel et al.

(10) Patent No.: US 12,454,542 B2
(45) **Date of Patent: *Oct. 28, 2025**

(54) METAL COMPLEXES FOR USE AS EMITTERS IN ORGANIC ELECTROLUMINESCENCE DEVICES

(71) Applicant: UDC IRELAND LIMITED, Dublin (IE)

(72) Inventors: Philipp Stoessel, Frankfurt am Main (DE); Christian Ehrenreich, Darmstadt (DE)

(73) Assignee: UDC Ireland Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 18/435,314

(22) Filed: Feb. 7, 2024

(65) Prior Publication Data

US 2024/0300989 A1 Sep. 12, 2024

Related U.S. Application Data

(63) Continuation of application No. 16/320,885, filed as application No. PCT/EP2017/068292 on Jul. 20, 2017, now Pat. No. 11,932,659.

(30) Foreign Application Priority Data

Jul. 25, 2016 (EP) .................................... 16180990

(51) Int. Cl.

| | |
|---|---|
| ***C07F 15/00*** | (2006.01) |
| ***C09K 11/06*** | (2006.01) |
| ***H10K 50/11*** | (2023.01) |
| ***H10K 71/00*** | (2023.01) |
| ***H10K 85/10*** | (2023.01) |
| ***H10K 85/30*** | (2023.01) |
| ***H10K 101/10*** | (2023.01) |

(52) U.S. Cl.

CPC ...... *C07F 15/0033* (2013.01); *C07F 15/0086* (2013.01); *C09K 11/06* (2013.01); *H10K 71/311* (2023.02); *H10K 85/111* (2023.02); *H10K 85/342* (2023.02); *H10K 85/346* (2023.02); *C09K 2211/185* (2013.01); *H10K 50/11* (2023.02); *H10K 85/141* (2023.02); *H10K 2101/10* (2023.02); *Y02E 10/549* (2013.01)

(58) Field of Classification Search

None

See application file for complete search history.

(56) References Cited

U.S. PATENT DOCUMENTS

| | | | | |
|---|---|---|---|---|
| 7,816,531 | B2 | 10/2010 | Philipp | |
| 9,169,282 | B2 | 10/2015 | Stoessel | |
| 9,273,080 | B2 | 3/2016 | Stoessel | |
| 9,853,228 | B2 | 12/2017 | Koenen | |
| 10,672,996 | B2 * | 6/2020 | Ma | H01L 51/0085 |
| 10,672,997 | B2 * | 6/2020 | Margulies | H01L 51/0085 |
| 11,024,815 | B2 | 6/2021 | Stoessel | |
| 11,932,659 | B2 * | 3/2024 | Stoessel | C07F 15/0033 |
| 2003/0091862 | A1 | 5/2003 | Tokito | |
| 2005/0170207 | A1 | 8/2005 | Ma | |
| 2007/0176540 | A1 | 8/2007 | Watanabe | |
| 2012/0235135 | A1 | 9/2012 | Abe | |
| 2012/0264936 | A1 | 10/2012 | Inoue | |
| 2013/0082209 | A1 | 4/2013 | Stoessel | |
| 2017/0077425 | A1 | 3/2017 | Ma | |
| 2017/0077426 | A1 | 3/2017 | Xia | |
| 2017/0365801 | A1 * | 12/2017 | Margulies | H01L 51/0085 |
| 2018/0026208 | A1 | 1/2018 | Tsai | |
| 2018/0026209 | A1 | 1/2018 | Stoessel | |

FOREIGN PATENT DOCUMENTS

| | | | |
|---|---|---|---|
| CN | 105419202 | A | 3/2016 |
| JP | 2013117005 | A | 6/2013 |
| WO | 2010086089 | A1 | 8/2010 |
| WO | 2011157339 | A1 | 12/2011 |
| WO | 2016124304 | A1 | 8/2016 |

OTHER PUBLICATIONS

Bo Liang et al. "Application of heteroleptic iridium complexes with fluorenyl-modified 1-phenylisoquinoline ligand for high-efficiency red polymer light-emitting devices", J. Organometallic Chem. 2009, vol. 694, p. 3172-3178 (Year: 2009).

(Continued)

*Primary Examiner* — Seokmin Jeon

(74) *Attorney, Agent, or Firm* — Riverside Law LLP

(57) ABSTRACT

The present invention relates to metal complexes which are substituted by aromatic and icylic aliphatic substituents and are suitable for use as emitters in organic electroluminescent devices. The electronic devices of the invention, especially organic electroluminescent devices, are notable for advantages that are not accompanied by a deterioration in the further electronic properties. The invention provides a compound of the following formula (1):

Formula (1)

$$M\text{-}[[[Ar]_p\text{-}B\text{-}[Ar]_q]_m\text{-}R^B]_n;$$

wherein B is a group of the following formula (2):

Formula (2)

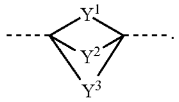

20 Claims, No Drawings

(56) References Cited

OTHER PUBLICATIONS

English translation of KR 2013/0043460 A and the original KR 2013/0043460 A, Jong Tae Je, Apr. 30, 2013 (Year: 2013) 101 pages.
Lin et al., "Unichromophoric Platinum-Acetylides That Contain Pentiptycene Scaffolds: Torsion-induced Dual Emission and Steric Shielding of Dynamic Quenching," Inorganic Chemistry, Voi, 53, pp. 737-745 (2014).
Montalti et al. Handbook of photochemistry, Chapter 3—Photophysical properties of organic compounds, 3rd edition, Taylor & Francis Group, LLC, 2006, pp. 83-351 (Year: 2006).
Qi Wang et al. "Using interlayer step-wise triplet transfer to achieve an efficient white organic light-emitting diode with high color-stability", Appl. Phys. Lett. 2014, vol. 104, p. 193303 (Year: 2014).
Richard D. Hreha et al. "2,7-Bis(diarylamino)-9,9-dimethylfluorenes as hole-transport materials for organic light-emitting diodes", Adv. Func. Mater. 2003, vol. 13, p. 967-973 (Year: 2003).
Wang et al., "Molecular Turnstiles Regulated bv Metal lons," Journal of Organic Chemistry, Voi. 81, pp. 3364-3371, (2016).

* cited by examiner

METAL COMPLEXES FOR USE AS EMITTERS IN ORGANIC ELECTROLUMINESCENCE DEVICES

CROSS-REFERENCE TO RELATED APPLICATIONS

The present application is a continuation of U.S. patent application Ser. No. 16/320,885, filed Jan. 25, 2019, now allowed, which is a National Stage entry, filed pursuant to 35 U.S.C. § 371, of PCT/EP2017/068292, filed Jul. 20, 2017, which claims the benefit of European Patent Application No. 16180990.0, filed Jul. 25, 2016, each of which Applications are hereby incorporated by reference in their entireties.

FIELD

The present invention relates to metal complexes which are substituted by aromatic and bicydic aliphatic substituents and are suitable for use as emitters in organic electroluminescent devices.

BACKGROUND

According to the prior art, triplet emitters used in phosphorescent organic electroluminescent devices (OLEDs) are, in particular, ortho-metallated iridium or platinum complexes having aromatic ligands, where the ligands bind to the metal via a negatively charged carbon atom and an uncharged nitrogen atom or via a negatively charged carbon atom and an uncharged carbene carbon atom. Examples of such complexes are tris(phenylpyridyl)iridium(III) and derivatives thereof, where the ligands used are, for example, 1- or 3-phenylisoquinolines, 2-phenylquinolines or phenylcarbenes.

The problem addressed by the present invention is that of providing novel metal complexes suitable as emitters for use in OLEDs. It is a particular object to provide emitters which exhibit oriented emission and/or exhibit improved properties in relation to efficiency, operating voltage and/or lifetime. Through oriented emission, it is possible to obtain a higher quantum efficiency through improved outcoupling of light from the component, such that the OLED overall has a higher efficiency. As a consequence, the component can be driven with lower current, which results in a higher lifetime as a further advantage.

It has been found that the abovementioned problem is solved, surprisingly, by iridium complexes or platinum complexes which contain one or more substituents from arylene and heteroarylene groups and aliphatic bi- and oligocyclic groups and are of very good suitability for use in an organic electroluminescent device. The present invention provides these complexes and organic electroluminescent devices comprising these complexes.

SUMMARY

The invention provides a compound of the following formula (1):

Formula (1)

$$M-[[[Ar]_p-B-[Ar]_q]_m-R^B]_n$$

where the symbols and indices used are as follows:

M is the same or different at each instance and is an organometallic iridium complex or an organometallic platinum complex;

Ar is the same or different at each instance and is a linear-bonded arylene or heteroarylene group which has 6 to 30 aromatic ring atoms and may be substituted by one or more R radicals;

B is a group of the following formula (2):

Formula (2)

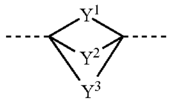

where the dotted bonds indicate the linkages of this group to Ar or to $R^B$ and, in addition:

$Y^1$, $Y^2$, $Y^3$ is the same or different at each instance and is $CR_2$, $CR_2—CR_2$, $CR_2—CR_2—CR_2$, $CR_2—CR_2—CR_2—CR_2$, CR=CR or an ortho-bonded phenylene group which may be substituted by one or more R radicals; at the same time, the $Y^1$, $Y^2$ and/or $Y^3$ groups may be joined to one another by a single bond or via R radicals, so as to form oligocyclic groups;

$R^B$ is the same or different at each instance and is selected from M or H, D, a straight-chain alkyl group having 1 to 20 carbon atoms or a branched or cyclic alkyl group having 3 to 20 carbon atoms, where the alkyl group may be substituted in each case by one or more $R^1$ radicals, or an aromatic or heteroaromatic ring system which has 5 to 40 aromatic ring atoms and may be substituted in each case by one or more $R^1$ radicals;

R is the same or different at each instance and is H, D, F, Cl, Br, I, $N(R^1)_2$, CN, $NO_2$, $OR^1$, $SR^1$, COOH, C(=O)$N(R^1)_2$, $Si(R^1)_3$, $B(OR^1)_2$, C(=O)$R^1$, P(=O)$(R^1)_2$, S(=O)$R^1$, S(=O)$_2R^1$, a straight-chain alkyl group having 1 to 20 carbon atoms or a branched or cyclic alkyl group having 3 to 20 carbon atoms, where the alkyl group may be substituted in each case by one or more $R^1$ radicals, where one or more nonadjacent $CH_2$ groups may be replaced by $R^1C=CR^1$, C≡C, $Si(R^1)_2$, C=O, $NR^1$, O, S or $CONR^1$, or an aromatic or heteroaromatic ring system which has 5 to 40 aromatic ring atoms and may be substituted in each case by one or more $R^1$ radicals; at the same time, two R radicals together may also form a ring system;

$R^1$ is the same or different at each instance and is H, D, F, Cl, Br, I, $N(R^2)_2$, CN, $NO_2$, $OR^2$, $SR^2$, $Si(R^2)_3$, $B(OR^2)_2$, C(=O)$R^2$, P(=O)$(R^2)_2$, S(=O)$R^2$, S(=O)$_2R^2$, $OSO_2R^2$, a straight-chain alkyl group having 1 to 20 carbon atoms or a branched or cyclic alkyl group having 3 to 20 carbon atoms, where the alkyl group may be substituted in each case by one or more $R^2$ radicals, where one or more nonadjacent $CH_2$ groups may be replaced by $R^2C=CR^2$, C≡C, $Si(R^2)_2$, C=O, $NR^2$, O, S or $CONR^2$, or an aromatic or heteroaromatic ring system which has 5 to 40 aromatic ring atoms and may be substituted in each case by one or more $R^2$ radicals; at the same time, two or more $R^1$ radicals together may form a ring system;

$R^2$ is the same or different at each instance and is H, D, F or an aliphatic, aromatic or heteroaromatic organic radical, especially a hydrocarbyl radical, having 1 to 20 carbon atoms, in which one or more hydrogen atoms may also be replaced by F;

n is 1, 2, 3, 4, 5 or 6;

p is the same or different at each instance and is 1 to 100;

q, is the same or different at each instance and is 0 to 100;

m is the same or different at each instance and is 1 to 100.

DETAILED DESCRIPTION

The invention provides a compound of the following formula (1):

Formula (1)

$$M-[[[Ar]_p-B-[Ar]_q]_m-R^B]_n$$

where the symbols and indices used are as follows:

M is the same or different at each instance and is an organometallic iridium complex or an organometallic platinum complex;

Ar is the same or different at each instance and is a linear-bonded arylene or heteroarylene group which has 6 to 30 aromatic ring atoms and may be substituted by one or more R radicals;

B is a group of the following formula (2):

Formula (2)

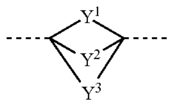

where the dotted bonds indicate the linkages of this group to Ar or to $R^B$ and, in addition:

$Y^1$, $Y^2$, $Y^3$ is the same or different at each instance and is $CR_2$, $CR_2—CR_2$, $CR_2—CR_2—CR_2$, $CR_2—CR_2—CR_2—CR_2$, CR═CR or an ortho-bonded phenylene group which may be substituted by one or more R radicals; at the same time, the $Y^1$, $Y^2$ and/or $Y^3$ groups may be joined to one another by a single bond or via R radicals, so as to form oligocyclic groups;

$R^B$ is the same or different at each instance and is selected from M or H, D, a straight-chain alkyl group having 1 to 20 carbon atoms or a branched or cyclic alkyl group having 3 to 20 carbon atoms, where the alkyl group may be substituted in each case by one or more $R^1$ radicals, or an aromatic or heteroaromatic ring system which has 5 to 40 aromatic ring atoms and may be substituted in each case by one or more $R^1$ radicals;

R is the same or different at each instance and is H, D, F, Cl, Br, I, $N(R^1)_2$, CN, $NO_2$, $OR^1$, $SR^1$, COOH, C(═O)$N(R^1)_2$, $Si(R^1)_3$, $B(OR^1)_2$, C(═O)$R^1$, P(═O)$(R^1)_2$, S(═O)$R^1$, S(═O)$_2R^1$, a straight-chain alkyl group having 1 to 20 carbon atoms or a branched or cyclic alkyl group having 3 to 20 carbon atoms, where the alkyl group may be substituted in each case by one or more $R^1$ radicals, where one or more nonadjacent $CH_2$ groups may be replaced by $R^1C═CR^1$, C≡C, $Si(R^1)_2$, C═O, $NR^1$, O, S or $CONR^1$, or an aromatic or heteroaromatic ring system which has 5 to 40 aromatic ring atoms and may be substituted in each case by one or more $R^1$ radicals; at the same time, two R radicals together may also form a ring system;

$R^1$ is the same or different at each instance and is H, D, F, Cl, Br, I, $N(R^2)_2$, CN, $NO_2$, $OR^2$, $SR^2$, $Si(R^2)_3$, $B(OR^2)_2$, C(═O)$R^2$, P(═O)$(R^2)_2$, S(═O)$R^2$, S(═O)$_2R^2$, $OSO_2R^2$, a straight-chain alkyl group having 1 to 20 carbon atoms or a branched or cyclic alkyl group having 3 to 20 carbon atoms, where the alkyl group may be substituted in each case by one or more $R^2$ radicals, where one or more nonadjacent $CH_2$ groups may be replaced by $R^2C═CR^2$, C≡C, $Si(R^2)_2$, C═O, $NR^2$, O, S or $CONR^2$, or an aromatic or heteroaromatic ring system which has 5 to 40 aromatic ring atoms and may be substituted in each case by one or more $R^2$ radicals; at the same time, two or more $R^1$ radicals together may form a ring system;

$R^2$ is the same or different at each instance and is H, D, F or an aliphatic, aromatic or heteroaromatic organic radical, especially a hydrocarbyl radical, having 1 to 20 carbon atoms, in which one or more hydrogen atoms may also be replaced by F;

n is 1, 2, 3, 4, 5 or 6;

p is the same or different at each instance and is 1 to 100;

q is the same or different at each instance and is 0 to 100;

m is the same or different at each instance and is 1 to 100.

p, q and m are integers.

When q=0 the compound is one of the following formula (1A), and when q=1 to 100 it is a compound of the following formula (1B):

Formula (1A)

$$M-[[[Ar]_p-B]_m-R^B]_n$$

Formula (1B)

$$M-[[[Ar]_p-B-[Ar]_p]_m-R^B]_n$$

where the symbols and indices used have the definitions given above.

Preferably, p is the same or different at each instance and is 1 to 50, more preferably 1 to 20, even more preferably 1 to 10 and especially 1, 2, 3 or 4. Preferably, in addition, q is the same or different at each instance and is 0 to 50, more preferably 0 to 10, even more preferably 0 to 10 and especially 0, 1, 2, 3 or 4. Preferably, n is the same or different at each instance and is 1 to 50, more preferably 1 to 20, even more preferably 1 to 10 and especially 1, 2, 3, 4 or 5. More particularly, the preferred embodiments of p and m listed here are simultaneously applicable.

Preferably, in addition, n=1, 2 or 3, more preferably n=1 or 2, and even more preferably n=1.

When two R or $R^1$ radicals together form a ring system, it may be mono- or polycyclic, and aliphatic, heteroaliphatic, aromatic or heteroaromatic. In this case, the radicals which together form a ring system may be adjacent, meaning that these radicals are bonded to the same carbon atom or to carbon atoms directly bonded to one another, or they may be further removed from one another.

The wording that two or more radicals together may form a ring, in the context of the present description, shall be understood to mean, inter alia, that the two radicals are joined to one another by a chemical bond with formal elimination of two hydrogen atoms. This is illustrated by the following scheme:

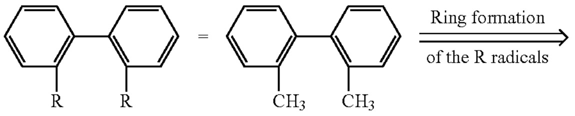

-continued

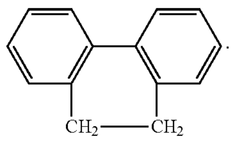

Ring formation of bicyclic, tricyclic and oligocyclic structures in likewise possible. In addition, however, the abovementioned wording shall also be understood to mean that, if one of the two radicals is hydrogen, the second radical binds to the position to which the hydrogen atom was bonded, forming a ring. This shall be illustrated by the following scheme:

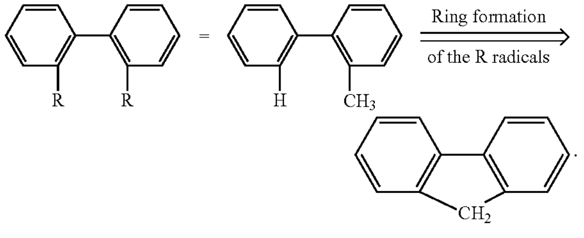

In an entirely analogous manner, this shall also be understood to mean that, if both radicals are hydrogen atoms, ring formation occurs via a single bond in place of the two hydrogen atoms.

The formation of an aromatic ring system shall be illustrated by the following scheme:

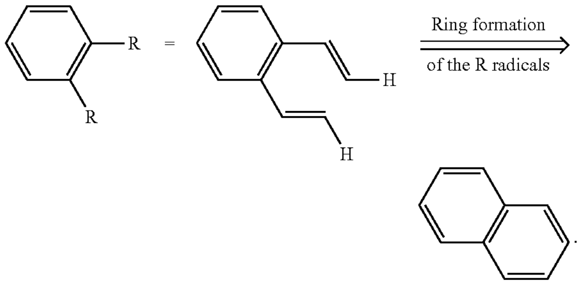

This kind of ring formation is possible in radicals bonded to carbon atoms directly bonded to one another, or in radicals bonded to further-removed carbon atoms. Preference is given to this kind of ring formation in radicals bonded to carbon atoms directly bonded to one another or to the same carbon atom.

An aryl group in the context of this invention contains 6 to 40 carbon atoms; a heteroaryl group in the context of this invention contains 2 to 40 carbon atoms and at least one heteroatom, with the proviso that the sum total of carbon atoms and heteroatoms is at least 5. The heteroatoms are preferably selected from N, O and/or S. An aryl group or heteroaryl group is understood here to mean either a simple aromatic cycle, i.e. benzene, or a simple heteroaromatic cycle, for example pyridine, pyrimidine, thiophene, etc., or a fused aryl or heteroaryl group, for example naphthalene, anthracene, phenanthrene, quinoline, isoquinoline, etc. Furthermore, in the context of the present invention, an aryl group shall be understood to mean a group in which two, three or more phenyl groups directly bonded to one another are bridge to one another by a $CR_2$ group, i.e., for example, a fluorene group, a spirobifluorene group or an indenofluorene group.

An aromatic ring system in the context of this invention contains 6 to 40 carbon atoms in the ring system. A heteroaromatic ring system in the context of this invention contains 1 to 40 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention shall be understood to mean a system which does not necessarily contain only aryl or heteroaryl groups, but in which it is also possible for two or more aryl or heteroaryl groups to be interrupted by a nonaromatic unit (preferably less than 10% of the atoms other than H), for example a carbon, nitrogen or oxygen atom or a carbonyl group. For example, systems such as triarylamine, diaryl ethers, stilbene, etc. shall thus also be regarded as aromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl, terphenyl, quaterphenyl or bipyridine, shall likewise be regarded as an aromatic or heteroaromatic ring system.

A cyclic alkyl, alkoxy or thioalkoxy group in the context of this invention is understood to mean a monocyclic, bicyclic or polycyclic group.

In the context of the present invention, a $C_1$— to $C_{20}$-alkyl group in which individual hydrogen atoms or $CH_2$ groups may also be replaced by the abovementioned groups are understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. A $C_1$— to $C_{20}$-alkoxy group is understood to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system which has 5-40 aromatic ring atoms and may also be substituted in each case by the abovementioned radicals and which may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

In a preferred embodiment of the invention, the triplet energy of the fragment M is not more than 0.1 eV greater than the triplet energy of the fragment $—[[Ar]_p—B—[Ar]_q]_m—R^B$. This fragment corresponds to $—[[Ar]_p—B]_m—R^B$ when q=0 or $—[[Ar]_p—B—[Ar]_p]_m—R^B$ when q=1 to 100. More preferably, the triplet energy of the fragment M is equal to or less than the triplet energy of the fragment $—[[Ar]_p—B—[Ar]_q]_m—R^B$, more preferably at least 0.1 eV lower.

In the context of the present invention, the triplet energy of the fragment M is understood to mean the triplet energy of a compound that has the structure of M but has a hydrogen atom in each case rather than the $—[[Ar]_p—B—[Ar]_q]_m—R^B$ substituent. The triplet energy of the fragment $—[[Ar]_p—B—[Ar]_q]_m—R^B$ is understood to mean the triplet energy of a compound that has the structure $H—[[Ar]_p—B—[Ar]_q]_m—R^B$. The triplet energy is determined by quantum-chemical calculation, as described in general terms in the examples section at the back.

There follows a description of preferred iridium complexes or platinum complexes M. As described above, these are organometallic complexes. An organometallic complex in the context of the present invention is a complex having at least one metal-carbon bond.

In a preferred embodiment of the invention, the iridium complex or platinum complex is uncharged, i.e. electrically neutral. The iridium complex here contains preferably either three bidentate, monoanionic ligands or one tripodal, hexadentate, trianionic ligand, and the platinum complex contains either two bidentate, monoanionic ligands or one tetradentate, dianionic ligand.

The bond of the ligand to the iridium may either be a coordinate bond or a covalent bond, or the covalent fraction of the bond may vary according to the ligand. When it is said in the present application that a ligand or a sub-ligand coordinates or binds to the iridium, this refers in the context of the present application to any kind of bond of the ligand or sub-ligand to the iridium, irrespective of the covalent fraction of the bond.

In a preferred embodiment of the invention, M is an iridium complex. More preferably, it is an iridium complex having a tripodal, hexadentate ligand, as described hereinafter. In this case, the tripodal, hexadentate ligand contains three bidentate sub-ligands which may be the same or different and coordinate to an iridium atom, where the three bidentate sub-ligands are joined via a bridge of the following formula (3) or formula (4)

Formula (3)

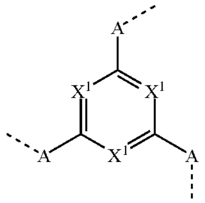

Formula (4)

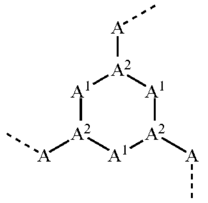

where the dotted bond represents the bond of the bidentate sub-ligands to this structure, R, $R^1$ and $R^2$ have the given above definitions and, in addition:

$X^1$ is the same or different at each instance and is CR or N;

$A^1$ is the same or different at each instance and is $C(R)_2$ or O;

$A^2$ is the same or different at each instance and is CR, P(═O), B or SiR, with the proviso that, when $A^2$=P(═O), B or SiR, the symbol $A^1$ is O and the symbol A bonded to this $A^2$ is not —C(═O)—NR'— or —C(═O)—O—;

A is the same or different at each instance and is —CR═CR—, —C(═O)—NR'—, —C(═O)—O—, $—CR_2—CR_2—$ or a group of the following formula (5):

Formula (5)

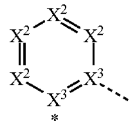

where the dotted bond represents the position of the bond of the bidentate sub-ligands to this structure and * represents the position of the linkage of the unit of the formula (5) to the central cyclic group, i.e. the group explicitly included in formula (3) or (4);

$X^2$ is the same or different at each instance and is CR or N or two adjacent $X^2$ groups together are NR, O or S, thus forming a five-membered ring, and the remaining $X^2$ are the same or different at each instance and are CR or N; or two adjacent $X^2$ groups together are CR or N when one of the $X^3$ groups in the cycle is N, thus forming a five-membered ring; with the proviso that not more than two adjacent $X^2$ groups are N;

$X^3$ is C at each instance or one $X^3$ group is N and the other $X^3$ group in the same cycle is C; with the proviso that two adjacent $X^2$ groups together are CR or N when one of the $X^3$ groups in the cycle is N;

R' is the same or different at each instance and is H, D, a straight-chain alkyl group having 1 to 20 carbon atoms or a branched or cyclic alkyl group having 3 to 20 carbon atoms, where the alkyl group in each case may be substituted by one or more $R^1$ radicals and where one or more nonadjacent $CH_2$ groups may be replaced by $Si(R^1)_2$, or an aromatic or heteroaromatic ring system which has 5 to 40 aromatic ring atoms and may be substituted in each case by one or more $R^1$ radicals; at the same time, the three bidentate sub-ligands, apart from by the bridge of the formula (3) or (4), may also be ring-closed by a further bridge to form a cryptate.

The $—[[Ar]_p—B—[Ar]_q]_m—R^B$ group may be joined to the complex M either at the group of the formula (3) or (4) or at one of the sub-ligands.

The structure of the hexadentate tripodal ligands can be shown in schematic form by the following formula (Lig):

(Lig)

where V represents the bridge of formula (3) or (4) and L1, L2 and L3 are the same or different at each instance and are each bidentate sub-ligands, preferably mono-anionic bidentate sub-ligands. “Bidentate” means that the particular sub-ligand in the complex M coordinates or binds to the iridium via two coordination sites. “Tripodal” means that the ligand has three sub-ligands bonded to the bridge V or the bridge of the formula (3) or (4). Since the ligand has three bidentate sub-ligands, the overall result is a hexadentate ligand, i.e. a ligand which coordinates or binds to the iridium via six coordination sites. The expression “bidentate sub-ligand” in the context of this application means that this unit would be a bidentate ligand if the bridge of the formula (3) or (4) were not present. However, as a result of the formal abstraction of a hydrogen atom in this bidentate ligand and the attachment to the bridge of the formula (3) or (4), it is not a separate ligand but a portion of the hexadentate ligand which thus arises, and so the term “sub-ligand” is used therefor.

The iridium complex M formed with this ligand of the formula (Lig) can thus be represented schematically by the following formula:

M

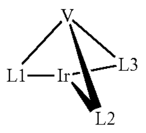

where V represents the bridge of formula (3) or (4) and L1, L2 and L3 are the same or different at each instance and are each bidentate sub-ligands.

Recited hereinafter are preferred embodiments of the bridge of the formula (3) or (4) that joins the three bidentate sub-ligands. Suitable embodiments of the group of the formula (3) are the structures of the following formulae (6) to (9), and suitable embodiments of the group of the formula (4) are the structures of the following formulae (10) to (4):

Formula (6)

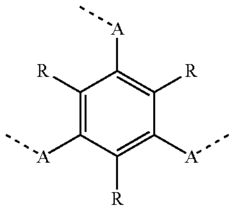

Formula (7)

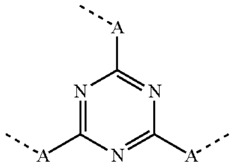

Formula (8)

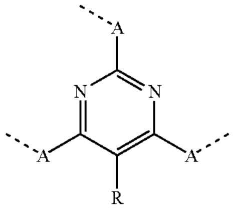

Formula (9)

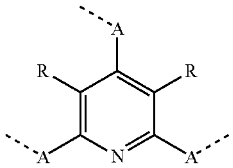

Formula (10)

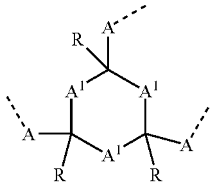

Formula (11)

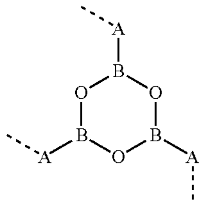

Formula (12)

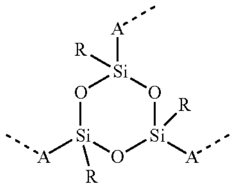

-continued

Formula (13)

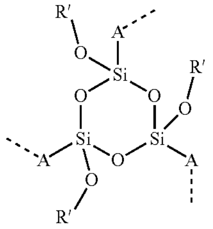

Formula (14)

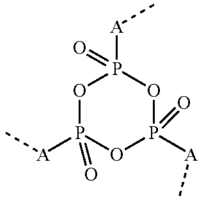

Preferred R radicals in formulae (6) to (14) are as follows:

- R is the same or different at each instance and is H, D, F, CN, $OR^1$, a straight-chain alkyl group having 1 to 10 carbon atoms or a branched or cyclic alkyl group having 3 to 10 carbon atoms, each of which may be substituted by one or more $R^1$ radicals, or an aromatic or heteroaromatic ring system which has 5 to 24 aromatic ring atoms and may be substituted in each case by one or more $R^1$ radicals;
- $R^1$ is the same or different at each instance and is H, D, F, CN, $OR^2$, a straight-chain alkyl group having 1 to 10 carbon atoms or a branched or cyclic alkyl group having 3 to 10 carbon atoms, each of which may be substituted by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a ring system;
- $R^2$ is the same or different at each instance and is H, D, F or an aliphatic, aromatic and/or heteroaromatic organic radical having 1 to 20 carbon atoms, in which one or more hydrogen atoms may also be replaced by F.

Particularly preferred R radicals in formulae (6) to (14) are as follows:

- R is the same or different at each instance and is H, D, F, CN, a straight-chain alkyl group having 1 to 4 carbon atoms or a branched or cyclic alkyl group having 3 to 6 carbon atoms, each of which may be substituted by one or more $R^1$ radicals, or an aromatic or heteroaromatic ring system which has 6 to 12 aromatic ring atoms and may be substituted in each case by one or more $R^1$ radicals;
- $R^1$ is the same or different at each instance and is H, D, F, CN, a straight-chain alkyl group having 1 to 4 carbon atoms or a branched or cyclic alkyl group having 3 to 6 carbon atoms, each of which may be substituted by one or more $R^2$ radicals, or an aromatic or heteroaromatic ring system which has 6 to 12 aromatic ring atoms and may be substituted in each case by one or more $R^2$ radicals; at the same time, two or more adjacent $R^1$ radicals together may form a ring system;
- $R^2$ is the same or different at each instance and is H, D, F or an aliphatic or aromatic hydrocarbyl radical having 1 to 12 carbon atoms.

In a preferred embodiment of the invention, all $X^1$ groups in the group of the formula (3) are CR, and so the central trivalent cycle of the formula (3) is a benzene. More preferably, all $X^1$ groups are CH. In a further preferred embodiment of the invention, all $X^1$ groups are a nitrogen atom, and so the central trivalent cycle of the formula (3) is a triazine. Preferred embodiments of the formula (3) are thus the structures of the formulae (6) and (7) depicted above. More preferably, the structure of the formula (6) is a structure of the following formula (6'):

Formula (6')

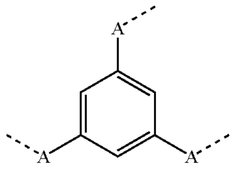

where the symbols have the definitions given above.

In a further preferred embodiment of the invention, all $A^2$ groups in the group of the formula (4) are CR. More preferably, all $A^2$ groups are CH. Preferred embodiments of the formula (4) are thus the structures of the formula (10) depicted above. More preferably, the structure of the formula (10) is a structure of the following formula (10') or (10"):

Formula (10')

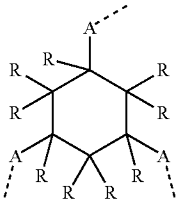

Formula (10")

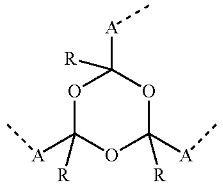

where the symbols have the definitions given above and R is preferably H. Particular preference is given here to the group of the formula (10').

When $A^2$ is CR, especially when all $A^2$ are CR, very particularly when, in addition, 0, 1, 2 or 3, especially 3, of the $A^1$ are $CR_2$, the R radicals on $A^2$ may assume different positions depending on the configuration. Preference is given here to small R radicals such as H or D. It is preferable that they are either all directed away from the metal (apical) or all directed inward toward the metal (endohedral). This is illustrated hereinafter by the example of a complex with ester bridges. This is equally true of ortho-arylene, ortho-heteroarylene, 1,2-olefin, imine and amide bridges, irrespective of how the bridge is oriented, i.e. whether the carbonyl group of the ester/amide bridge or the nitrogen atom of the imine bridge binds to the cyclohexane ring or to the aromatic system of the bidentate sub-ligand.

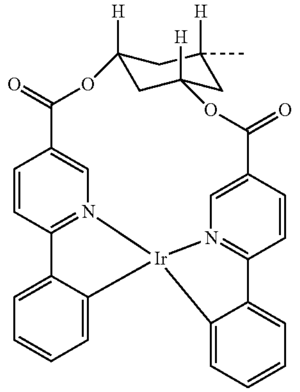

apical

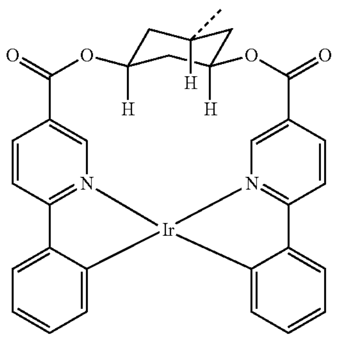

endohedral

For the sake of clarity, the third sub-ligand is not shown, but merely indicated by the dotted bond. Preference is therefore given to complexes that can assume at least one of the two configurations. These are complexes in which all three A groups are arranged equatorially on the central ring.

There follows a description of preferred A groups as occur in the structures of the formulae (3) and (4) and (6) to (14). The A group may be the same or different at each instance and may be an alkenyl group, an amide group, an ester group or an ortho-bonded arylene or heteroarylene group of the formula (5). When A is an alkenyl group, it is a cis-bonded alkenyl group. In the case of unsymmetric A groups, any orientation of the groups is possible. This is shown schematically hereinafter by the example of A=—C(=O)—O—. This gives rise to the following possible orientations of A, all of which are encompassed by the present invention:

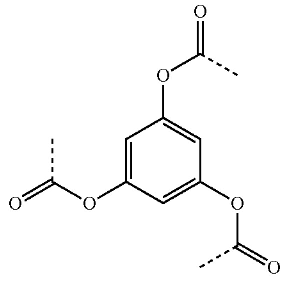

-continued

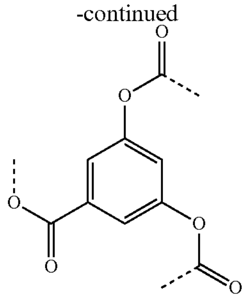

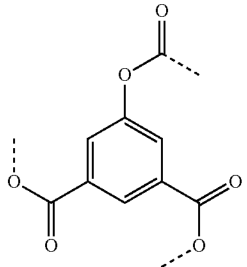

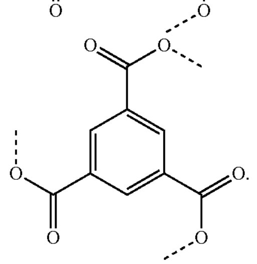

In a preferred embodiment of the invention, A is the same or different, more preferably the same, at each instance and is selected from the group consisting of —C(=O)—O—, —C(=O)—NR'— and a group of the formula (5). Further preferably, two A groups are the same and also have the same substitution, and the third A group is different from the first two A groups, or all three A groups are the same and also have the same substitution. Preferred combinations for the three A groups in formulae (3) and (4) and the preferred embodiments are:

| A | A | A |
|---|---|---|
| Formula (5) | Formula (5) | Formula (5) |
| —C(=O)—O— | —C(=O)—O— | —C(=O)—O— |
| —C(=O)—O— | —C(=O)—O— | Formula (5) |
| —C(=O)—O— | Formula (5) | Formula (5) |
| —C(=O)—NR'— | —C(=O)—NR'— | —C(=O)—NR'— |
| —C(=O)—NR'— | —C(=O)—NR'— | Formula (5) |
| —C(=O)—NR'— | Formula (5) | Formula (5) |

Particular preference is given here to structures in which all three A symbols are each a group of the formula (5).

When A is —C(=O)—NR'—, R' is preferably the same or different at each instance and is a straight-chain alkyl group having 1 to 10 carbon atoms or a branched or cyclic alkyl group having 3 to 10 carbon atoms or an aromatic or heteroaromatic ring system which has 6 to 24 aromatic ring atoms and may be substituted in each case by one or more $R^1$ radicals. More preferably, R' is the same or different at each instance and is a straight-chain alkyl group having 1 to 5 carbon atoms or a branched or cyclic alkyl group having 3 to 6 carbon atoms or an aromatic or heteroaromatic ring system which has 6 to 12 aromatic ring atoms and may be substituted in each case by one or more $R^1$ radicals, but is preferably unsubstituted.

Preferred embodiments of the group of the formula (5) are described hereinafter. The group of the formula (5) may represent a heteroaromatic five-membered ring or an aromatic or heteroaromatic six-membered ring. In a preferred embodiment of the invention, the group of the formula (5) contains not more than two heteroatoms in the aromatic or heteroaromatic unit, more preferably not more than one heteroatom. This does not mean that any substituents bonded to this group cannot also contain heteroatoms. In addition, this definition does not mean that formation of rings by substituents cannot give rise to fused aromatic or heteroaromatic structures, for example naphthalene, benzimidazole, etc.

When both $X^3$ groups in formula (5) are carbon atoms, preferred embodiments of the group of the formula (5) are the structures of the following formulae (15) to (31), and, when one $X^3$ group is a carbon atom and the other $X^3$ group in the same cycle is a nitrogen atom, preferred embodiments of the group of the formula (4) are the structures of the following formulae (32) to (39):

Formula (15)

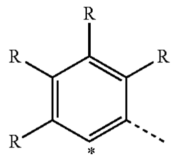

Formula (16)

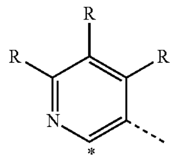

Formula (17)

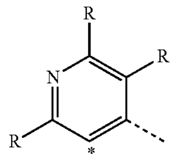

Formula (18)

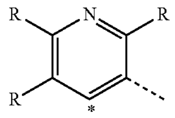

Formula (19)

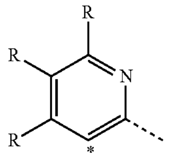

Formula (20)

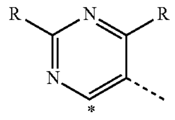

-continued

Formula (21)

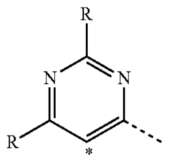

Formula (22)

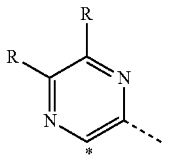

Formula (23)

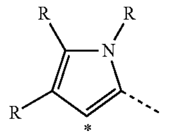

Formula (24)

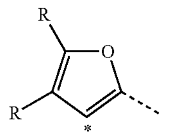

Formula (25)

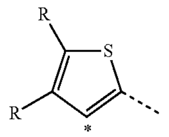

Formula (26)

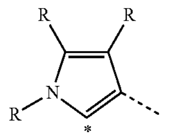

Formula (27)

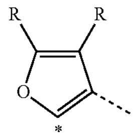

Formula (28)

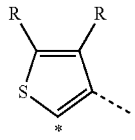

Formula (29)

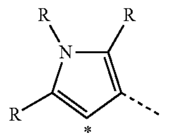

Formula (30)

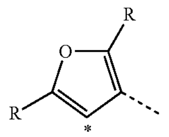

-continued

Formula (31)

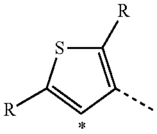

Formula (32)

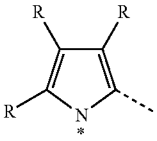

Formlua (33)

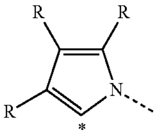

Formula (34)

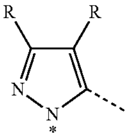

Formula (35)

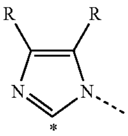

Formula (36)

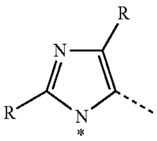

Formula (37)

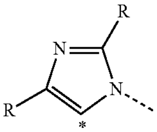

Formula (38)

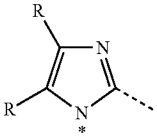

Formula (39)

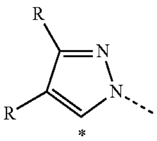

where the symbols have the definitions given above.

Particular preference is given to the six-membered aromatic rings and heteroaromatic rings of the formulae (15) to (19) depicted above. Very particular preference is given to ortho-phenylene, i.e. a group of the abovementioned formula (15). Preferably, all R are H.

At the same time, it is also possible for adjacent R substituents together to form a ring system, such that it is possible to form fused structures, including fused aryl and heteroaryl groups, for example naphthalene, quinoline, benzimidazole, carbazole, dibenzofuran or dibenzothiophene. Such ring formation is shown schematically below in groups of the abovementioned formula (15), which can lead, for example, to groups of the following formulae (15a) to (15j):

Formula (15a)

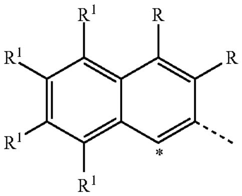

Formula (15b)

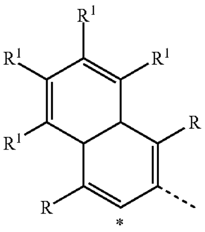

Formula (15c)

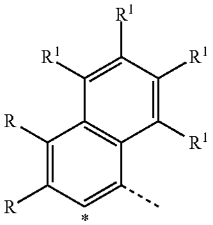

Formula (15d)

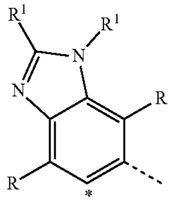

Formula (15e)

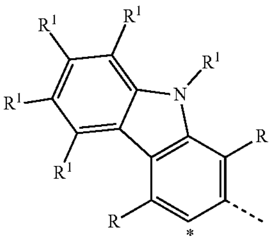

Formula (15f)

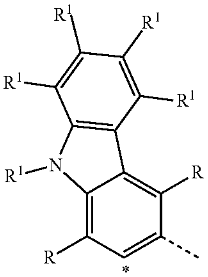

-continued

Formula (15g)

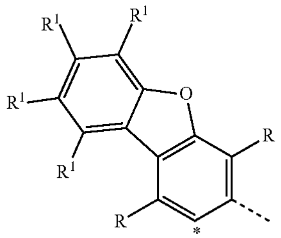

Formula (15h)

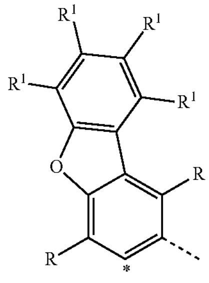

Formula (15i)

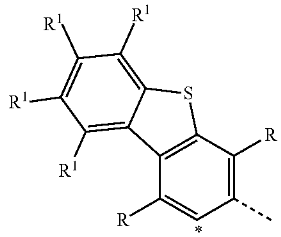

Formula (15j)

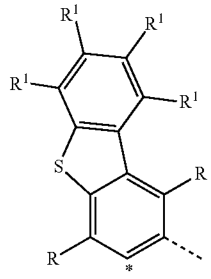

where the symbols have the definitions given above.

In general, the groups fused on may be fused onto any position in the unit of formula (5), as shown by the fused-on benzo group in the formulae (15a) to (15c). The groups as fused onto the unit of the formula (5) in the formulae (15d) to (15j) may therefore also be fused onto other positions in the unit of the formula (5).

The group of the formula (3) can more preferably be represented by the following formulae (3a) to (3m), and the group of the formula (4) can more preferably be represented by the following formulae (4a) to (4m):

Formula (3a)

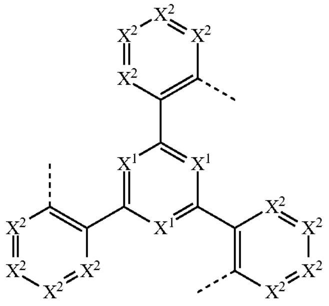

Formula (3b)

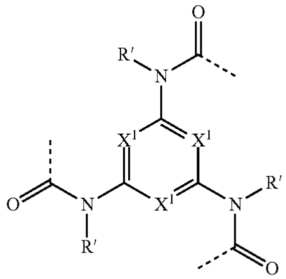

Formula (3c)

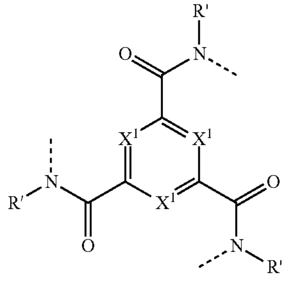

Formula (3d)

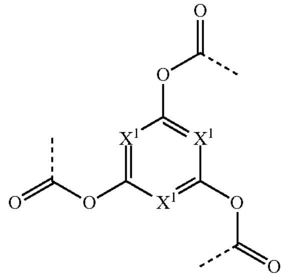

Formula (3e)

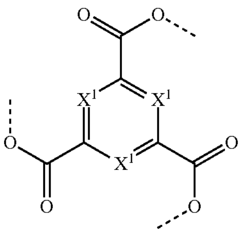

-continued
Formula (3f)
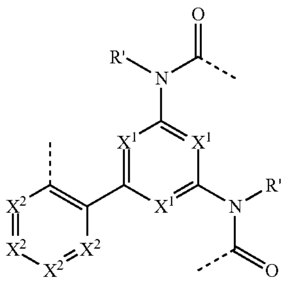
Formula (3g)
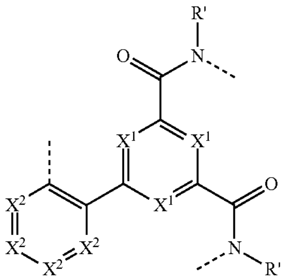
Formula (3h)
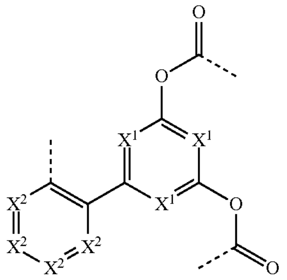
Formula (3i)
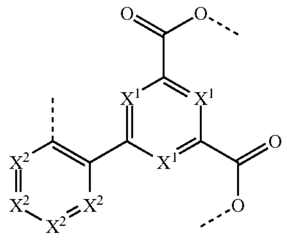
Formula (3j)
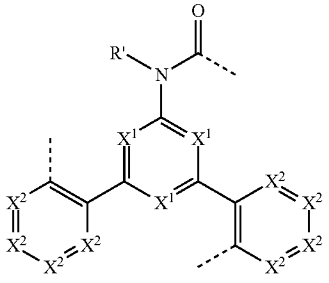
-continued
Formula (3k)
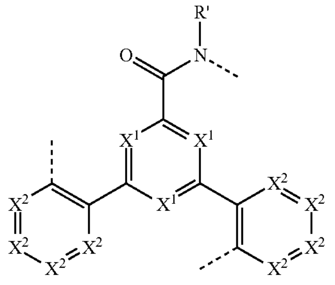
Formula (3l)
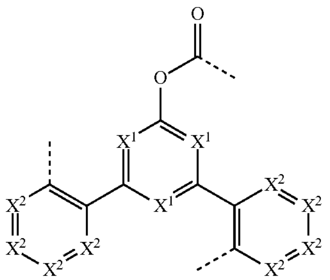
Formula (3m)
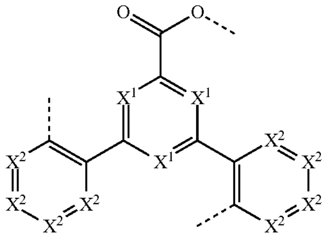
Formula (4a)
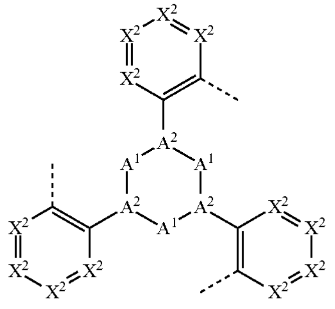
Formula (4b)
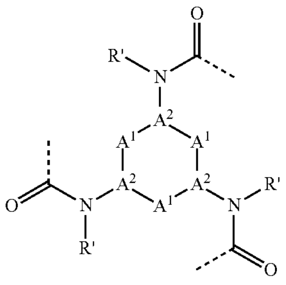

-continued
Formula (4c)
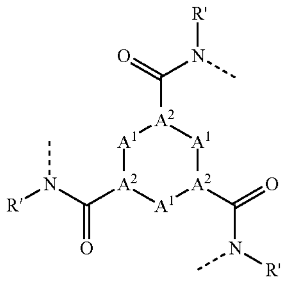
Formula (4d)
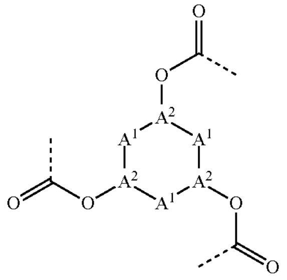
Formula (4e)
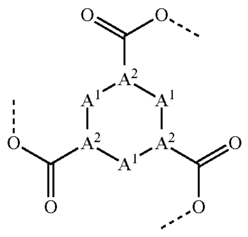
Formula (4f)
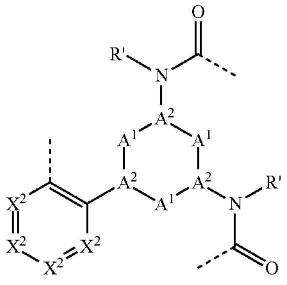
Formula (4g)
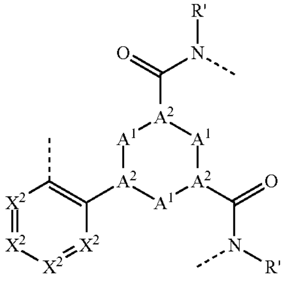
-continued
Formula (4h)
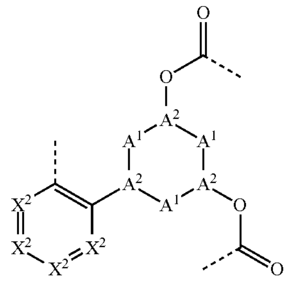
Formula (4i)
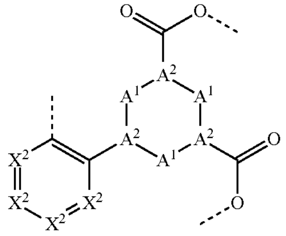
Formula (4j)
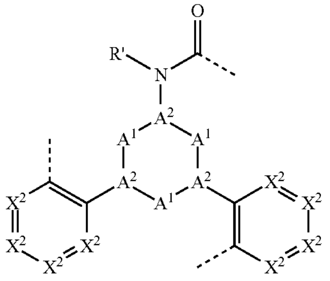
Formula (4k)
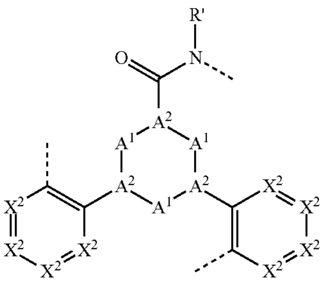
Formula (4l)
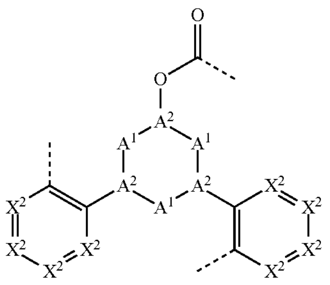
Formula (4m)
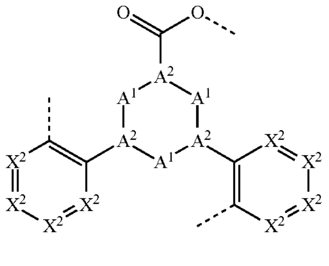

where the symbols have the definitions given above. Preferably, $X^2$ is the same or different at each instance and is CR.

In a preferred embodiment of the invention, the group of the formulae (3a) to (3m) is selected from the groups of the formulae (6a') to (6m'), and the group of the formulae (4a) to (4m) from the groups of the formulae (10a') to (10m'):

Formula (6a')

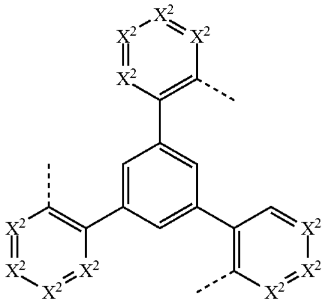

Formula (6b')

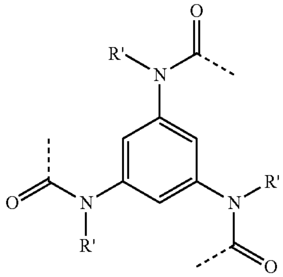

Formula (6c')

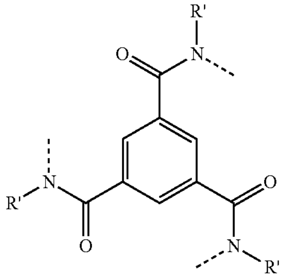

Formula (6d')

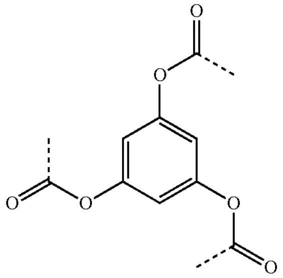

Formula (6e')

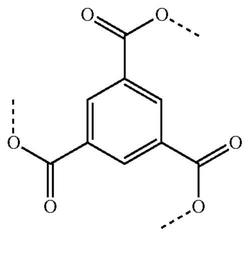

-continued

Formula (6f')

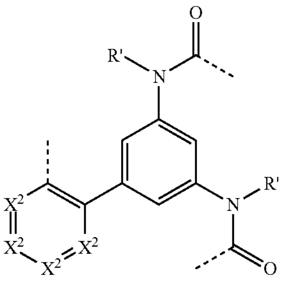

Formula (6g')

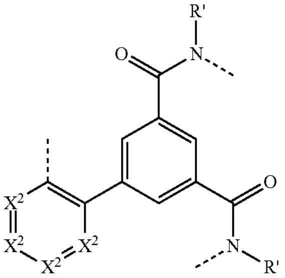

Formula (6h')

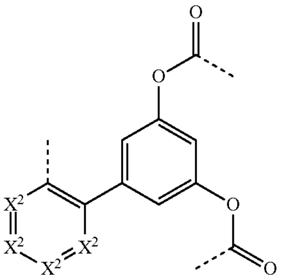

Formula (6i')

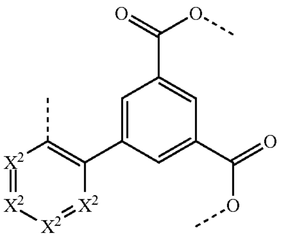

Formula (6j')

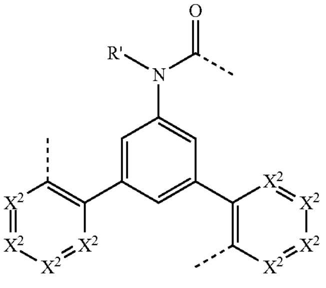

-continued
Formula (6k')
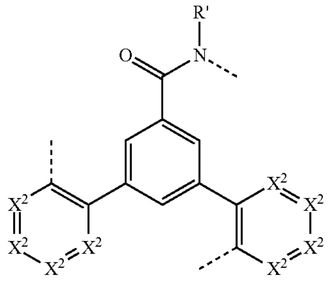
Formula (6l')
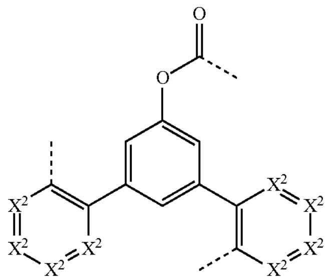
Formula (6m')
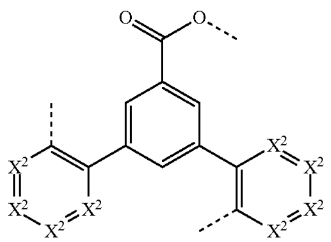
Formula (10a')
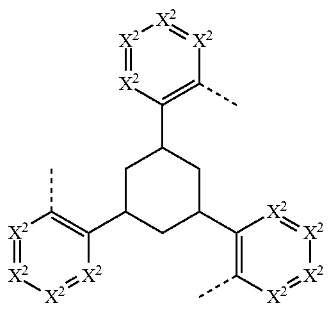
Formula (10b')
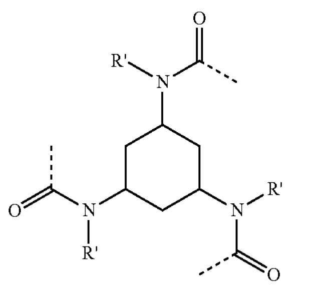
-continued
Formula (10c')
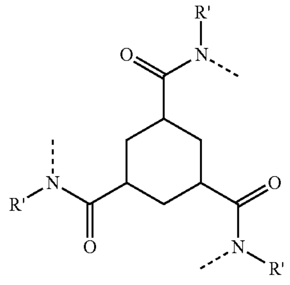
Formula (10d')
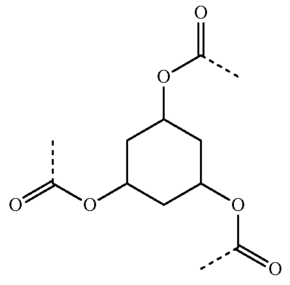
Formula (10e')
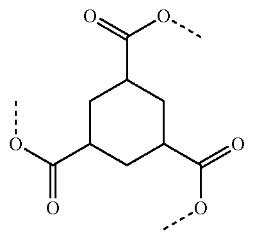
Formula (10f')
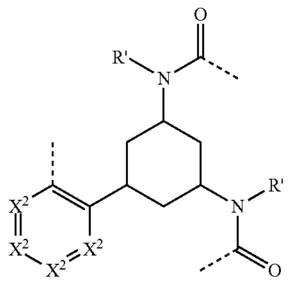
Formula (10g')
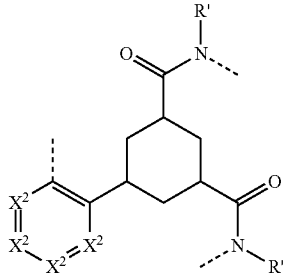

-continued

Formula (10h')

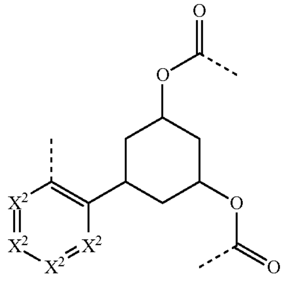

Formula (10i')

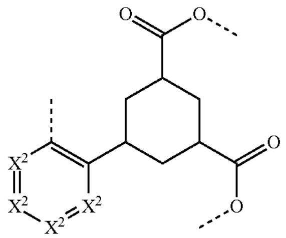

Formula (10j')

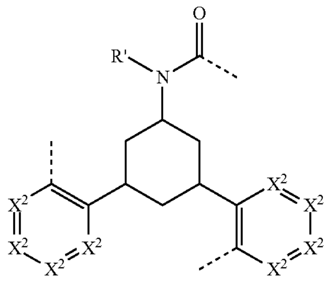

Formula (10k')

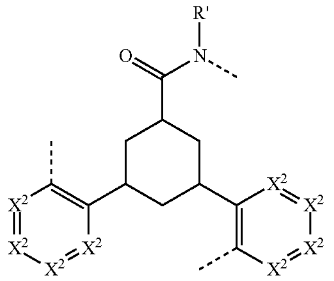

Formula (10l')

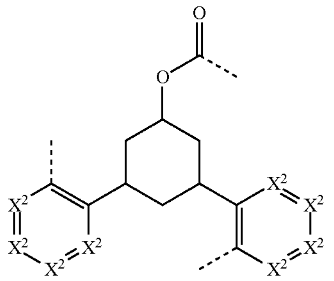

Formula (10m')

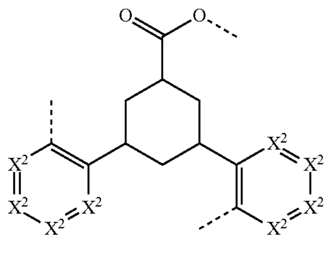

where the symbols have the definitions given above. Preferably, $X^2$ is the same or different at each instance and is CR, especially CH.

A particularly preferred embodiment of the group of the formula (3) is the group of the following formula (6a"):

Formula (6a")

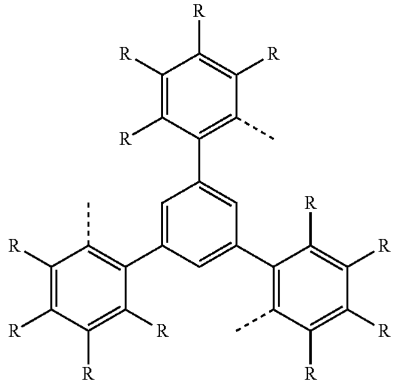

where the symbols have the definitions given above.

More preferably, the R groups in the abovementioned formulae are the same or different and are H, D or an alkyl group having 1 to 4 carbon atoms. Most preferably, R═H. Very particular preference is thus given to the structure of the following formula (6a'''):

Formula (6a''')

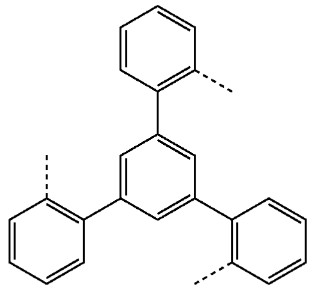

where the symbols have the definitions given above.

There follows a description of the bidentate sub-ligands joined in M to the bridge of the formula (3) or (4) or the abovementioned preferred embodiments.

The three bidentate sub-ligands may be the same or different and are preferably monoanionic. When the bidentate sub-ligands are the same, they preferably also have the same substitution. When all three bidentate sub-ligands selected are the same, this results in $C_3$-symmetric iridium complexes when the unit of the formula (3) or (4) also has $C_3$ symmetry, which is advantageous in terms of the synthesis of the ligands. It may also be advantageous to select the three bidentate sub-ligands differently or to select two identical sub-ligands and a different third sub-ligand, so as to give rise to $C_1$-symmetric metal complexes, because this permits greater possible variation of the ligands, such that the desired properties of the complex, for example the HOMO and LUMO position or the emission colour, can be varied more easily. Moreover, the solubility of the complexes can thus also be improved without having to attach long aliphatic or aromatic solubility-imparting groups. In a preferred embodiment of the invention, either the three bidentate sub-ligands are selected identically or two of the bidentate sub-ligands are selected identically and the third bidentate sub-ligand is different from the first two bidentate sub-ligands.

In a further preferred embodiment of the invention, the coordinating atoms of the bidentate sub-ligands are the same or different at each instance and are selected from C, N, P, O, S and/or B, more preferably C, N and/or O and most preferably C and/or N. The bidentate sub-ligands preferably have one carbon atom and one nitrogen atom or two carbon atoms or two nitrogen atoms or two oxygen atoms or one oxygen atom and one nitrogen atom as coordinating atoms. In this case, the coordinating atoms of each of the three sub-ligands may be the same, or they may be different. Preferably, at least one of the bidentate sub-ligands has one carbon atom and one nitrogen atom or two carbon atoms as coordinating atoms, especially one carbon atom and one nitrogen atom. More preferably at least two of the bidentate sub-ligands and most preferably all three bidentate sub-ligands have one carbon atom and one nitrogen atom or two carbon atoms as coordinating atoms, especially one carbon atom and one nitrogen atom. Particular preference is thus given to an iridium complex in which all three bidentate sub-ligands are ortho-metallated, i.e. form a metallacycle with the iridium in which at least one iridium-carbon bond is present.

It is further preferable when the metallacycle which is formed from the iridium and the bidentate sub-ligand is a five-membered ring, which is preferable particularly when the coordinating atoms are C and N, N and N, or N and O. When the coordinating atoms are O, a six-membered metallacyclic ring may also be preferred. This is shown schematically hereinafter:

Five-membered ring

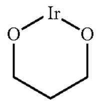

Six-membered ring where N is a coordinating nitrogen atom, C is a coordinating carbon atom and O represents coordinating oxygen atoms, and the carbon atoms shown are atoms of the bidentate ligand.

In a preferred embodiment of the invention, at least one of the bidentate sub-ligands, more preferably at least two of the bidentate sub-ligands, most preferably all three bidentate sub-ligands, are the same or different at each instance and are selected from the structures of the following formulae (L-1), (L-2) and (L-3):

Formula (L-1)

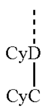

Formula (L-2)

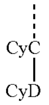

-continued

Formula (L-3)

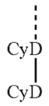

where the dotted bond represents the bond of the sub-ligand to the bridge of the formula (3) or (4) or the preferred embodiments and the other symbols used are as follows:

CyC is the same or different at each instance and is a substituted or unsubstituted aryl or heteroaryl group which has 5 to 14 aromatic ring atoms, each of which coordinates to the metal via a carbon atom and which is bonded in each case to CyD via a covalent bond;

CyD is the same or different at each instance and is a substituted or unsubstituted heteroaryl group which has 5 to 14 aromatic ring atoms and coordinates to the metal via a nitrogen atom or via a carbene carbon atom and which is bonded to CyC via a covalent bond;

at the same time, two or more of the optional substituents together may form a ring system; in addition, the optional radicals are preferably selected from the abovementioned R radicals.

At the same time, CyD in the sub-ligands of the formulae (L-1) and (L-2) preferably coordinates via an uncharged nitrogen atom or via a carbene carbon atom, especially via an uncharged nitrogen atom. Further preferably, one of the two CyD groups in the ligand of the formula (L-3) coordinates via an uncharged nitrogen atom and the other of the two CyD groups via an anionic nitrogen atom. Further preferably, CyC in the sub-ligands of the formulae (L-1) and (L-2) coordinates via anionic carbon atoms.

When two or more of the substituents, especially two or more R radicals, together form a ring system, it is possible for a ring system to be formed from substituents bonded to directly adjacent carbon atoms. In addition, it is also possible that the substituents on CyC and CyD in the formulae (L-1) and (L-2) or the substituents on the two CyD groups in formula (L-3) together form a ring, as a result of which CyC and CyD or the two CyD groups may also together form a single fused aryl or heteroaryl group as bidentate ligand.

In a preferred embodiment of the present invention, CyC is an aryl or heteroaryl group having 6 to 13 aromatic ring atoms, more preferably having 6 to 10 aromatic ring atoms, most preferably having 6 aromatic ring atoms, especially phenyl, which coordinates to the metal via a carbon atom, which may be substituted by one or more R radicals and which is bonded to CyD via a covalent bond.

Preferred embodiments of the CyC group are the structures of the following formulae (CyC-1) to (CyC-20):

(CyC-1)

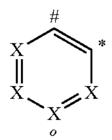

(CyC-2)

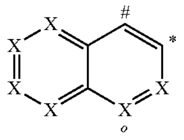

-continued
(CyC-3)
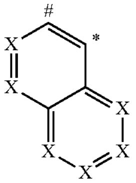
(CyC-4)
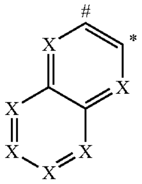
(CyC-5)
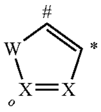
(CyC-6)
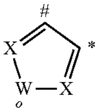
(CyC-7)
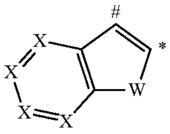
(CyC-8)
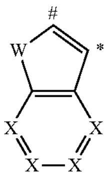
(CyC-9)
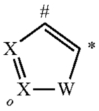
(CyC-10)
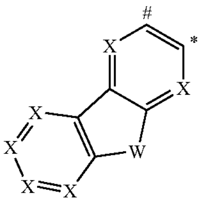
(CyC-11)
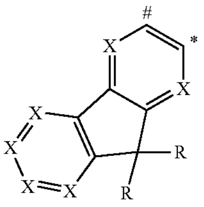
-continued
(CyC-12)
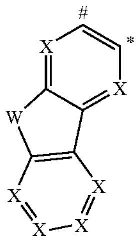
(CyC-13)
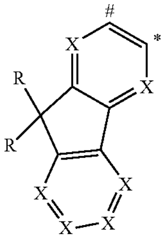
(CyC-14)
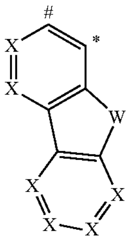
(CyC-15)
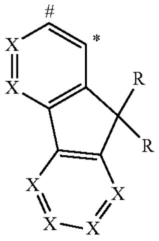
(CyC-16)
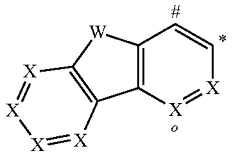
(CyC-17)
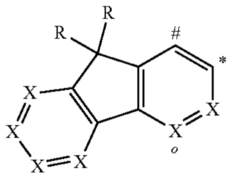
(CyC-18)
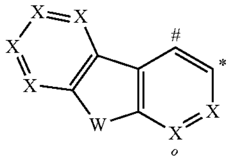

-continued (CyC-19)

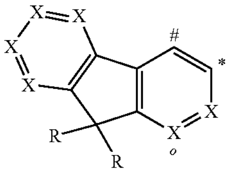

(CyC-20)

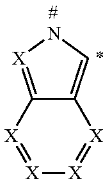

where CyC binds in each case to the position in CyD indicated by # and coordinates to the metal at the position indicated by *, R has the definitions given above and the further symbols used are as follows:

X is the same or different at each instance and is CR or N, with the proviso that not more than two symbols X per cycle are N;

W is NR, O or S;

with the proviso that, when the bridge of the formula (3) or (4) or the preferred embodiments is bonded to CyC, one symbol X is C and the bridge of the formula (3) or (4) or the preferred embodiments is bonded to this carbon atom and additionally with the proviso that, when the Ar group is bonded to CyC, one symbol X is C and the Ar group is bonded to this carbon atom. When the CyC group is bonded to the bridge of the formula (3) or (4) or the preferred embodiments, the bond is preferably via the position marked by "o" in the formulae depicted above, and so the symbol X marked by "o" in that case is preferably C. The above-depicted structures which do not contain any symbol X marked by "o" are preferably not bonded directly to the bridge of the formula (3) or (4) or the preferred embodiments, since such a bond to the bridge is not advantageous for steric reasons.

Preferably not more than one symbol X in CyC is N, and more preferably all symbols X are CR, with the proviso that, when the bridge of the formula (3) or (4) or the preferred embodiments is bonded to CyC, one symbol X is C and the bridge of the formula (3) or (4) or the preferred embodiments is bonded to this carbon atom, and that, when the Ar group is bonded to CyC, one symbol X is C and the Ar group is bonded to this carbon atom.

Particularly preferred CyC groups are the groups of the following formulae (CyC-1a) to (CyC-20a):

(CyC-1a)

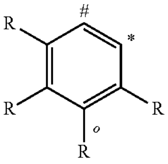

-continued (CyC-1b)

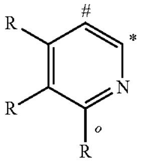

(CyC-1c)

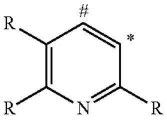

(CyC-1d)

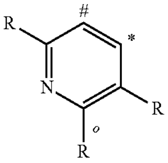

(CyC-1e)

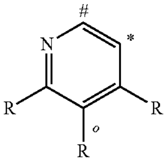

(CyC-1f)

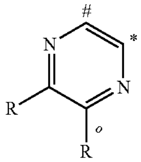

(CyC-1g)

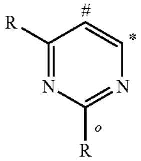

(CyC-1h)

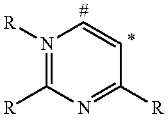

(CyC-2a)

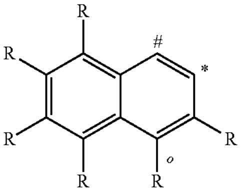

(CyC-2b)

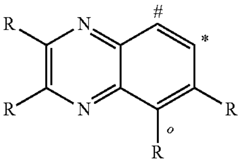

-continued
(CyC-3a)
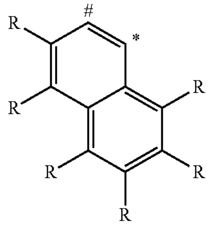
(CyC-3b)
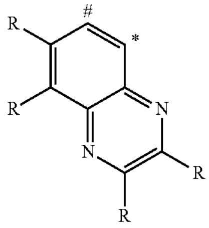
(CyC-4a)
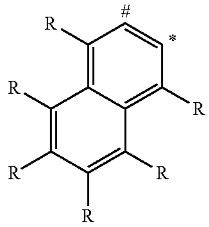
(CyC-4b)
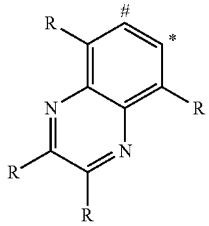
(CyC-5a)
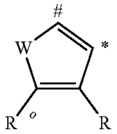
(CyC-6a)
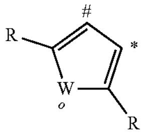
(CyC-7a)
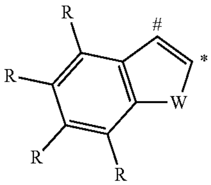
-continued
(CyC-8a)
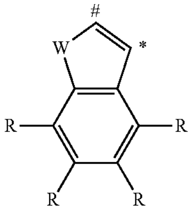
(CyC-9a)
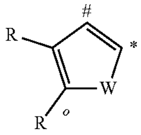
(CyC-10a)
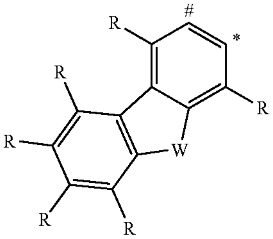
(CyC-11a)
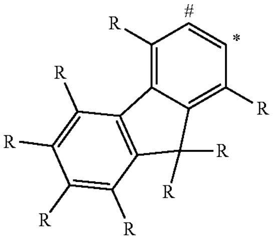
(CyC-12a)
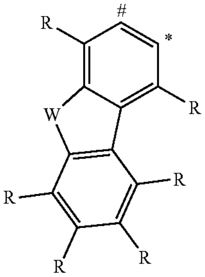
(CyC-13a)
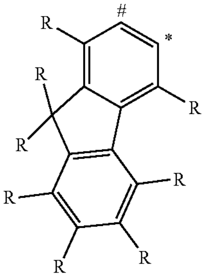

-continued (CyC-14a)

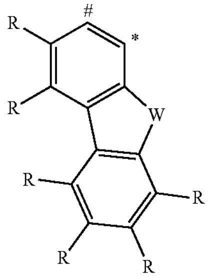

(CyC-15a)

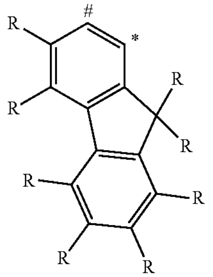

(CyC-16a)

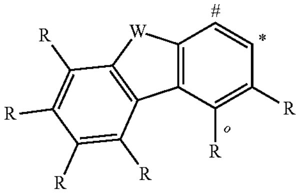

(CyC-17a)

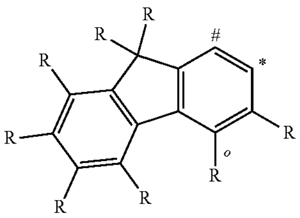

(CyC-18a)

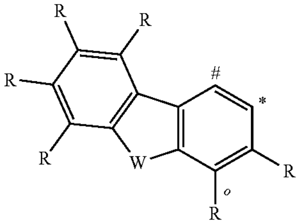

(CyC-19a)

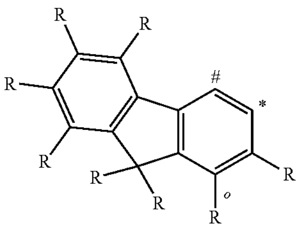

-continued (CyC-20a)

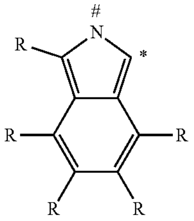

where the symbols have the definitions given above and, when the bridge of the formula (3) or (4) or the preferred embodiments is bonded to CyC, one R radical is not present and the bridge of the formula (3) or (4) or the preferred embodiments is bonded to the corresponding carbon atom, and additionally with the proviso that, when the Ar group is bonded to CyC, one R radical is not present and the Ar group is bonded to the corresponding carbon atom. When the CyC group is bonded to the bridge of the formula (3) or (4) or the preferred embodiments, the bond is preferably via the position marked by "o" in the formulae depicted above, and so the R radical in this position in that case is preferably absent. The above-depicted structures which do not contain any carbon atom marked by "o" are preferably not bonded directly to the bridge of the formula (3) or (4) or the preferred embodiments.

Preferred groups among the (CyC-1) to (CyC-20) groups are the (CyC-1), (CyC-3), (CyC-8), (CyC-10), (CyC-12), (CyC-13) and (CyC-16) groups, and particular preference is given to the (CyC-1a), (CyC-3a), (CyC-8a), (CyC-10a), (CyC-12a), (CyC-13a) and (CyC-16a) groups.

In a further preferred embodiment of the invention, CyD is a heteroaryl group with 5 to 13 aromatic ring atoms, more preferably having 6 to 10 aromatic ring atoms, which coordinates to the metal via an uncharged nitrogen atom or via a carbene carbon atom and which may be substituted by one or more R radicals and which is bonded via a covalent bond to CyC.

Preferred embodiments of the CyD group are the structures of the following formulae (CyD-1) to (CyD-14):

(CyD-1)

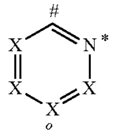

(CyD-2)

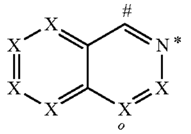

(CyD-3)

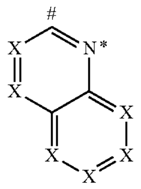

-continued (CyD-4)

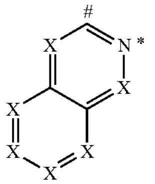

(CyD-5)

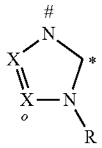

(CyD-6)

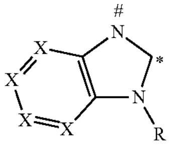

(CyD-7)

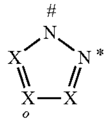

(CyD-8)

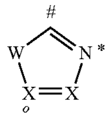

(CyD-9)

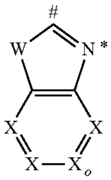

(CyD-10)

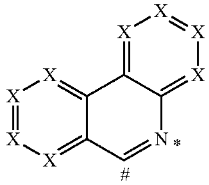

(CyD-11)

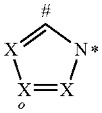

(CyD-12)

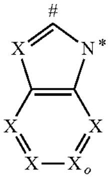

-continued (CyD-13)

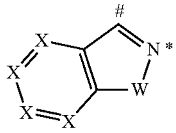

(CyD-14)

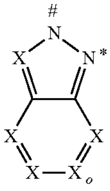

where the CyD group binds in each case to the position in CyC indicated by # and coordinates to the metal at the position indicated by *, and where X, W and R have the definitions given above, with the proviso that, when the bridge of the formula (3) or (4) or the preferred embodiments is bonded to CyD, one symbol X is C and the bridge of the formula (3) or (4) or the preferred embodiments is bonded to this carbon atom, and additionally with the proviso that, when the Ar group is bonded to CyD, one symbol X is C and the Ar group is bonded to this carbon atom. When the CyD group is bonded to the bridge of the formula (3) or (4) or the preferred embodiments, the bond is preferably via the position marked by "o" in the formulae depicted above, and so the symbol X marked by "o" in that case is preferably C. The above-depicted structures which do not contain any symbol X marked by "o" are preferably not bonded directly to the bridge of the formula (3) or (4) or the preferred embodiments, since such a bond to the bridge is not advantageous for steric reasons.

In this case, the (CyD-1) to (CyD-4), (CyD-7) to (CyD-10), (CyD-13) and (CyD-14) groups coordinate to the metal via an uncharged nitrogen atom, the (CyD-5) and (CyD-6) groups via a carbene carbon atom and the (CyD-11) and (CyD-12) groups via an anionic nitrogen atom.

Preferably not more than one symbol X in CyD is N, and more preferably all symbols X are CR, with the proviso that, when the bridge of the formula (3) or (4) or the preferred embodiments is bonded to CyD, one symbol X is C and the bridge of the formula (3) or (4) or the preferred embodiments is bonded to this carbon atom. In addition, when the Ar group is bonded to CyD, one symbol X is C and the Ar group is bonded to this carbon atom.

Particularly preferred CyD groups are the groups of the following formulae (CyD-1a) to (CyD-14b):

(CyD-1a)

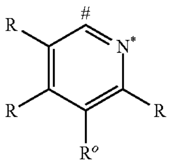

-continued
(CyD-2a)
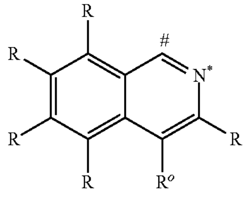
(CyD-3a)
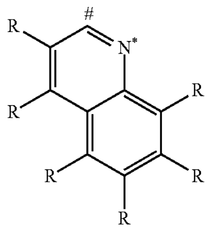
(CyD-3b)
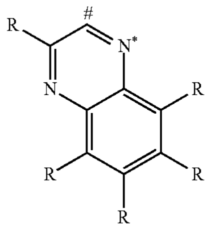
(CyD-4a)
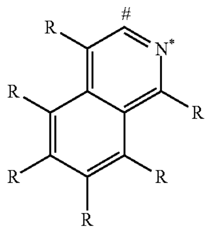
(CyD-5a)
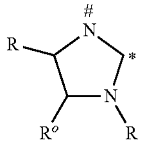
(CyD-6a)
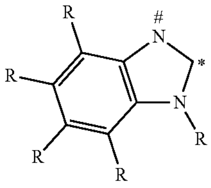
(CyD-7a)
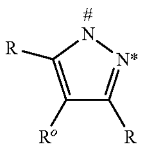
(CyD-8a)
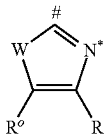
-continued
(CyD-9a)
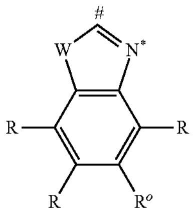
(CyD-10a)
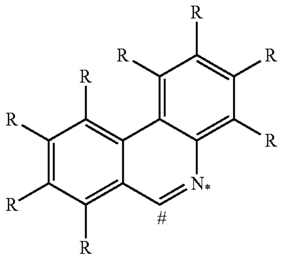
(CyD-11a)
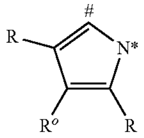
(CyD-11b)
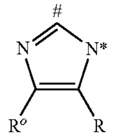
(CyD-11c)
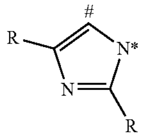
(CyD-11d)
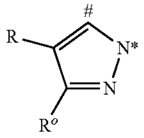
(CyD-12a)
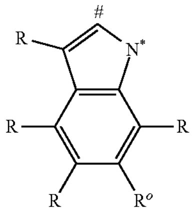
(CyD-12b)
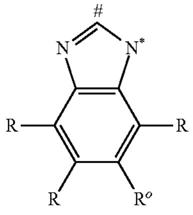

-continued (CyD-13a)

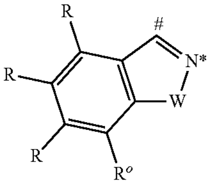

(CyD-14a)

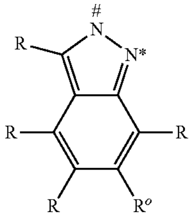

(CyD-14b)

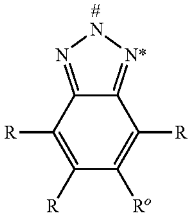

where the symbols used have the definitions given above and, when the bridge of the formula (3) or (4) or the preferred embodiments is bonded to CyD, one R radical is not present and the bridge of the formula (3) or (4) or the preferred embodiments is bonded to the corresponding carbon atom, and additionally with the proviso that, when the Ar group is bonded to CyD, one R radical is not present and the Ar group is bonded to the corresponding carbon atom. When the CyD group is bonded to the bridge of the formula (3) or (4) or the preferred embodiments, the bond is preferably via the position marked by "o" in the formulae depicted above, and so the R radical in this position in that case is preferably absent. The above-depicted structures which do not contain any carbon atom marked by "o" are preferably not bonded directly to the bridge of the formula (3) or (4) or the preferred embodiments. In addition, when the Ar group is bonded to CyD, one position is not substituted by an R radical and the Ar group is bonded to this carbon atom.

Preferred groups among the (CyD-1) to (CyD-14) groups are the (CyD-1), (CyD-2), (CyD-3), (CyD-4), (CyD-5) and (CyD-6) groups, especially (CyD-1), (CyD-2) and (CyD-3), and particular preference is given to the (CyD-1a), (CyD-2a), (CyD-3a), (CyD-4a), (CyD-5a) and (CyD-6a) groups, especially (CyD-1a), (CyD-2a) and (CyD-3a).

In a preferred embodiment of the present invention, CyC is an aryl or heteroaryl group having 6 to 13 aromatic ring atoms, and at the same time CyD is a heteroaryl group having 5 to 13 aromatic ring atoms. More preferably, CyC is an aryl or heteroaryl group having 6 to 10 aromatic ring atoms, and at the same time CyD is a heteroaryl group having 5 to 10 aromatic ring atoms. Most preferably, CyC is an aryl or heteroaryl group having 6 aromatic ring atoms, especially phenyl, and CyD is a heteroaryl group having 6 to 10 aromatic ring atoms. At the same time, CyC and CyD may be substituted by one or more R radicals.

The abovementioned preferred (CyC-1) to (CyC-20) and (CyD-1) to (CyD-14) groups may be combined with one another as desired in the sub-ligands of the formulae (L-1) and (L-2), provided that at least one of the CyC or CyD groups has a suitable attachment site to the bridge of the formula (3) or (4) or the preferred embodiments, suitable attachment sites being signified by "o" in the formulae given above. It is especially preferable when the CyC and CyD groups specified above as particularly preferred, i.e. the groups of the formulae (CyC-1a) to (CyC-20a) and the groups of the formulae (CyD1-a) to (CyD-14b), are combined with one another, provided that at least one of the preferred CyC or CyD groups has a suitable attachment site to the bridge of the formula (3) or (4) or the preferred embodiments, suitable attachment sites being signified by "o" in the formulae given above. Combinations in which neither CyC nor CyD has such a suitable attachment site for the bridge of the formula (3) or (4) or the preferred embodiments are therefore not preferred.

It is very particularly preferable when one of the (CyC-1), (CyC-3), (CyC-8), (CyC-10), (CyC-12), (CyC-13) and (CyC-16) groups and especially the (CyC-1a), (CyC-3a), (CyC-8a), (CyC-10a), (CyC-12a), (CyC-13a) and (CyC-16a) groups is combined with one of the (CyD-1), (CyD-2) and (CyD-3) groups and especially with one of the (CyD-1a), (CyD-2a) and (CyD-3a) groups.

Preferred sub-ligands (L-1) are the structures of the following formulae (L-1-1) and (L-1-2), and preferred sub-ligands (L-2) are the structures of the following formulae (L-2-1) to (L-2-3):

(L-1-1)

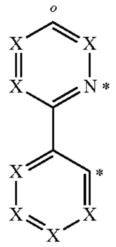

(L-1-2)

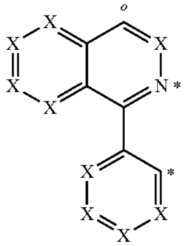

(L-2-1)

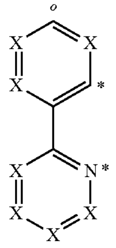

-continued (L-2-2)

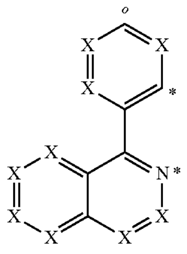

(L-2-3)

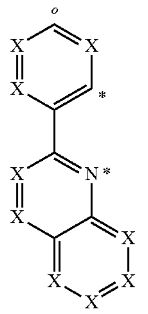

where the symbols used have the definitions given above, * represents the position of coordination to the iridium and “o” represents the position of the bond to the bridge of the formula (3) or (4) or the preferred embodiments, and with the proviso that, when the Ar group is bonded to the sub-ligand, one symbol X is C and the Ar group is bonded to this carbon atom.

Particularly preferred sub-ligands (L-1) are the structures of the following formulae (L-1-1a) and (L-1-2b), and particularly preferred sub-ligands (L-2) are the structures of the following formulae (L-2-1a) to (L-2-3a):

(L-1-1a)

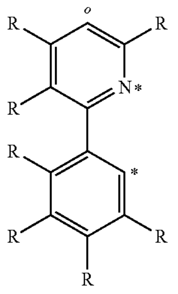

(L-1-2a)

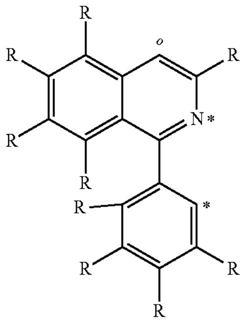

-continued (L-2-1a)

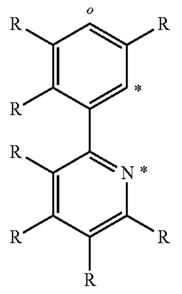

(L-2-2a)

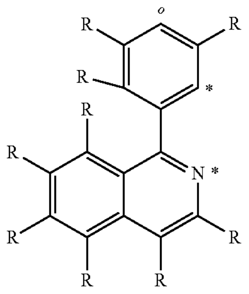

(L-2-3a)

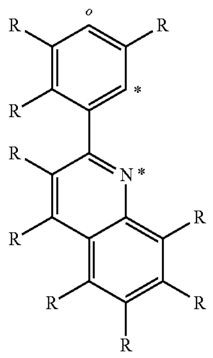

where the symbols used have the definitions given above and “o” represents the position of the bond to the bridge of the formula (3) or (4) or the preferred embodiments, and with the proviso that, when the Ar group is bonded to the sub-ligand, one R radical is not present and the Ar group is bonded to this carbon atom.

It is likewise possible for the abovementioned preferred CyD groups in the sub-ligands of the formula (L-3) to be combined with one another as desired, it being preferable to combine an uncharged CyD group, i.e. a (CyD-1) to (CyD-10), (CyD-13) or (CyD-14) group, with an anionic CyD group, i.e. a (CyD-11) or (CyD-12) group, provided that at least one of the preferred CyD groups has a suitable attachment site to the bridge of the formula (3) or (4) or the preferred embodiments, suitable attachment sites being signified by “o” in the formulae given above.

When two R radicals, one of them bonded to CyC and the other to CyD in the formulae (L-1) and (L-2) or one of them bonded to one CyD group and the other to the other CyD group in formula (L-3), form an aromatic ring system with one another, this may result in bridged sub-ligands and for example also in sub-ligands which represent a single larger heteroaryl group overall, for example benzo[h]quinoline, etc. The ring formation between the substituents on CyC and CyD in the formulae (L-1) and (L-2) or between the substituents on the two CyD groups in formula (L-3) is preferably via a group according to one of the following formulae (40) to (49):

Formula (40)

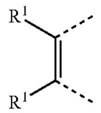

Formula (41)

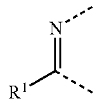

Formula (42)

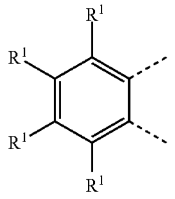

Formula (43)

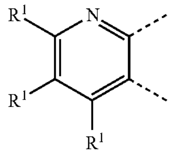

Formula (44)

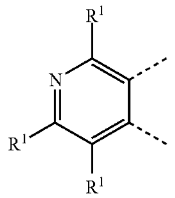

Formula (45)

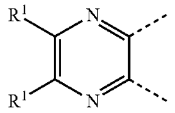

Formula (46)

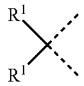

Formula (47)

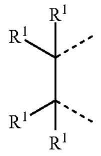

Formula (48)

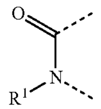

Formula (49)

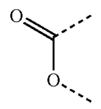

where $R^1$ has the definitions given above and the dotted bonds signify the bonds to CyC or CyD. At the same time, the unsymmetric groups among those mentioned above may be incorporated in each of the two possible orientations; for example, in the group of the formula (49), the oxygen atom may bind to the CyC group and the carbonyl group to the CyD group, or the oxygen atom may bind to the CyD group and the carbonyl group to the CyC group. At the same time, the Ar group may also be bonded to one of these groups.

At the same time, the group of the formula (46) is preferred particularly when this results in ring formation to give a six-membered ring, as shown below, for example, by the formulae (L-22) and (L-23).

Preferred ligands which arise through ring formation between two R radicals in the different cycles are the structures of the formulae (L-4) to (L-31) shown below:

(L-4)

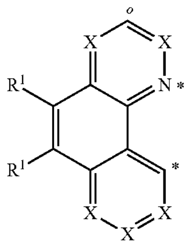

(L-5)

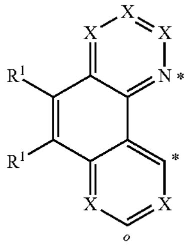

(L-6)

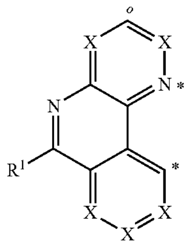

(L-7)

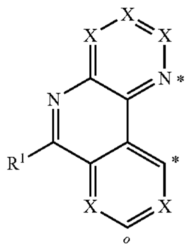

-continued
(L-8)
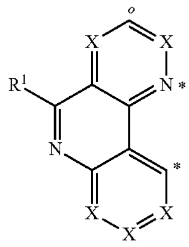
(L-9)
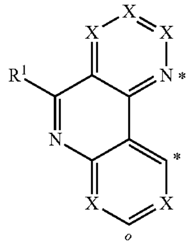
(L-10)
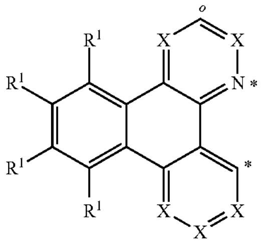
(L-11)
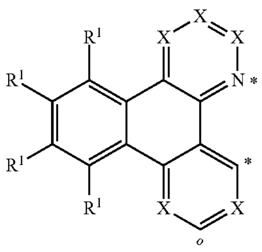
(L-12)
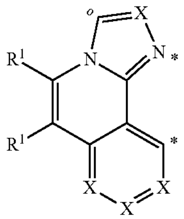
(L-13)
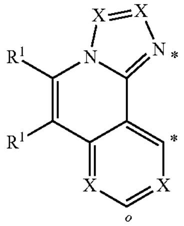
-continued
(L-14)
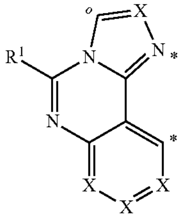
(L-15)
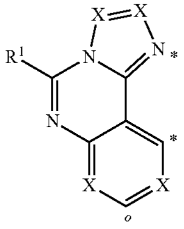
(L-16)
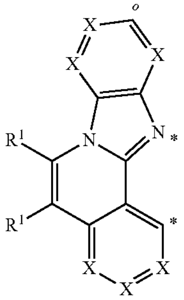
(L-17)
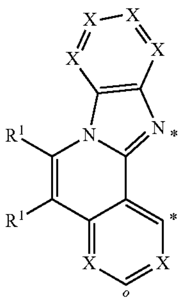
(L-18)
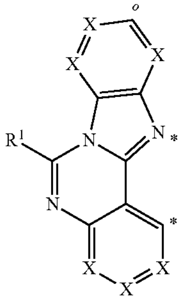

-continued
(L-19)
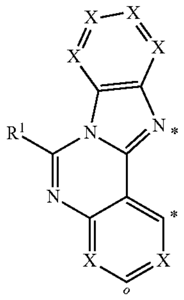
(L-20)
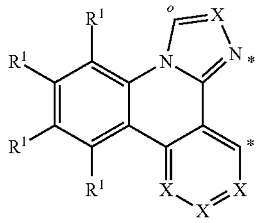
(L-21)
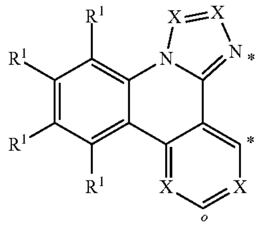
(L-22)
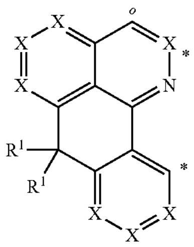
(L-23)
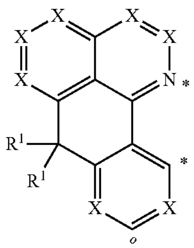
(L-24)
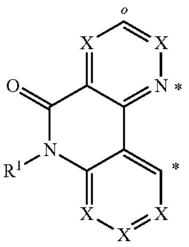
-continued
(L-25)
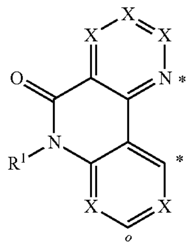
(L-26)
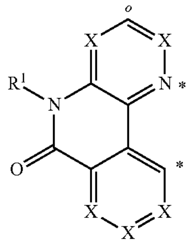
(L-27)
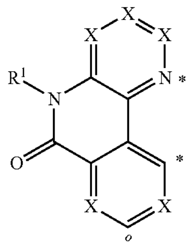
(L-28)
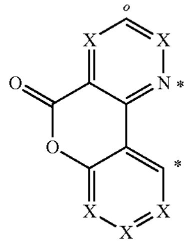
(L-29)
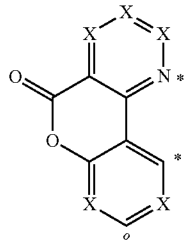
(L-30)
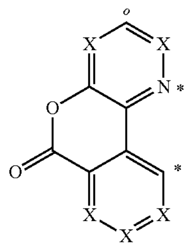

-continued (L-31)

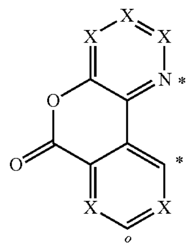

where the symbols used have the definitions given above and "o" indicates the position where this sub-ligand is bonded to the group of the formula (3) or (4) or the preferred embodiments, and with the proviso that, when the Ar group is bonded to this sub-ligand, one symbol X is C and the Ar group is bonded to this carbon atom.

In a preferred embodiment of the sub-ligands of the formulae (L-4) to (L-31), overall, one symbol X is N and the other symbols X are CR, or all symbols X are CR, with the proviso that, when the Ar group is bonded to this sub-ligand, one symbol X is C and the Ar group is bonded to this carbon atom.

In a further embodiment of the invention, it is preferable if, in the groups (CyC-1) to (CyC-20) or (CyD-1) to (CyD-14) or in the sub-ligands (L-1-1) to (L-2-3) and (L-4) to (L-31), one of the atoms X is N when an R group bonded as a substituent adjacent to this nitrogen atom is not hydrogen or deuterium. This applies analogously to the preferred structures (CyC-1a) to (CyC-20a) or (CyD-1a) to (CyD-14b) in which a substituent bonded adjacent to a non-coordinating nitrogen atom is preferably an R group which is not hydrogen or deuterium. This substituent R is preferably a group selected from $CF_3$, $OCF_3$, $OR^1$, alkyl groups having 1 to 10 carbon atoms, especially branched or cyclic alkyl groups having 3 to 10 carbon atoms, aromatic or heteroaromatic ring systems or aralkyl or heteroaralkyl groups. These groups are sterically demanding groups. Further preferably, this R radical may also form a cycle with an adjacent R radical.

A further suitable bidentate sub-ligand is the sub-ligand of the following formula (L-32) or (L-33)

(L-32)

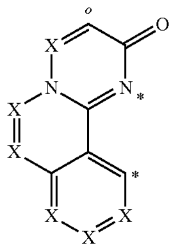

-continued (L-33)

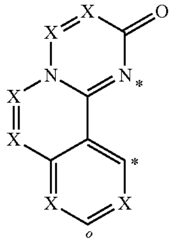

where R has the definitions given above, * represents the position of coordination to the metal, "o" represents the position of linkage of the sub-ligand to the group of the formulae (3) or (4) or the preferred embodiments and the other symbols used are as follows:

X is the same or different at each instance and is CR or N, with the proviso that not more than one symbol X per cycle is N, and with the additional proviso that one symbol X is C and the group of the formula (3) or (4) or the preferred embodiments are bonded to this carbon atom, and with the additional proviso that, when the Ar group is bonded to this sub-ligand, one symbol X is C and the Ar group is bonded to this carbon atom.

When two R radicals bonded to adjacent carbon atoms in the sub-ligands (L-32) and (L-33) form an aromatic cycle with one another, this cycle together with the two adjacent carbon atoms is preferably a structure of the following formula (50):

Formula (50)

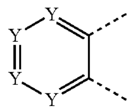

where the dotted bonds symbolize the linkage of this group within the sub-ligand and Y is the same or different at each instance and is $CR^1$ or N and preferably not more than one symbol Y is N. At the same time, the Ar group may also be bonded to this group.

In a preferred embodiment of the sub-ligand (L-32) or (L-33), not more than one group of the formula (50) is present. The sub-ligands are thus preferably sub-ligands of the following formulae (L-34) to (L-39):

(L-34)

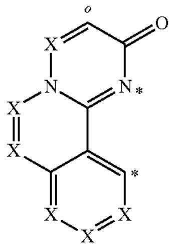

-continued (L-35)

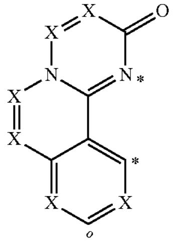

(L-36)

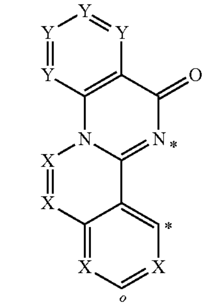

(L-37)

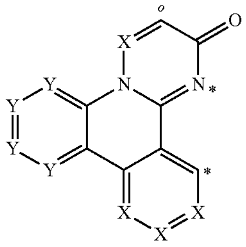

(L-38)

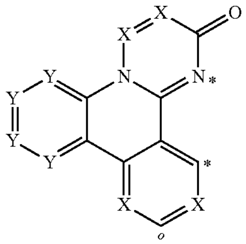

(L-39)

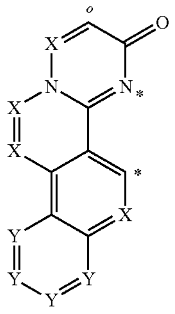

where X is the same or different at each instance and is CR or N, but the R radicals together do not form an aromatic or heteroaromatic ring system and the further symbols have the definitions given above, with the proviso that, when the Ar group is bonded to this sub-ligand, one symbol X is C and the Ar group is bonded to this carbon atom.

In a preferred embodiment of the invention, in the sub-ligand of the formulae (L-32) to (L-39), a total of 0, 1 or 2 of the symbols X and, if present, Y are N. More preferably, a total of 0 or 1 of the symbols X and, if present, Y are N.

In a preferred embodiment of the invention, the X group in the ortho position to the coordination to the metal is CR. In this radical, R bonded in the ortho position to the coordination to the metal is preferably selected from the group consisting of H, D, F and methyl.

In a further embodiment of the invention, it is preferable, if one of the atoms X or, if present, Y is N, when a substituent bonded adjacent to this nitrogen atom is an R group which is not hydrogen or deuterium. This substituent R is preferably a group selected from $CF_3$, $OCF_3$, $OR^1$, alkyl groups having 1 to 10 carbon atoms, especially branched or cyclic alkyl groups having 3 to 10 carbon atoms, aromatic or heteroaromatic ring systems or aralkyl or heteroaralkyl groups. These groups are sterically demanding groups. Further preferably, this R radical may also form a cycle with an adjacent R radical.

Further suitable bidentate sub-ligands are the structures of the following formulae (L-40) to (L-44), where preferably not more than one of the three bidentate sub-ligands is one of the structures, (L-40)

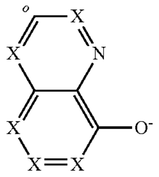

(L-41)

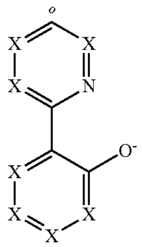

(L-42)

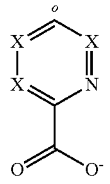

(L-43)

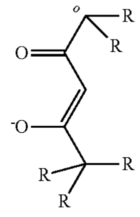

-continued (L-44)

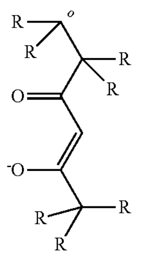

where the sub-ligands (L-40) to (L-42) each coordinate to the metal via the nitrogen atom explicitly shown and the negatively charged oxygen atom, and the sub-ligands (L-43) and (L-44) coordinate to the metal via the two oxygen atoms, X has the definitions given above and "o" indicates the position via which the sub-ligand is joined to the group of the formula (3) or (4) or the preferred embodiments, with the proviso that, when the Ar group is bonded to this sub-ligand, one symbol X is C and the Ar group is bonded to this carbon atom.

The above-recited preferred embodiments of X are also preferred for the sub-ligands of the formulae (L-40) to (L-42). Preferred sub-ligands of the formulae (L-40) to (L-42) are therefore the sub-ligands of the following formulae (L-40a) to (L-42a):

(L-40a)

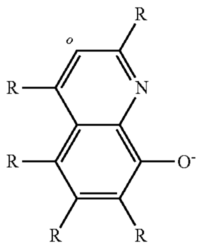

(L-41a)

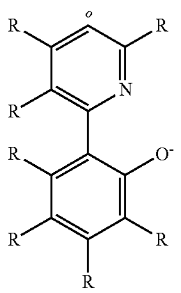

(L-42a)

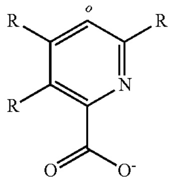

where the symbols used have the definitions given above and "o" indicates the position via which the sub-ligand is joined to the group of the formula (3) or (4) or the preferred embodiments, with the proviso that, when the Ar group is bonded to this sub-ligand, one R radical is not present and the Ar group is bonded to the corresponding carbon atom.

More preferably, in these formulae, R is hydrogen, where "o" indicates the position via which the sub-ligand is joined to the group of the formula (3) or (4) or the preferred embodiments, and so the structures are those of the following formulae (L-40b) to (L-42b):

(L-40b)

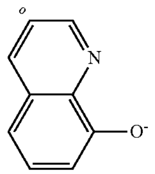

(L-41b)

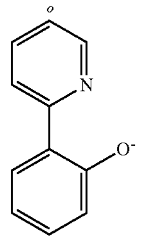

(L-42b)

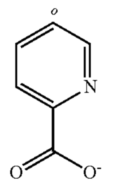

where the symbols used have the definitions given above.

In a further preferred embodiment of the invention, the complex M is an iridium complex in which three bidentate ligands which may be the same or different coordinate to one iridium atom. In this case, the $—[[[Ar]_p—B]_m—R^B]$ group binds to one of the three bidentate ligands or, if more than one of these groups are present, also to two or three of the bidentate ligands.

The bidentate ligands are preferably selected from the structures of the following formulae (L-1') and (L-3'):

Formula (L-1')

Formula (L-3')

where the symbols have the definitions given above.

In this context, the same preferences as described above for the subligands (L-1), (L-2) and (L-3) apply to the ligands of the formulae (L-1') and (L-3'), with the difference that the ligands of the formulae (L-!') and (L-3') are not bonded to a bridge of the formula (3) or (4).

In a further preferred embodiment of the invention, M is an organometallic platinum complex. When M is an organometallic platinum complex having two bidentate ligands, these are the same or different and are preferably selected from the above-depicted ligands of the formulae (L-1') and (L-3'), where the abovementioned preferences are also applicable thereto.

When M is an organometallic platinum complex having a tetradentate ligand, this can be represented schematically by the following formula (Lig'):

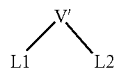

(Lig')

where V' is preferably selected from $CR_2$, NR, O, S und BR, more preferably $CR_2$ and NR, where R has the definitions given above, and L1 and L2 are the same or different at each instance and are each bidentate sub-ligands, preferably monoanionic bidentate sub-ligands. Since the ligand has two bidentate sub-ligands, the overall result is a tetradentate ligand, i.e. a ligand that coordinates or binds to the platinum via four coordination sites. In this case, L1 and L2 are preferably those structures as specified above by the formulae (L-1), (L-2) and (L-3) or the preferred structures.

The platinum complex M formed with this ligand of the formula (Lig') can thus be represented schematically by the following formula:

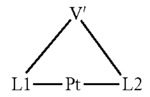

where the symbols used have the definitions given above.

There follows a description of preferred substituents as may be present on the above-described sub-ligands and ligands, but also on the bivalent arylene or heteroarylene group in the structure of the formula (5).

In a preferred embodiment of the invention, the metal complex of the invention contains two R substituents which are bonded to adjacent carbon atoms and together form an aliphatic ring according to one of the formulae described hereinafter. In this case, the two R substituents which form this aliphatic ring may be present on the bridge of the formulae (3) or (4) or the preferred embodiments and/or on one or more of the bidentate sub-ligands. The aliphatic ring which is formed by the ring formation by two R substituents together is preferably described by one of the following formulae (51) to (57):

Formula (51)

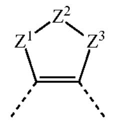

Formula (52)

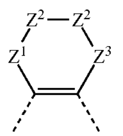

-continued

Formula (53)

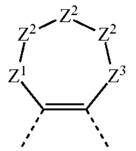

Formula (54)

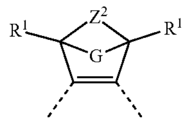

Formula (55)

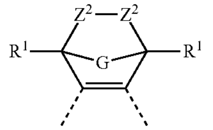

Formula (56)

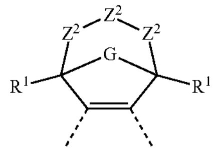

Formula (57)

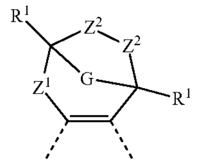

where $R^1$ and $R^2$ have the definitions given above, the dotted bonds signify the linkage of the two carbon atoms in the ligand and, in addition:

$Z^1$, $Z^3$ is the same or different at each instance and is $C(R^3)_2$, O, S, $NR^3$ or C(═O);

$Z^2$ is $C(R^1)_2$, O, S, $NR^3$ or C(═O);

G is an alkylene group which has 1, 2 or 3 carbon atoms and may be substituted by one or more $R^2$ radicals, $—CR^2═CR^2—$ or an ortho-bonded arylene or heteroarylene group which has 5 to 14 aromatic ring atoms and may be substituted by one or more $R^2$ radicals;

$R^3$ is the same or different at each instance and is H, F, a straight-chain alkyl or alkoxy group having 1 to 10 carbon atoms, a branched or cyclic alkyl or alkoxy group having 3 to 10 carbon atoms, where the alkyl or alkoxy group may be substituted in each case by one or more $R^2$ radicals, where one or more nonadjacent $CH_2$ groups may be replaced by $R^2C═CR^2$, C≡C, $Si(R^2)_2$, C═O, $NR^2$, O, S or $CONR^2$, or an aromatic or heteroaromatic ring system which has 5 to 24 aromatic ring atoms and may be substituted in each case by one or more $R^2$ radicals, or an aryloxy or heteroaryloxy group which has 5 to 24 aromatic ring atoms and may be substituted by one or more $R^2$ radicals; at the same time, two $R^3$ radicals bonded to the same carbon atom together may form an aliphatic or aromatic ring system and thus form a spiro system; in addition, $R^3$ with an adjacent R or $R^1$ radical may form an aliphatic ring system;

with the proviso that no two heteroatoms in these groups are bonded directly to one another and no two C═O groups are bonded directly to one another.

In a preferred embodiment of the invention, $R^3$ is not H.

In the above-depicted structures of the formulae (51) to (57) and the further embodiments of these structures specified as preferred, a double bond is depicted in a formal sense between the two carbon atoms. This is a simplification of the chemical structure when these two carbon atoms are incorporated into an aromatic or heteroaromatic system and hence the bond between these two carbon atoms is formally between the bonding level of a single bond and that of a double bond. The drawing of the formal double bond should thus not be interpreted so as to limit the structure; instead, it will be apparent to the person skilled in the art that this is an aromatic bond.

When adjacent radicals in the structures of the invention form an aliphatic ring system, it is preferable when the latter does not have any acidic benzylic protons. Benzylic protons are understood to mean protons which bind to a carbon atom bonded directly to the ligand. This can be achieved by virtue of the carbon atoms in the aliphatic ring system which bind directly to an aryl or heteroaryl group being fully substituted and not containing any bonded hydrogen atoms. Thus, the absence of acidic benzylic protons in the formulae (50) to (52) is achieved by virtue of $Z^1$ and $Z^3$, when they are $C(R^3)_2$, being defined such that $R^3$ is not hydrogen. This can additionally also be achieved by virtue of the carbon atoms in the aliphatic ring system which bind directly to an aryl or heteroaryl group being the bridgeheads in a bi- or polycyclic structure. The protons bonded to bridgehead carbon atoms, because of the spatial structure of the bi- or polycycle, are significantly less acidic than benzylic protons on carbon atoms which are not bonded within a bi- or polycyclic structure, and are regarded as non-acidic protons in the context of the present invention.

Thus, the absence of acidic benzylic protons in formulae (53) to (57) is achieved by virtue of this being a bicyclic structure, as a result of which $R^1$, when it is H, is much less acidic than benzylic protons since the corresponding anion of the bicyclic structure is not mesomerically stabilized. Even when $R^1$ in formulae (53) to (57) is H, this is therefore a non-acidic proton in the context of the present application.

In a preferred embodiment of the structure of the formulae (51) to (57), not more than one of the $Z^1$, $Z^2$ and $Z^3$ groups is a heteroatom, especially O or $NR^3$, and the other groups are $C(R^3)_2$ or $C(R^1)_2$, or $Z^1$ and $Z^3$ are the same or different at each instance and are O or $NR^3$ and $Z^2$ is $C(R^1)_2$. In a particularly preferred embodiment of the invention, $Z^1$ and $Z^3$ are the same or different at each instance and are $C(R^3)_2$, and $Z^2$ is $C(R^1)_2$ and more preferably $C(R^3)_2$ or $CH_2$.

Preferred embodiments of the formula (51) are thus the structures of the formulae (51-A), (51-B), (51-C) and (51-D), and a particularly preferred embodiment of the formula (51-A) is the structures of the formulae (51-E) and (51-F):

Formula (51-A)

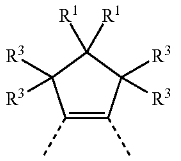

Formula (51-B)

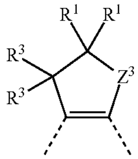

-continued

Formula (51-C)

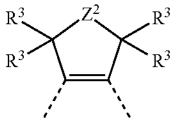

Formula (51-D)

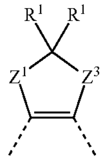

Formula (51-E)

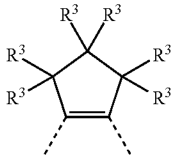

Formula (51-F)

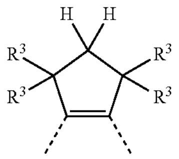

where $R^1$ and $R^3$ have the definitions given above and $Z^1$, $Z^2$ and $Z^3$ are the same or different at each instance and are 0 or $NR^3$.

Preferred embodiments of the formula (52) are the structures of the following formulae (52-A) to (52-F):

Formula (52-A)

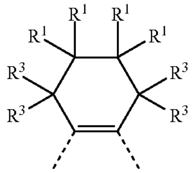

Formula (52-B)

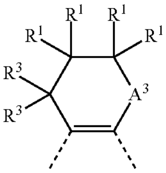

Formula (52-C)

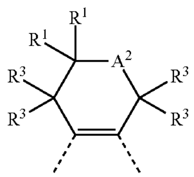

Formula (52-D)

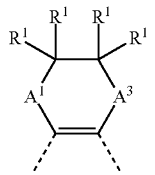

-continued

Formula (52-E)

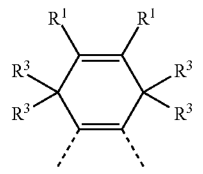

Formula (52-F)

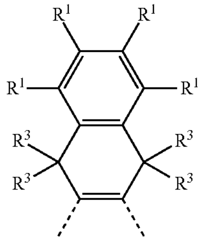

where $R^1$ and $R^3$ have the definitions given above and $Z^1$, $Z^2$ and $Z^3$ are the same or different at each instance and are O or $NR^3$.

Preferred embodiments of the formula (53) are the structures of the following formulae (53-A) to (53-E):

Formula (53-A)

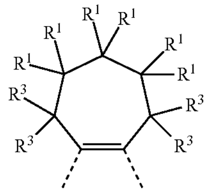

Formula (53-B)

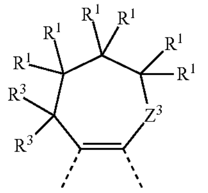

Formula (53-C)

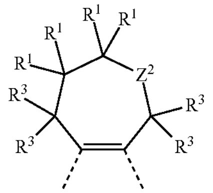

Formula (53-D)

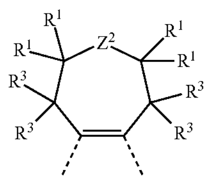

-continued

Formula (53-E)

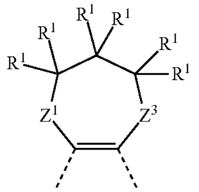

where $R^1$ and $R^3$ have the definitions given above and $Z^1$, $Z^2$ and $Z^3$ are the same or different at each instance and are O or $NR^3$.

In a preferred embodiment of the structure of formula (54), the $R^1$ radicals bonded to the bridgehead are H, D, F or $CH_3$. Further preferably, $Z^2$ is $C(R')_2$ or 0, and more preferably $C(R^3)_2$. Preferred embodiments of the formula (54) are thus structures of the formulae (54-A) and (54-B), and a particularly preferred embodiment of the formula (54-A) is a structure of the formula (54-C):

Formula (54-A)

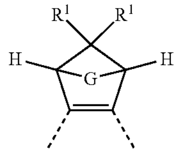

Formula (54-B)

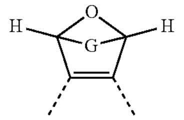

Formula (54-C)

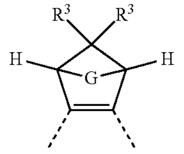

where the symbols used have the definitions given above.

In a preferred embodiment of the structure of formulae (55), (56) and (57), the $R^1$ radicals bonded to the bridgehead are H, D, F or $CH_3$. Further preferably, $Z^2$ is $C(R')_2$. Preferred embodiments of the formula (55), (56) and (57) are thus the structures of the formulae (55-A), (56-A) and (57-A):

Formula (55-A)

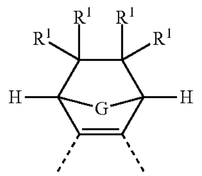

Formula (56-A)

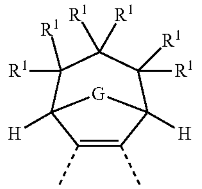

-continued

Formula (57-A)

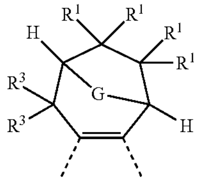

where the symbols used have the definitions given above.

Further preferably, the G group in the formulae (54), (54-A), (54-B), (54-C), (55), (55-A), (56), (56-A), (57) and (57-A) is a 1,2-ethylene group which may be substituted by one or more $R^2$ radicals, where $R^2$ is preferably the same or different at each instance and is H or an alkyl group having 1 to 4 carbon atoms, or an ortho-arylene group which has 6 to 10 carbon atoms and may be substituted by one or more $R^2$ radicals, but is preferably unsubstituted, especially an ortho-phenylene group which may be substituted by one or more $R^2$ radicals, but is preferably unsubstituted.

In a further preferred embodiment of the invention, $R^3$ in the groups of the formulae (51) to (57) and in the preferred embodiments is the same or different at each instance and is F, a straight-chain alkyl group having 1 to 10 carbon atoms or a branched or cyclic alkyl group having 3 to 20 carbon atoms, where one or more nonadjacent $CH_2$ groups in each case may be replaced by $R^2C{=}CR^2$ and one or more hydrogen atoms may be replaced by D or F, or an aromatic or heteroaromatic ring system which has 5 to 14 aromatic ring atoms and may be substituted in each case by one or more $R^2$ radicals; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

In a particularly preferred embodiment of the invention, $R^3$ in the groups of the formulae (51) to (57) and in the preferred embodiments is the same or different at each instance and is F, a straight-chain alkyl group having 1 to 3 carbon atoms, especially methyl, or an aromatic or heteroaromatic ring system which has 5 to 12 aromatic ring atoms and may be substituted in each case by one or more $R^2$ radicals, but is preferably unsubstituted; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

Examples of particularly suitable groups of the formula (51) are the groups depicted below:

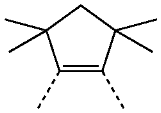
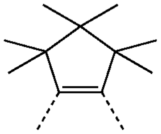
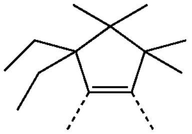
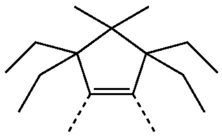
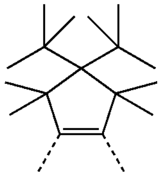

-continued

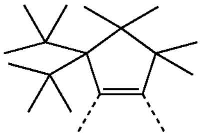
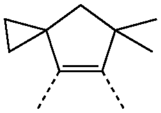
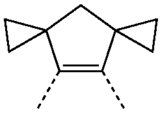
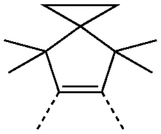
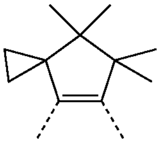
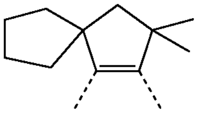
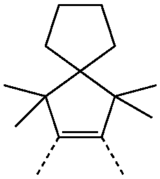
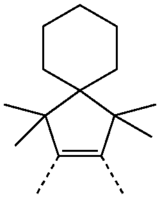
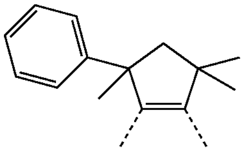
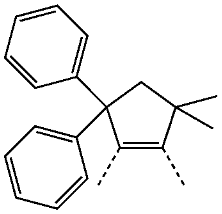
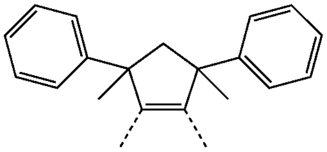
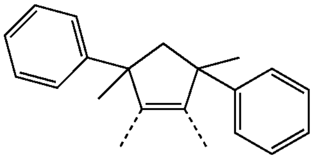
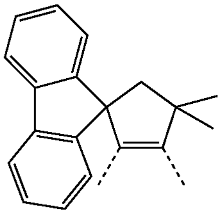
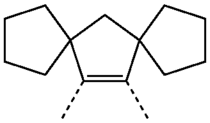
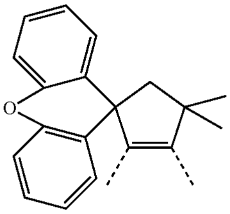

-continued
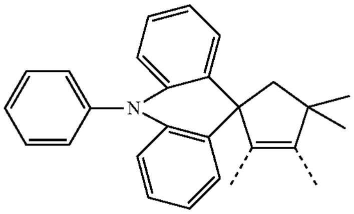
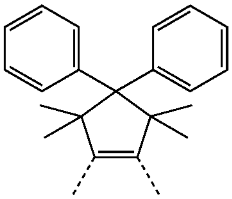
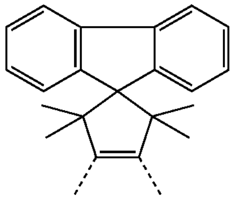
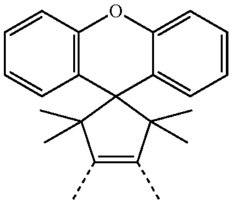
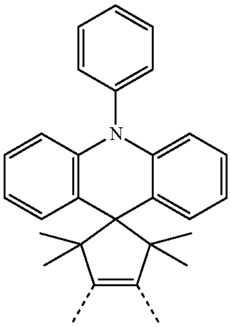
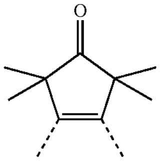
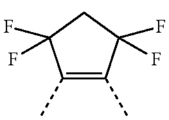
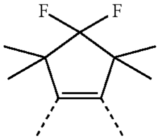
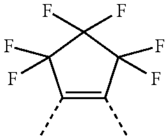
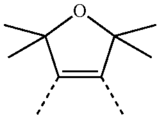
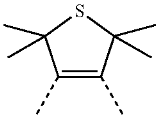
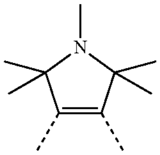
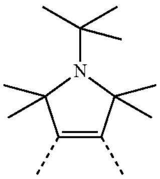
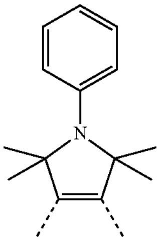
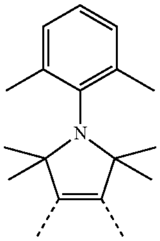
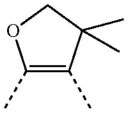
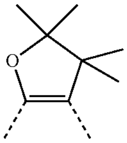
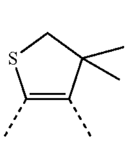
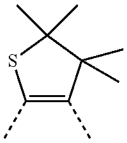
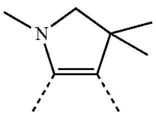
-continued
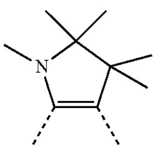
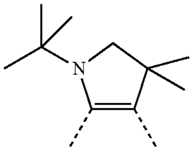
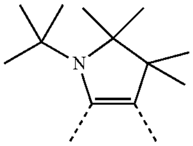
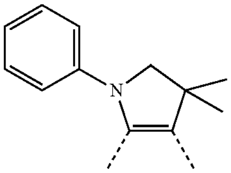
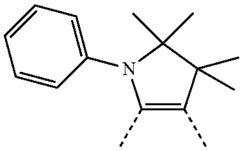
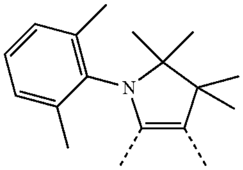
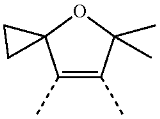
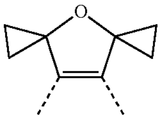
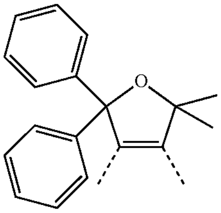
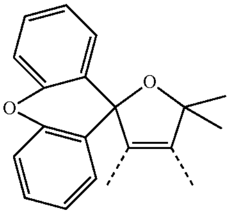
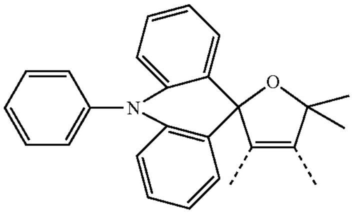
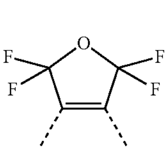
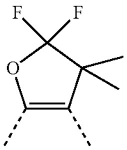
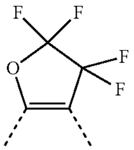
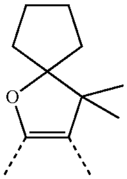
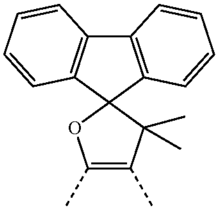
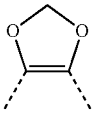

-continued
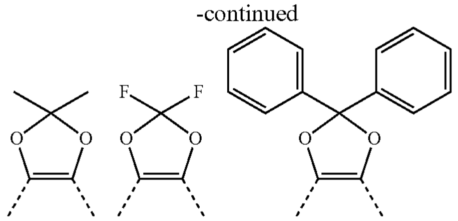
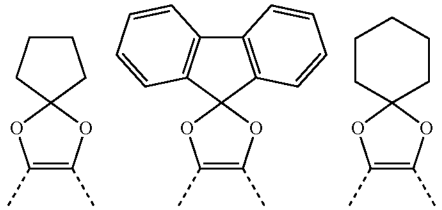
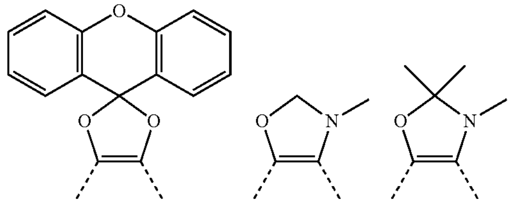
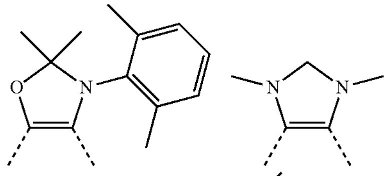
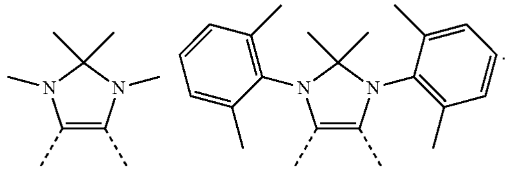
Examples of particularly suitable groups of the formula (52) are the groups depicted below:
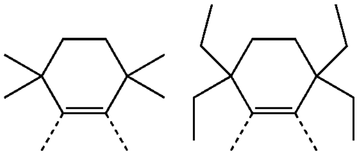
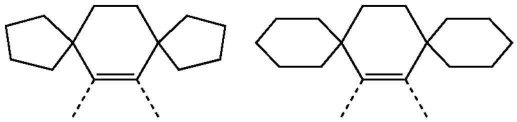
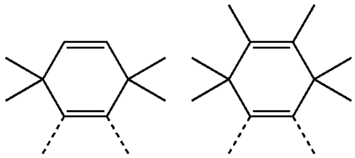
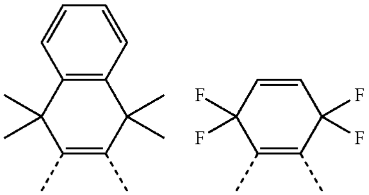
-continued
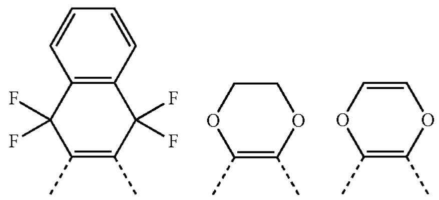
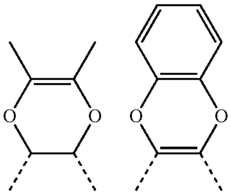
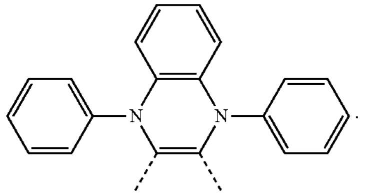
Examples of particularly suitable groups of the formulae (53), (56) and (57) are the groups depicted below:
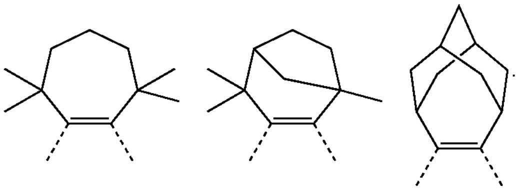
Examples of particularly suitable groups of the formula (54) are the groups depicted below:
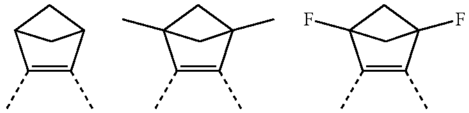
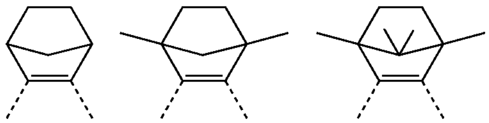
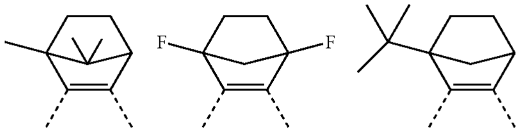
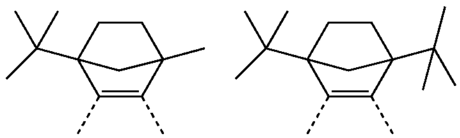

-continued

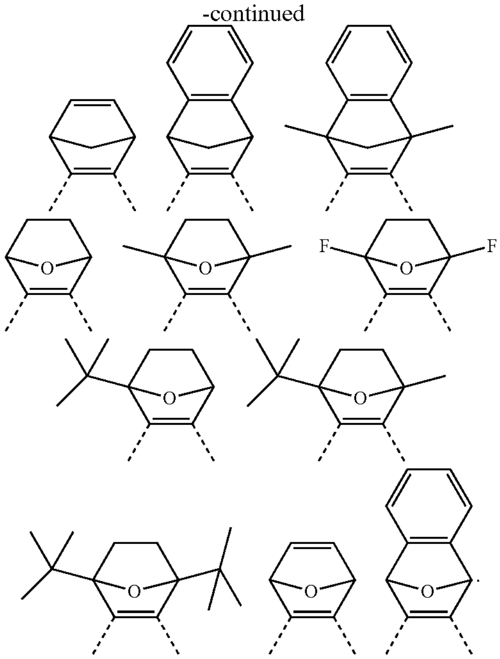

Examples of particularly suitable groups of the formula (55) are the groups depicted below:

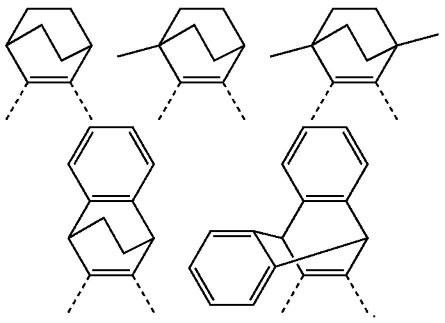

When R radicals are bonded within the bidentate sub-ligands or ligands or within the bivalent arylene or heteroarylene groups of the formula (5) bonded within the formulae (3) or (4) or the preferred embodiments, these R radicals are the same or different at each instance and are preferably selected from the group consisting of H, D, F, Br, I, $N(R^1)_2$, CN, $Si(R^1)_3$, $B(OR^1)_2$, $C(=O)R^1$, a straight-chain alkyl group having 1 to 10 carbon atoms or an alkenyl group having 2 to 10 carbon atoms or a branched or cyclic alkyl group having 3 to 10 carbon atoms, where the alkyl or alkenyl group may be substituted in each case by one or more $R^1$ radicals, or an aromatic or heteroaromatic ring system which has 5 to 30 aromatic ring atoms and may be substituted in each case by one or more $R^1$ radicals; at the same time, two adjacent R radicals together or R together with $R^1$ may also form a mono- or polycyclic, aliphatic or aromatic ring system. More preferably, these R radicals are the same or different at each instance and are selected from the group consisting of H, D, F, $N(R^1)_2$, a straight-chain alkyl group having 1 to 6 carbon atoms or a branched or cyclic alkyl group having 3 to 10 carbon atoms, where one or more hydrogen atoms may be replaced by D or F, or an aromatic or heteroaromatic ring system which has 5 to 24, preferably 6 to 24, more preferably 6 to 13 aromatic ring atoms, and may be substituted in each case by one or more $R^1$ radicals; at the same time, two adjacent R radicals together or R together with $R^1$ may also form a mono- or polycyclic, aliphatic or aromatic ring system.

Preferred $R^1$ radicals bonded to R are the same or different at each instance and are H, D, F, $N(R^2)_2$, CN, a straight-chain alkyl group having 1 to 10 carbon atoms or an alkenyl group having 2 to 10 carbon atoms or a branched or cyclic alkyl group having 3 to 10 carbon atoms, where the alkyl group may be substituted in each case by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a mono- or polycyclic aliphatic ring system. Particularly preferred $R^1$ radicals bonded to R are the same or different at each instance and are H, F, CN, a straight-chain alkyl group having 1 to 5 carbon atoms or a branched or cyclic alkyl group having 3 to 5 carbon atoms, each of which may be substituted by one or more $R^2$ radicals, or an aromatic or heteroaromatic ring system which has 5 to 13, preferably 6 to 13 aromatic ring atoms, and may be substituted in each case by one or more $R^2$ radicals; at the same time, two or more adjacent $R^1$ radicals together may form a mono- or polycyclic aliphatic ring system.

Preferred $R^2$ radicals are the same or different at each instance and are H, F or an aliphatic hydrocarbyl radical having 1 to 5 carbon atoms or an aromatic hydrocarbyl radical having 6 to 12 carbon atoms; at the same time, two or more $R^2$ substituents together may also form a mono- or polycyclic aliphatic ring system.

Recited hereinafter are preferred embodiments of the $-[[Ar]_p-B-[Ar]_q]_m-R^B$ substituent of the invention which, when q=0, is a substituent $-[[Ar]_p-B]_m-R^B$.

As described above, Ar is a linear-bonded arylene or heteroaryl group which has 6 to 30 aromatic ring atoms and may be substituted by one or more R radicals.

A linear-bonded arylene or heteroarylene group in the context of the present invention is understood to mean a para-bonded six-membered arylene or heteroarylene group. This is likewise true when further groups are fused to this group as, for example, in 1,4-bonded naphthalene. This is also true when the Ar group in a formal sense contains multiple six-membered arylene or heteroarylene groups as, for example, in 2,7-bonded fluorene, in the correspondingly bonded indenofluorene or in 2,7-bonded carbazole.

In a preferred embodiment of the invention, Ar is the same or different at each instance and is selected from the groups of the following formulae (Ar-1) to (Ar-10):

(Ar-1)

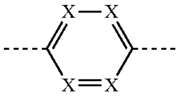

(Ar-2)

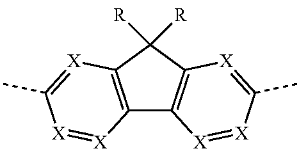

-continued (Ar-3)

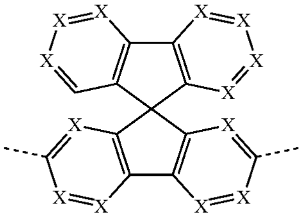

(Ar-4)

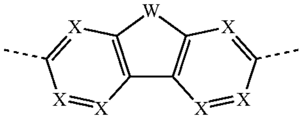

(Ar-5)

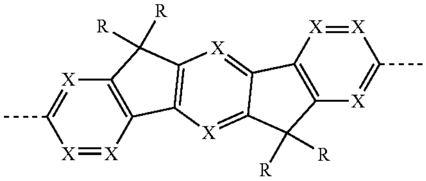

(Ar-6)

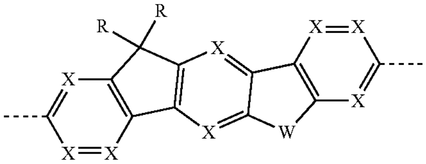

(Ar-7)

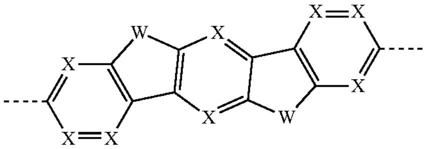

(Ar-8)

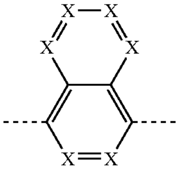

(Ar-9)

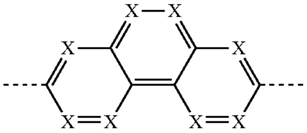

(Ar-10)

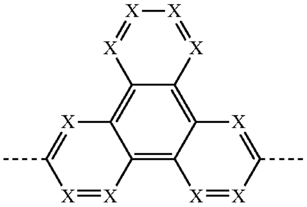

where the dotted bonds indicate the linkage of this group and the symbols used have the definitions given above. Preferably not more than two symbols X per Ar group are and more preferably not more than one symbol X per Ar group is N, and the other symbols X are CR. Most preferably, all symbols X are CR, and so the Ar groups are therefore more preferably selected from the following formulae (Ar-1a) to (Ar-10a)

(Ar-1a)

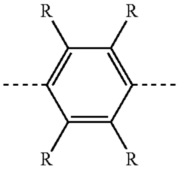

(Ar-2a)

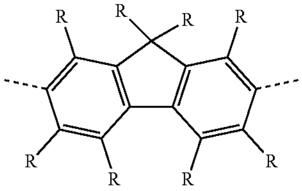

(Ar-3a)

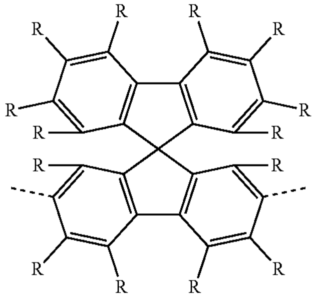

(Ar-4a)

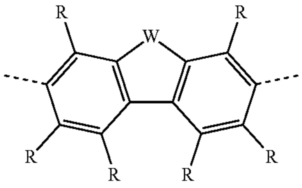

(Ar-5a)

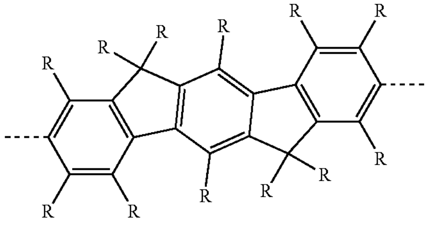

(Ar-6a)

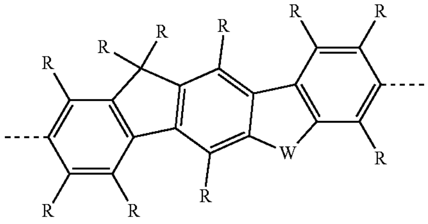

(Ar-7a)

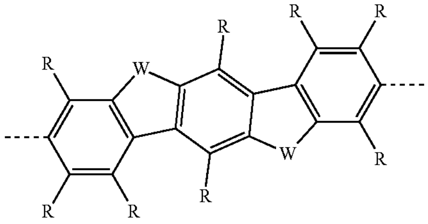

-continued (Ar-8a)

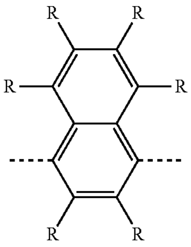

(Ar-9a)

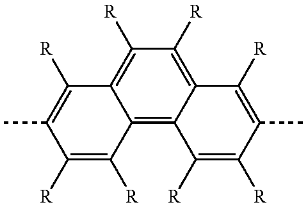

(Ar-10a)

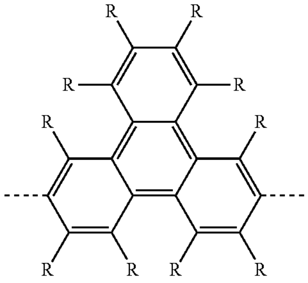

where the symbols used have the definitions given above.

As described above, the B group is a bicyclic or oligocyclic group of formula (2). In a preferred embodiment of the invention, $Y^1$, $Y^2$ and $Y^3$ are the same or different at each instance, preferably the same, and are $CR_2$, $CR_2$—$CR_2$, $CR_2$—$CR_2$—$CR_2$, $CR_2$—$CR_2$—$CR_2$—$CR_2$ or an ortho-bonded phenylene group which may be substituted by one or more R radicals; the $Y^1$, $Y^2$ and/or $Y^3$ groups here may be joined to one another by a single bond or via R radicals, so as to form oligocyclic groups.

More preferably, the $Y^1$, $Y^2$ and $Y^3$ groups are the same and are $CH_2$, $CH_2$—$CH_2$, $CH_2$—$CH_2$—$CH_2$, $CH_2$—$CH_2$—$CH_2$—$CH_2$ or an unsubstituted ortho-phenylene group.

Examples of suitable and particularly preferred groups of the formula (2) are the structures (B-1) to (B-6) depicted below:

(B-1)

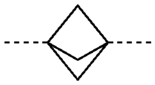

(B-2)

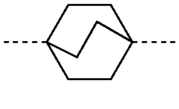

-continued (B-3)

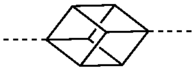

(B-4)

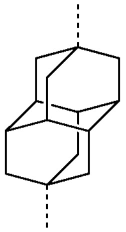

(B-5)

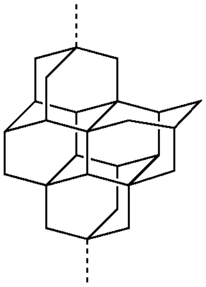

(B-6)

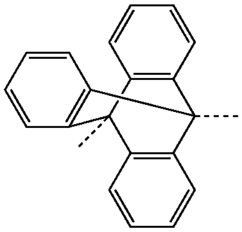

where the dotted bond in each case represents the linkage of this group.

In a preferred embodiment of the invention, the substituent $R^B$ is selected from H, M, a straight-chain alkyl group having 1 to 10 carbon atoms or a branched or cyclic alkyl group having 3 to 10 carbon atoms, where the alkyl group may be substituted in each case by one or more $R^1$ radicals, but is preferably unsubstituted, or an aromatic or heteroaromatic ring system which has 6 to 24 aromatic ring atoms and may be substituted in each case by one or more $R^1$ radicals. More preferably, the substituent $R^B$ is selected from M, a straight-chain alkyl group having 1 to 6 carbon atoms or a branched or cyclic alkyl group having 3 to 6 carbon atoms or an aromatic ring system which has 6 to 12 aromatic ring atoms and may be substituted by one or more $R^1$ radicals, but is preferably unsubstituted. When $R^B$ is M, the same preferences as already described above for the other M group in the compound of the invention are applicable.

The compounds of the invention are chiral structures. According to the exact structure of the complexes and ligands, the formation of diastereomers and of several pairs of enantiomers is possible. The complexes of the invention include both the mixtures of the different diastereomers or the corresponding racemates and the individual isolated diastereomers or enantiomers.

If mononuclear complex synthesis units are used to form polynuclear complexes of the invention, these are typically used in the form of a racemate of the Δ and Λ isomers. This leads to diastereomer mixtures in the polynuclear compounds of the invention, for example to Δ,Δ/Λ,Λ and (meso)-Δ,Λ forms for dinuclear compounds. Unless stated otherwise, these are converted or used further as a diastereomer mixture. In addition, it is possible to separate these by chromatographic methods or by fractional crystallization.

If the enantiomerically pure Δ or Λ isomers of mononuclear complex synthesis units are used to form polynuclear complexes of the invention, it is possible, for example, to selectively prepare Δ,Δ or Λ,Λ or (meso)-Δ,Λ forms for dinuclear complexes. The same also applies to trinuclear and higher polynuclear complexes of the invention.

The D or L isomers of mononuclear complex synthesis units needed for the purpose can be obtained as follows. If $C_3$— or $C_{3v}$-symmetric ligands are used in the synthesis of the mononuclear complex synthesis units, what is typically obtained is a racemic mixture of the $C_3$-symmetric complexes, i.e. of the D enantiomer and the L enantiomer. These may be separated by standard methods (chromatography on chiral materials/columns or optical resolution by crystallization). This is shown in the scheme which follows using the example of a $C_3$-symmetric ligand bearing three phenylpyridine sub-ligands and also applies analogously to all other $C_3$— or $C_{3v}$-symmetric ligands.

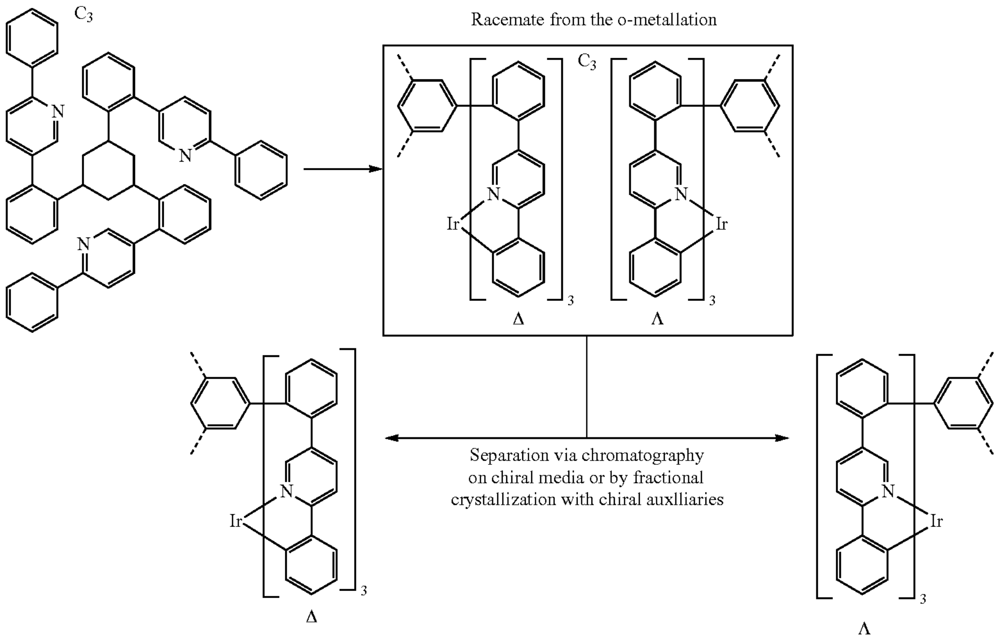

Optical resolution via fractional crystallization of diastereomeric salt pairs can be effected by customary methods. One option for this purpose is to oxidize the uncharged Ir(III) complexes (for example with peroxides or $H_2O_2$ or by electrochemical means), add the salt of an enantiomerically pure monoanionic base (chiral base) to the cationic Ir(IV) complexes thus produced, separate the diastereomeric salts thus produced by fractional crystallization, and then reduce them with the aid of a reducing agent (e.g. zinc, hydrazine hydrate, ascorbic acid, etc.) to give the enantiomerically pure uncharged complex, as shown schematically below:

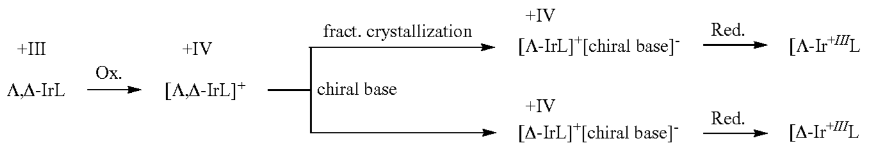

In addition, an enantiomerically pure or enantiomerically enriching synthesis is possible by complexation in a chiral medium (e.g. R— or S-1,1-binaphthol).

Analogous processes can also be conducted with complexes of $C_s$-symmetric ligands.

If $C_1$-symmetric ligands are used in the complexation, what is typically obtained is a diastereomer mixture of the complexes which can be separated by standard methods (chromatography, crystallization).

Enantiomerically pure $C_3$-symmetric complexes can also be synthesized selectively, as shown in the scheme which follows. For this purpose, an enantiomerically pure $C_3$-symmetric ligand is prepared and complexed, the diastereomer mixture obtained is separated and then the chiral group is detached.

example halogenated or borylated, and then joined by coupling reactions, for example Suzuki coupling, to give polynuclear complexes of the invention.

The abovementioned preferred embodiments can be combined with one another as desired. In a particularly preferred embodiment of the invention, the abovementioned preferred embodiments apply simultaneously.

The complexes of the invention can be prepared by two routes. Firstly, the ligand (2-, 4-, 6-, 8-, 10- or 12-dentate) containing the bi- or polycyclic units B can be prepared and then coordinated to the metal(s) or metal fragment(s). In general, for this purpose, an iridium or platinum salt is reacted with the corresponding free ligand.

Therefore, the present invention further provides a process for preparing the iridium complexes of the invention by

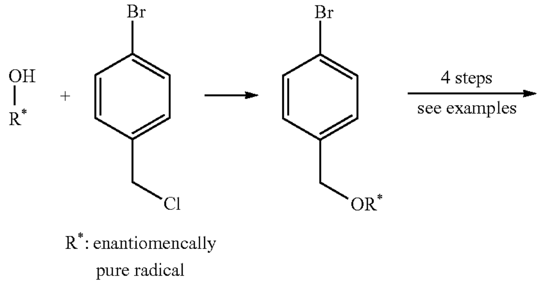

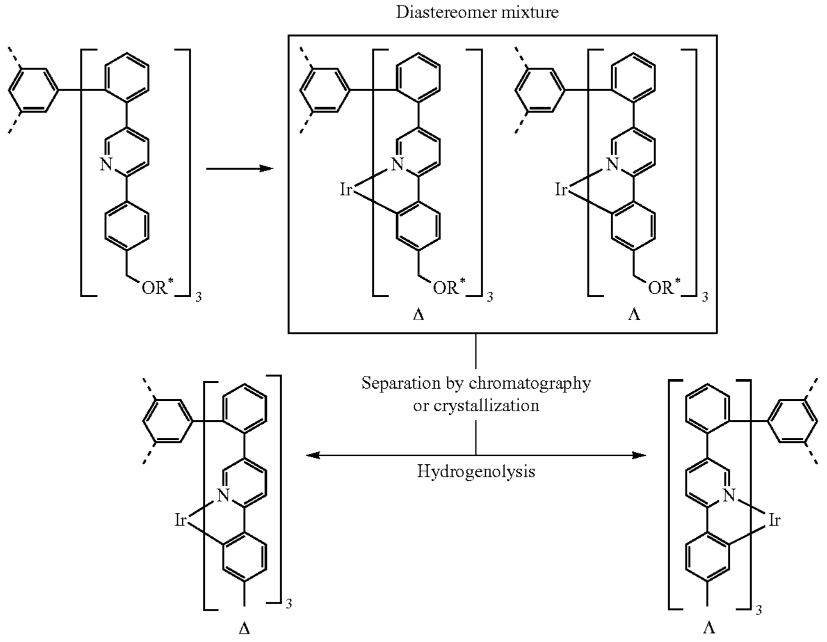

The D or L isomers of mononuclear complex synthesis units thus obtained can finally be functionalized, for reacting the corresponding free ligands with metal alkoxides of the formula (58), with metal ketoketonates of the formula (59), with metal halides of the formula (60) or with metal carboxylates of the formula (61)

Formula (58)

$Ir(OR)_3$

Formula (59)

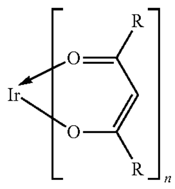

Formula (60)

$IrHal_3$

Formula (61)

$Ir(OOCR)_3$ where R has the definitions given above, Hal=F, Cl, Br or I and the iridium reactants may also take the form of the corresponding hydrates. R here is preferably an alkyl group having 1 to 4 carbon atoms.

It is likewise possible to use iridium compounds bearing both alkoxide and/or halide and/or hydroxyl and ketoketonate radicals. These compounds may also be charged. Corresponding iridium compounds of particular suitability as reactants are disclosed in WO 2004/085449. Particularly suitable are $[IrCl_2(acac)_2]^-$, for example $Na[IrCl_2(acac)_2]$, metal complexes with acetylacetonate derivatives as ligand, for example $Ir(acac)_3$ or tris(2,2,6,6-tetramethylheptane-3,5-dionato)iridium, and $IrCl_3 \cdot xH_2O$ where x is typically a number from 2 to 4.

The synthesis of the complexes is preferably conducted as described in WO 2002/060910 and in WO 2004/085449. In this case, the synthesis can, for example, also be activated by thermal or photochemical means and/or by microwave radiation. In addition, the synthesis can also be conducted in an autoclave at elevated pressure and/or elevated temperature.

The reactions can be conducted without addition of solvents or melting aids in a melt of the corresponding ligands to be o-metallated. It is optionally possible to add solvents or melting aids. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulfoxides (DMSO) or sulfones (dimethyl sulfone, sulfolane, etc.). Suitable melting aids are compounds that are in solid form at room temperature but melt when the reaction mixture is heated and dissolve the reactants, so as to form a homogeneous melt. Particularly suitable are biphenyl, m-terphenyl, triphenyls, R- or S-binaphthol or else the corresponding racemate, 1,2-, 1,3- or 1,4-bisphenoxybenzene, triphenylphosphine oxide, 18-crown-6, phenol, 1-naphthol, hydroquinone, etc. Particular preference is given here to the use of hydroquinone.

Alternatively, one or more metal complexes functionalized with halogen or boronic acid or boronic ester groups can be reacted with the appropriately functionalized $[[Ar]_p—B]—R^B$ unit(s) or else with a mixture of functionalized Ar and B units in coupling reactions, preferably a Suzuki coupling, to give the compound of the invention. Further details of this can be inferred from the examples.

It is possible by these processes, if necessary followed by purification, for example recrystallization or sublimation, to obtain the inventive compounds of formula (1) in high purity, preferably more than 99% (determined by means of $^1H$ NMR and/or HPLC).

The metal complexes of the invention may also be rendered soluble by suitable substitution, for example by comparatively long alkyl groups (about 4 to 20 carbon atoms), especially branched alkyl groups, or optionally substituted aryl groups, for example xylyl, mesityl or branched terphenyl or quaterphenyl groups. Another particular method that leads to a distinct improvement in the solubility of the metal complexes is the use of fused-on aliphatic groups, as shown, for example, by the formulae (51) to (57) disclosed above. Such compounds are then soluble in sufficient concentration at room temperature in standard organic solvents, for example toluene or xylene, to be able to process the complexes from solution. These soluble compounds are of particularly good suitability for processing from solution, for example by printing methods.

The compounds of the invention can also be mixed with a polymer or incorporated covalently into a polymer. This is especially possible with compounds substituted by reactive leaving groups, such as bromine, iodine, chlorine, boronic acid or boronic ester, or by reactive, polymerizable groups, such as olefins or oxetanes. These can find use as monomers for production of corresponding oligomers, polymers or dendrimers. The oligomerization or polymerization is preferably effected via the halogen functionality or the boronic acid functionality or via the polymerizable group. In a preferred embodiment of the present invention, the compounds of the invention, when they are used in oligomers, dendrimers or polymers, are used as the end group therein.

The invention therefore further provides oligomers, polymers or dendrimers containing one or more of the above-detailed compounds of the invention, where one or more bonds of the compound of the invention to the polymer, oligomer or dendrimer are present. According to the linkage of the compound of the invention, it therefore forms a side chain of the oligomer or polymer or is linked within the main chain or constitutes an end group. The polymers, oligomers or dendrimers may be conjugated, partly conjugated or nonconjugated. The oligomers or polymers may be linear, branched or dendritic. The repeat units of the compounds of the invention in oligomers, dendrimers and polymers are subject to the same preferences as described above.

For the processing of the metal complexes of the invention from the liquid phase, for example by spin-coating or by printing methods, formulations of the metal complexes of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, hexamethylindane, 2-methylbiphenyl, 3-methylbiphenyl, 1-methylnaphthalene, 1-ethylnaphthalene, ethyl octanoate, diethyl sebacate, octyl octanoate, heptylbenzene, menthyl isovalerate, cyclohexyl hexanoate or mixtures of these solvents.

The present invention therefore further provides a formulation comprising at least one compound of the invention and at least one further compound. The further compound may, for example, be a solvent, especially one of the abovementioned solvents or a mixture of these solvents. The further compound may alternatively be a further organic or inorganic compound which is likewise used in the electronic device, for example a matrix material. This further compound may also be polymeric.

The above-described metal complex of the invention or the preferred embodiments detailed above can be used as active component or as oxygen sensitizers in the electronic device or in photocatalysis. The present invention thus further provides for the use of a compound of the invention in an electronic device or as oxygen sensitizer or in photocatalysis. The present invention still further provides an electronic device comprising at least one compound of the invention.

An electronic device is understood to mean any device comprising anode, cathode and at least one layer, said layer comprising at least one organic or organometallic compound. The electronic device of the invention thus comprises anode, cathode and at least one layer containing at least one metal complex of the invention. Preferred electronic devices are selected from the group consisting of organic electroluminescent devices (OLEDs, PLEDs), organic integrated circuits (O—ICs), organic field-effect transistors (O-FETs), organic thin-film transistors (O-TFTs), organic light-emitting transistors (O-LETs), organic solar cells (O—SCs), the latter being understood to mean both purely organic solar cells and dye-sensitized solar cells, organic optical detectors, organic photoreceptors, organic field-quench devices (O-FQDs), light-emitting electrochemical cells (LECs), oxygen sensors and organic laser diodes (O-lasers), comprising at least one metal complex of the invention in at least one layer. Particular preference is given to organic electroluminescent devices. Active components are generally the organic or inorganic materials introduced between the anode and cathode, for example charge injection, charge transport or charge blocker materials, but especially emission materials and matrix materials. The compounds of the invention exhibit particularly good properties as emission material in organic electroluminescent devices. A preferred embodiment of the invention is therefore organic electroluminescent devices. In addition, the compounds of the invention can be used for production of singlet oxygen or in photocatalysis.

Especially when the metal is ruthenium, preference is given to use as a photosensitizer in a dye-sensitized solar cell ("Grätzel cell").

The organic electroluminescent device comprises cathode, anode and at least one emitting layer. Apart from these layers, it may comprise still further layers, for example in each case one or more hole injection layers, hole transport layers, hole blocker layers, electron transport layers, electron injection layers, exciton blocker layers, electron blocker layers, charge generation layers and/or organic or inorganic p/n junctions. At the same time, it is possible that one or more hole transport layers are p-doped, for example with metal oxides such as $MoO_3$ or $WO_3$ or with (per)fluorinated electron-deficient aromatic systems, and/or that one or more electron transport layers are n-doped. It is likewise possible for interlayers to be introduced between two emitting layers, these having, for example, an exciton-blocking function and/or controlling the charge balance in the electroluminescent device. However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Especially preferred are three-layer systems where the three layers exhibit blue, green and orange or red emission (for the basic construction see, for example, WO 2005/011013), or systems having more than three emitting layers. The system may also be a hybrid system wherein one or more layers fluoresce and one or more other layers phosphoresce. Tandem OLED are also particularly suitable for white-emitting OLEDs. White-emitting organic electroluminescent devices may be used for lighting applications or else with colour filters for full-colour displays.

In a preferred embodiment of the invention, the organic electroluminescent device comprises the metal complex of the invention as emitting compound in one or more emitting layers.

When the metal complex of the invention is used as emitting compound in an emitting layer, it is preferably used in combination with one or more matrix materials. The mixture of the metal complex of the invention and the matrix material contains between 0.1% and 99% by weight, preferably between 1% and 90% by weight, more preferably between 3% and 40% by weight and especially between 5% and 25% by weight of the metal complex of the invention, based on the overall mixture of emitter and matrix material. Correspondingly, the mixture contains between 99.9% and 1% by weight, preferably between 99% and 10% by weight, more preferably between 97% and 60% by weight and especially between 95% and 75% by weight of the matrix material, based on the overall mixture of emitter and matrix material.

The matrix material used may generally be any materials which are known for the purpose according to the prior art. The triplet level of the matrix material is preferably higher than the triplet level of the emitter.

Suitable matrix materials for the compounds of the invention are ketones, phosphine oxides, sulphoxides and sulphones, for example according to WO 2004/013080, WO 2004/093207, WO 2006/005627 or WO 2010/006680, triarylamines, carbazole derivatives, e.g. CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example according to WO 2007/063754 or WO 2008/056746, indenocarbazole derivatives, for example according to WO 2010/136109 or WO 2011/000455, azacarbazoles, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, diazasilole derivatives, for example according to WO 2010/054729, diazaphosphole derivatives, for example according to WO 2010/054730, triazine derivatives, for example according to WO 2010/015306, WO 2007/063754 or WO 2008/056746, zinc complexes, for example according to EP 652273 or WO 2009/062578, dibenzofuran derivatives, for example according to WO 2009/148015 or WO 2015/169412, or bridged carbazole derivatives, for example according to US 2009/0136779, WO 2010/050778, WO 2011/042107 or WO 2011/088877.

It may also be preferable to use a plurality of different matrix materials as a mixture, especially at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex of the invention. Preference is likewise given to the use of a mixture of a charge-transporting matrix material and an electrically inert matrix material having no significant involvement, if any, in the charge transport, as described, for example, in WO 2010/108579. Preference is likewise given to the use of two electron-transporting matrix materials, for example triazine derivatives and lactam derivatives, as described, for example, in WO 2014/094964.

It is further preferable to use a mixture of two or more triplet emitters together with a matrix. In this case, the triplet emitter having the shorter-wave emission spectrum serves as co-matrix for the triplet emitter having the longer-wave emission spectrum. For example, it is possible to use the metal complexes of the invention as co-matrix for longer-wave-emitting triplet emitters, for example for green- or red-emitting triplet emitters. In this case, it may also be preferable when both the shorter-wave- and the longer-wave-emitting metal complexes are a compound of the invention.

The metal complexes of the invention can also be used in other functions in the electronic device, for example as hole transport material in a hole injection or transport layer, as charge generation material, as electron blocker material, as hole blocker material or as electron transport material, for example in an electron transport layer. It is likewise possible to use the metal complexes of the invention as matrix material for other phosphorescent metal complexes in an emitting layer.

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (O—SC) or the emission of light (OLED/PLED, O-laser). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WO_3$, or (per)fluorinated electron-deficient aromatic systems. Further suitable p-dopants are HAT-CN (hexacyanohexaazatriphenylene) or the compound NPD9 from Novaled.

Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

The device is correspondingly (according to the application) structured, contact-connected and finally hermetically sealed, since the lifetime of such devices is severely shortened in the presence of water and/or air.

Additionally preferred is an organic electroluminescent device, characterized in that one or more layers are coated by a sublimation process. In this case, the materials are applied by vapour deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an organic electroluminescent device, characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured.

Preference is additionally given to an organic electroluminescent device, characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. For this purpose, soluble compounds are needed, which are obtained, for example, through suitable substitution. In a preferred embodiment of the invention, the layer comprising the compound of the invention is applied from solution.

The organic electroluminescent device can also be produced as a hybrid system by applying one or more layers from solution and applying one or more other layers by vapour deposition. For example, it is possible to apply an emitting layer comprising a metal complex of the invention and a matrix material from solution, and to apply a hole blocker layer and/or an electron transport layer thereto by vapour deposition under reduced pressure.

These methods are known in general terms to those skilled in the art and can be applied by those skilled in the art without difficulty to organic electroluminescent devices comprising compounds of formula (1) or the above-detailed preferred embodiments.

The electronic devices of the invention, especially organic electroluminescent devices, are notable for one or more of the following surprising advantages over the prior art:

1. The metal complexes of the invention show oriented emission. This enables higher quantum efficiencies via improved outcoupling of light from the component and hence higher efficiency of the OLED. This also allows an increase in the lifetime, since the OLED can be operated with lower current.
2. The metal complexes of the invention can be synthesized in very high yield and very high purity with exceptionally short reaction times and at comparatively low reaction temperatures.
3. The metal complexes of the invention have excellent thermal stability.
4. The metal complexes of the invention exhibit neither thermal nor photochemical fac/mer isomerization nor mer/fac isomerization, which leads to advantages in the use of these complexes. This is especially true of polypodal complexes.
5. Some of the metal complexes of the invention have a very narrow emission spectrum, which leads to a high colour purity in the emission, as is desirable particularly for display applications.
6. Organic electroluminescent devices comprising the metal complexes of the invention as emitting materials have a very good lifetime.
7. Organic electroluminescent devices comprising the metal complexes of the invention as emitting materials have excellent efficiency.

These abovementioned advantages are not accompanied by a deterioration in the further electronic properties.

The invention is illustrated in detail by the examples which follow, without any intention of restricting it thereby. The person skilled in the art will be able to use the details given, without exercising inventive skill, to produce further electronic devices of the invention and hence to execute the invention over the entire scope claimed.

EXPERIMENTAL EXAMPLES

General Method for Determining Orbital Energies and Electronic States

The HOMO and LUMO energies and the triplet level and singlet levels of the materials are determined via quantum-chemical calculations. For this purpose, in the present case, the "Gaussian09, Revision D.01" software package (Gaussian Inc.) is used. For calculation of organic substances without metals (referred to as the "org." method), a geometry optimization is first conducted by the semi-empirical method AM1 (Gaussian input line "#AM1 opt") with charge 0 and multiplicity 1. Subsequently, on the basis of the optimized geometry, a single-point energy calculation is effected for the electronic ground state and the triplet level. This is done using the TDDFT (time dependent density functional theory) method B3PW91 with the 6-31G(d) basis set (Gaussian input line "#B3PW91/6-31G(d) td=(50-50, nstates=4)") (charge 0, multiplicity 1). For organometallic compounds (referred to as the "M-org." method), the geometry is optimized by the Hartree-Fock method and the LanL2 MB basis set (Gaussian input line "#HF/LanL2 MB opt") (charge 0, multiplicity 1). The energy calculation is effected, as described above, analogously to that for the organic substances, except that the "LanL2DZ" basis set is used for the metal atom and the "6-31 G(d)" basis set for the ligands (Gaussian input line "#B3PW91/gen pseudo=lanl2 td=(50-50,nstates=4)"). From the energy calculation, the HOMO is obtained as the last orbital occupied by two electrons (alpha occ. eigenvalues) and LUMO as the first unoccupied orbital (alpha virt. eigenvalues) in Hartree units, where HEh and LEh represent the HOMO energy in Hartree units and the LUMO energy in Hartree units respectively. This is used to determine the HOMO and LUMO value in electron volts, calibrated by cyclic voltammetry measurements, as follows:

$$HOMO(\text{eV}) = (HEh^{*}27.212)^{*}0.8308 - 1.118$$

$$LUMO(\text{eV}) = (LEh^{*}27.212)^{*}1.0658 - 0.5049$$

These values are to be regarded as HOMO and as LUMO of the materials.

The triplet level T1 of a material is defined as the relative excitation energy (in eV) of the triplet state having the lowest energy which is found by the quantum-chemical energy calculation.

The singlet level S1 of a material is defined as the relative excitation energy (in eV) of the singlet state having the second-lowest energy which is found by the quantum-chemical energy calculation.

The energetically lowest singlet state is referred to as S0.

The method described herein is independent of the software package used and always gives the same results. Examples of frequently utilized programs for this purpose are "Gaussian09" (Gaussian Inc.) and Q-Chem 4.1 (Q-Chem, Inc.). In the present case, the energies are calculated using the software package "Gaussian09, Revision D.01".

The syntheses which follow, unless stated otherwise, are conducted under a protective gas atmosphere in dried solvents. The metal complexes are additionally handled with exclusion of light or under yellow light. The solvents and reagents can be purchased, for example, from Sigma-ALDRICH or ABCR. The respective FIGURES in square brackets or the numbers quoted for individual compounds relate to the GAS numbers of the compounds known from the literature.

A. Organic Synthons

1. Synthons LS Known from the Literature

The following synthons are known from the literature and are used in the preparation of the compounds of the invention:

LS1

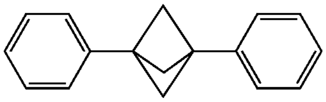

245508-15-0

-continued
LS2
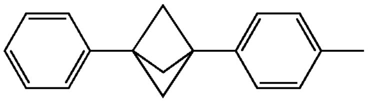
271767-93-2
LS3
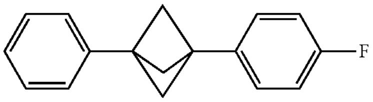
271767-92-1
LS4
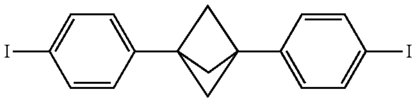
936502-32-8
LS5
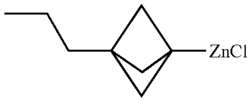
1364397-29-4
LS6
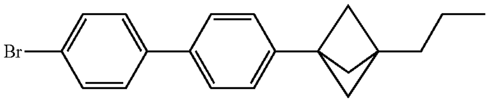
271768-10-6
LS7
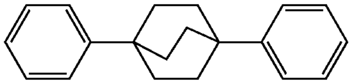
23062-63-7
LS8
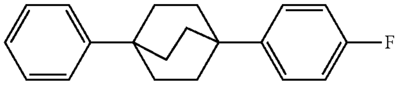
68756-32-1
LS9
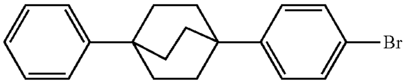
1253571-34-4
LS10
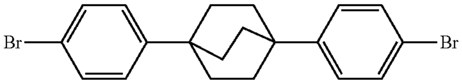
33732-71-7
LS11
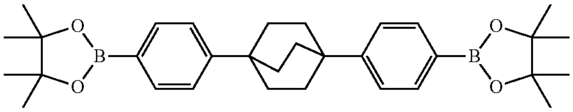
178742-53-5
LS12
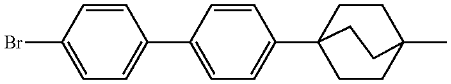
76921-39-6
-continued
LS13
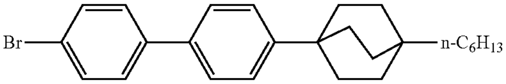
76937-43-4
LS14
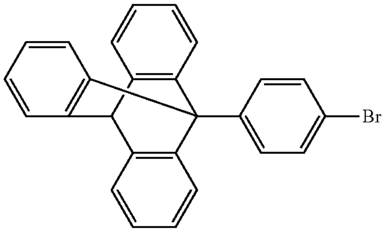
162259-31-6
LS15
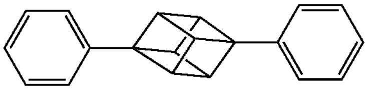
133180-91-3
LS16
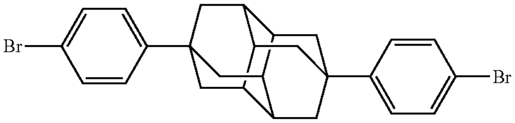
167013-15-2
LS100
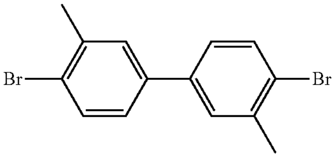
61794-96-5
LS101
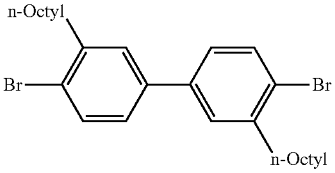
450398-41-1
LS102
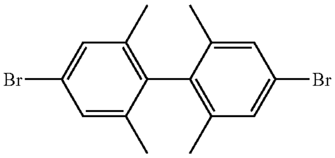
22409-76-3
LS103
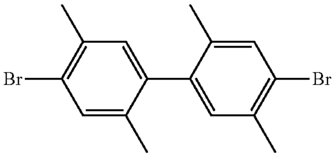
492434-55-6

LS104
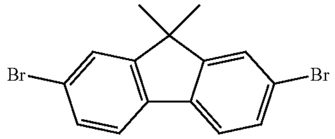
28320-32-3
LS105
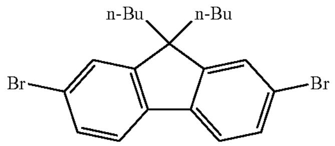
188200-91-1
LS106
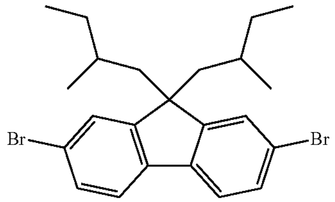
500343-25-9
LS107
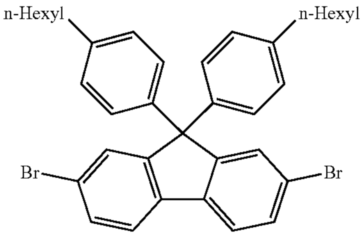
1059179-65-5
LS108
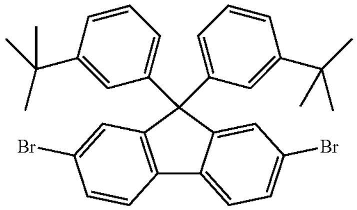
439791-57-8
LS109
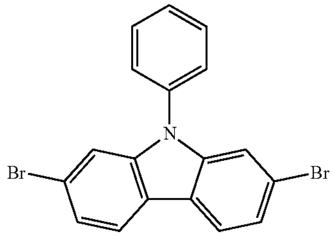
444796-09-2
LS110
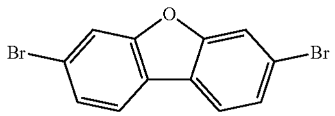
67019-91-4
LS111
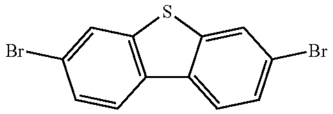
83834-10-0
LS112
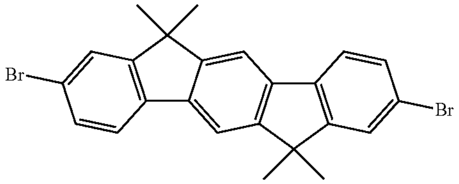
822705-64-1
LS113
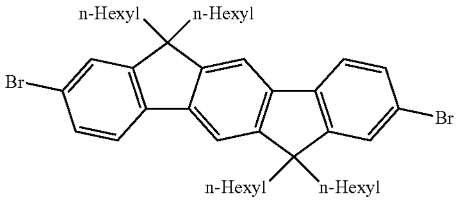
822705-69-6
LS200
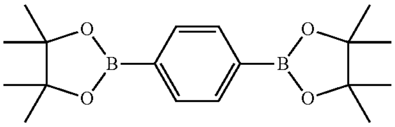
99770-93-1
LS201
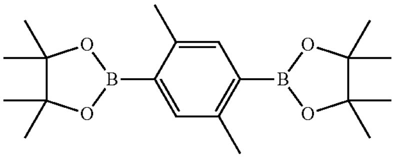
303006-89-5
LS202
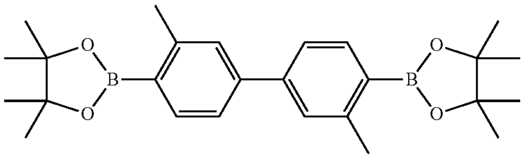
1422986-81-9
LS203
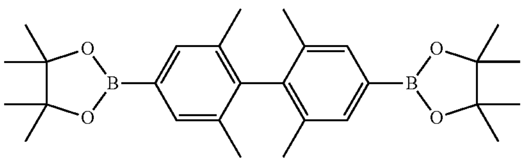
1449715-08-5

-continued
LS204
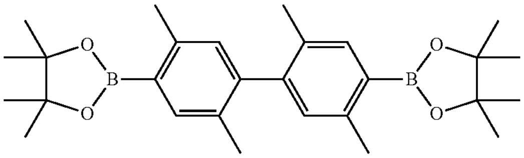
1399191-76-4
LS205
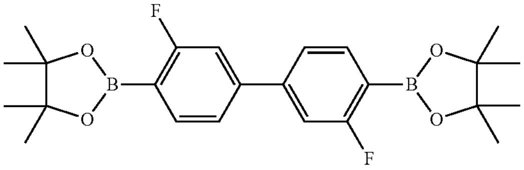
1515948-43-2
LS206
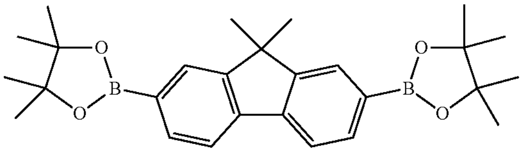
325129-69-9
LS207
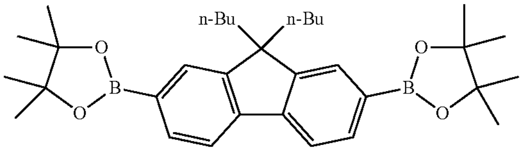
355135-06-7
LS208
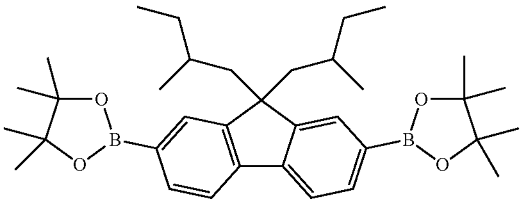
491880-74-1
LS209
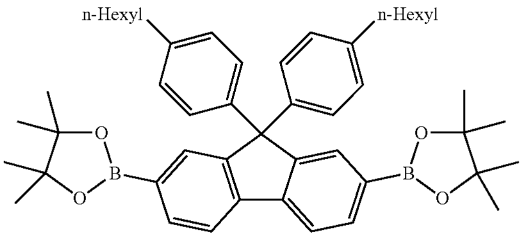
1206875-64-0
-continued
LS210
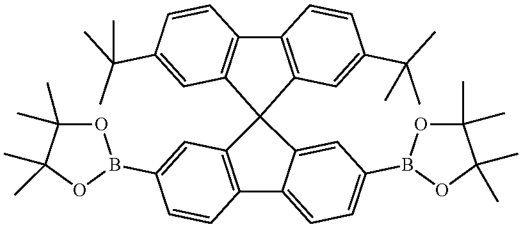
774611-20-0
LS211
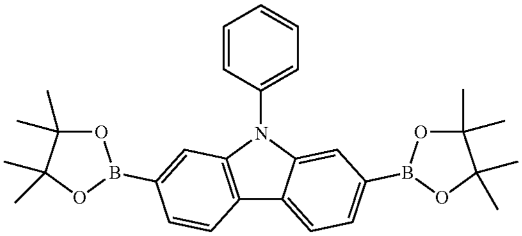
1035631-57-2
LS212
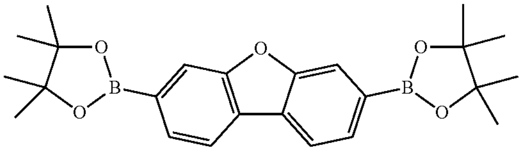
1821662-15-0
LS213
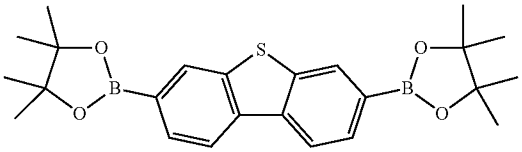
1378383-16-4
LS214
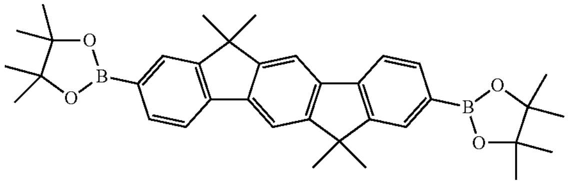
1563177-81-2
LS215
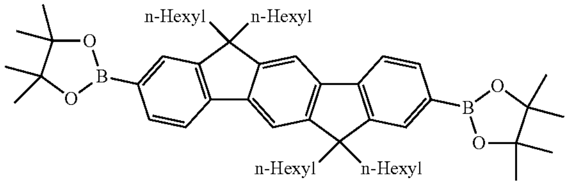
1210388-13-8

-continued

LS216

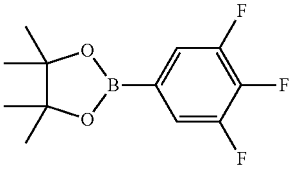

827614-70-0

LS217

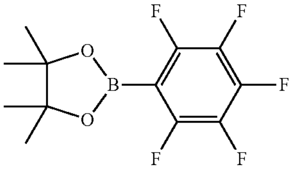

325142-81-2

LS218

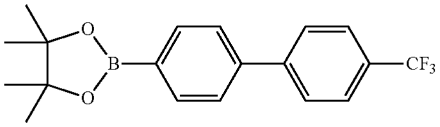

1381958-89-9

LS219

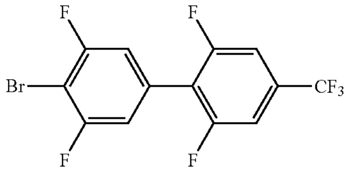

1469898-34-7

LS220

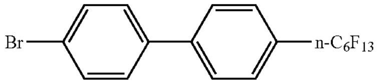

87415-27-8

2. Synthesis of Iodides by Iodination

Example S1

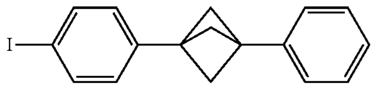 [SMILES: Ic1ccc(C23CC(c4ccccc4)(C2)C3)cc1]

To a solution of 22.0 g (100 mmol) of LS1 in 1000 ml of chloroform in the dark are added 43.0 g (100 mmol) of bis(trifluoroacetoxy)iodobenzene [2712-78-9] and then 12.7 g (50 mmol) of iodine [7553-56-2], and the mixture is stirred at room temperature for 2 h. The reaction mixture is poured onto 500 ml of saturated sodium thiosulfate solution while stirring and stirred for a further 10 min. The organic phase is removed and dried over magnesium sulfate. The desiccant is filtered off and the filtrate is concentrated to dryness. The residue was purified by flash chromatography (CombiFlash Torrent from Axel Semrau). Yield: 7.6 g (22 mmol), 22%; purity: 95% by $^{1}H$ NMR.

The following compounds can be prepared in an analogous manner:

| Ex. | Reactant Product | Yield |
|---|---|---|
| S2 | 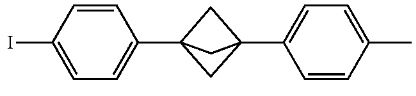 LS2 | 68% |
| S3 | 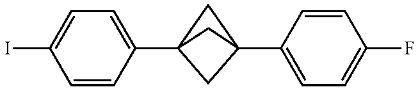 LS3 | 72% |
| S4 | 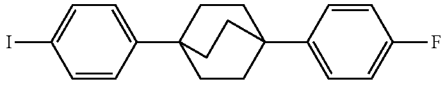 LS8 | 76% |
| S5 | 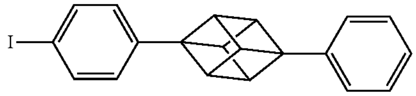 LS15 | 54% |
| S6 | 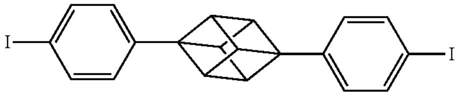 LS15, 50 mmol | 77% |

3. Synthesis of Boronic Esters by Borylation

General Method:

To a mixture of 100 mmol of the monobromides/-iodides or 50 mmol of the dibromides/-iodides, 105 mmol of bis(pinacolato)diborane [73183-34-3], 200 mmol potassium acetate [127-08-2], anhydrous, and 300 ml of dioxane are added, while stirring, 2 mmol of tricyclohexylphosphine [2622-14-2] and 1 mmol of palladium(II) acetate [3375-31-3], and then the mixture is stirred at 100° C. for 16 h. After cooling, the dioxane is substantially removed under reduced pressure, and the residue is taken up in 500 ml of toluene and washed three times with 300 ml of water and once with 300 ml of saturated NaCl solution, and the organic phase is dried over magnesium sulfate. After the desiccant has been filtered off through a Celite bed in the form of a toluene slurry and the toluene has been removed under reduced pressure, the residue is recrystallized twice from ethyl acetate/methanol. Diboronic esters obtained in this way that are used as monomers for preparation of oligomers or polymers are brought to a purity of >99.9% by HPLC by repeated recrystallization and subsequent sublimation.

Example S20
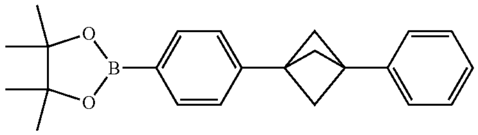
Use of 34.6 g (100 mmol) of S1, 26.6 g (105 mol) of bis(pinacolato)-diborane, 19.6 g (200 mmol) of potassium acetate, 561 mg (2 mmol) of tricyclohexylphosphine and 225 mg (1 mmol) of palladium(II) acetate. Yield: 15.2 g (44 mmol), 44%; purity: >99% by $^1$H NMR.
The following compounds can be prepared in an analogous manner:
| Ex. | Reactant<br>Product | Yield |
|---|---|---|
| S21 | S2<br>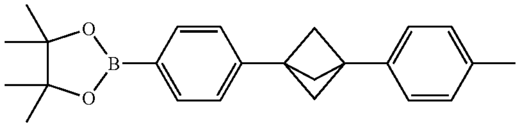 | 46% |
| S22 | S3<br>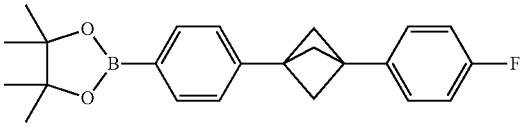 [SMILES: CC1(C)OB(c2ccc(C34CC(c5ccc(F)cc5)(C3)C4)cc2)OC1(C)C] | 41% |
| S23 | LS6<br>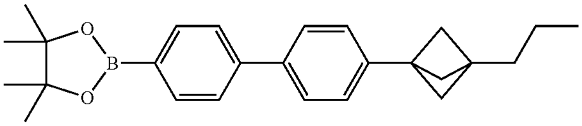 [SMILES: CCCC12CC(c3ccc(-c4ccc(B5OC(C)(C)C(C)(C)O5)cc4)cc3)(C1)C2] | 45% |
| S24 | LS4<br>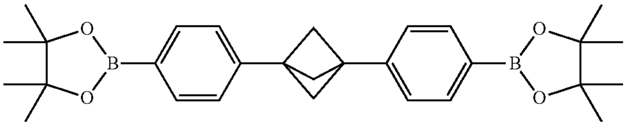 | 33% |
| S25 | LS9<br>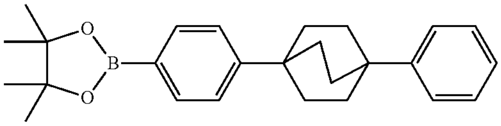 [SMILES: CC1(C)OB(c2ccc(C34CCC(c5ccccc5)(CC3)CC4)cc2)OC1(C)C] | 89% |
| S26 | LS12<br>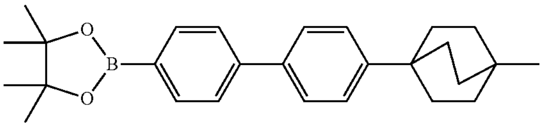 | 90% |
| S27 | LS13<br>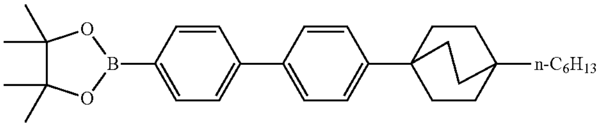 | 81% |

-continued
| Ex. | Reactant<br>Product | Yield |
| --- | --- | --- |
| S28 | LS14<br>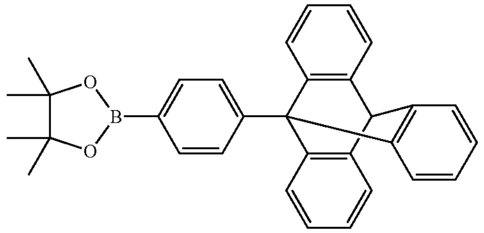 [SMILES: CC1(C)OB(c2ccc(C34c5ccccc5C(c5ccccc53)c3ccccc34)cc2)OC1(C)C] | 94% |
| S29 | S4<br>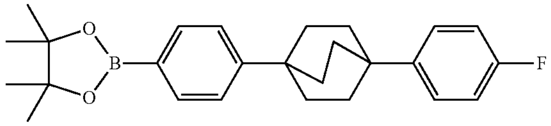 [SMILES: CC1(C)OB(c2ccc(C34CCC(c5ccc(F)cc5)(CC3)CC4)cc2)OC1(C)C] | 85% |
| S30 | S5<br>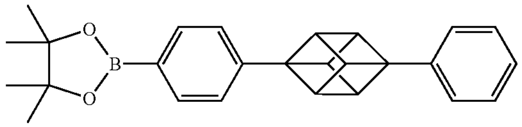 [SMILES: CC1(C)OB(c2ccc(C34C5C6C3C3C4C5C63c3ccccc3)cc2)OC1(C)C] | 76% |
| S31 | S6<br>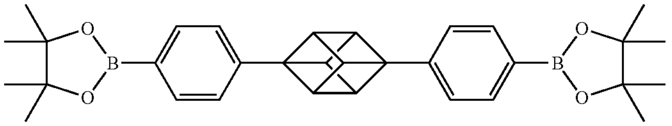 | 80% |
| S32 | LS16<br>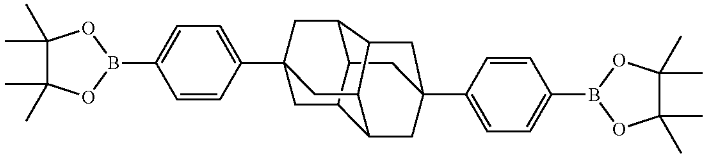 | 84% |
| S33 | S100<br>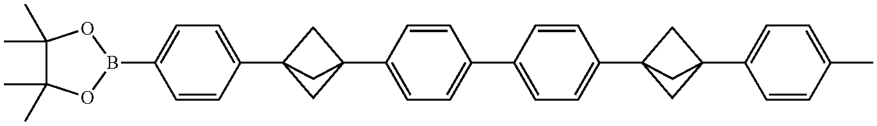 | 33% |
| S34 | S101<br>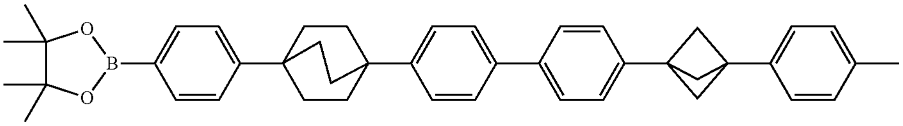 | 40% |
| S35 | S102<br>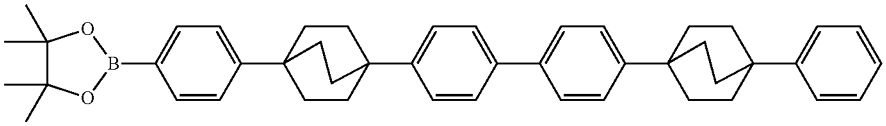 [SMILES: CC1(C)OB(c2ccc(C34CCC(c5ccc(-c6ccc(C78CCC(c9ccccc9)(CC7)CC8)cc6)cc5)(CC3)CC4)cc2)OC1(C)C] | 93% |

-continued
| Ex. | Reactant<br>Product | Yield |
|---|---|---|
| S36 | S103 | 91% |
| | 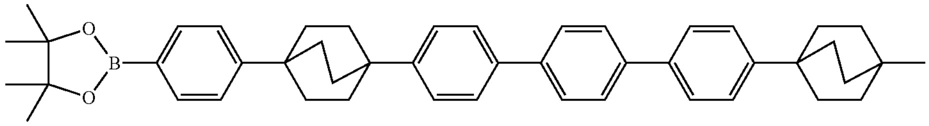 | |
| S37 | S104 | 85% |
| | 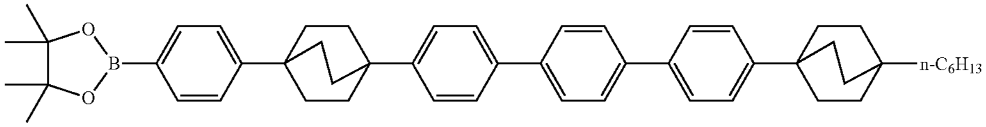 | |
| S38 | S105 | 85% |
| | 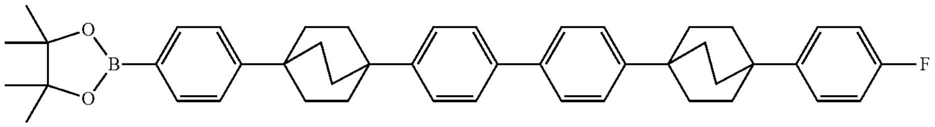 | |
| S39 | S106 | 76% |
| | 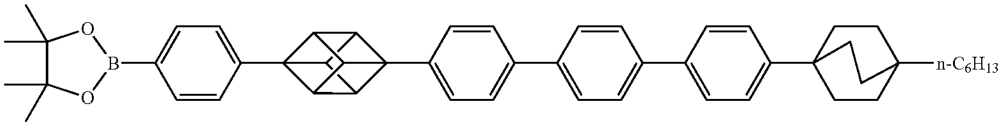 | |
| S40 | S107 | 94% |
| | 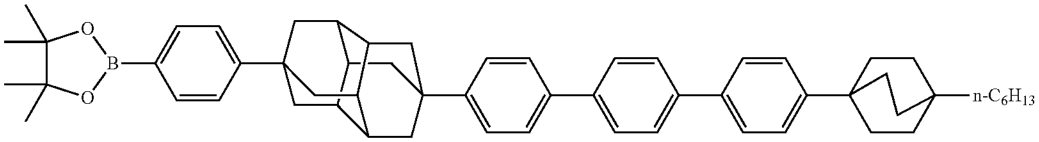 | |
| S41 | S108 | 89% |
| | 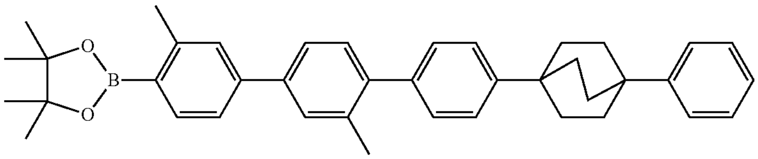 | |
| S42 | S109 | 90% |
| | 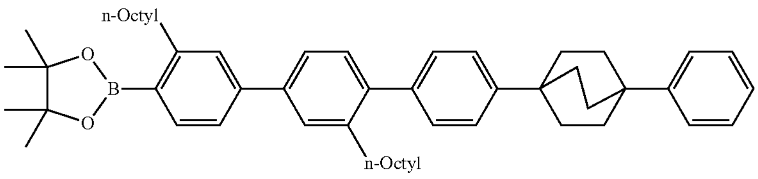 | |

-continued
| Ex. | Reactant<br>Product | Yield |
|---|---|---|
| S43 | S110<br>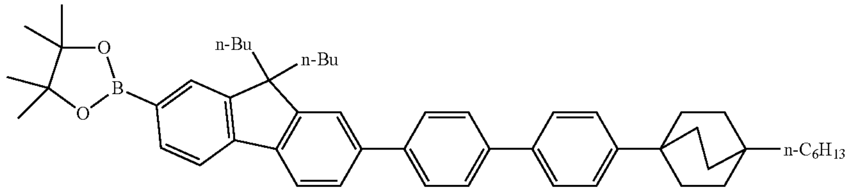 | 93% |
| S44 | S111<br>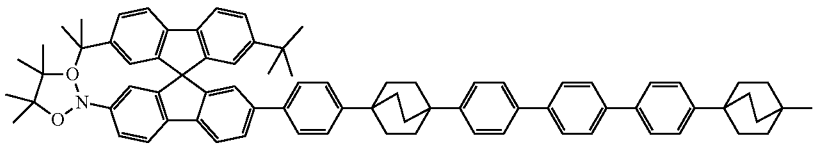 | 90% |
| S45 | S112<br>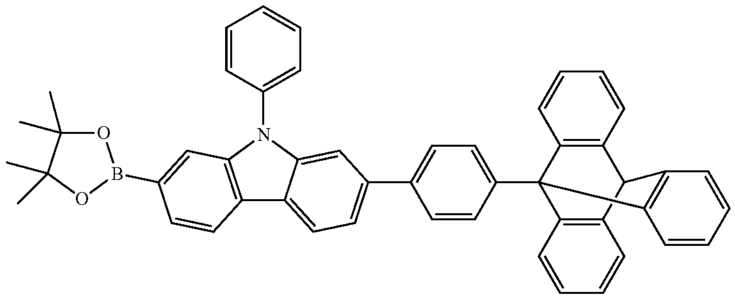 [SMILES: CC1(C)OB(c2ccc3c4ccc(-c5ccc(C67c8ccccc8C(c8ccccc86)c6ccccc67)cc5)cc4n(-c4ccccc4)c3c2)OC1(C)C] | 95% |
| S46 | S113<br>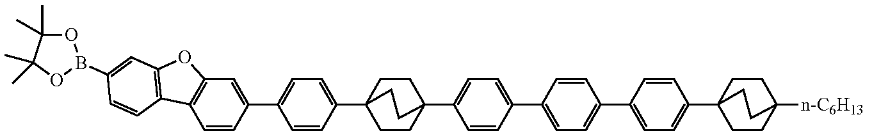 | 86% |
| S90 | LS219<br>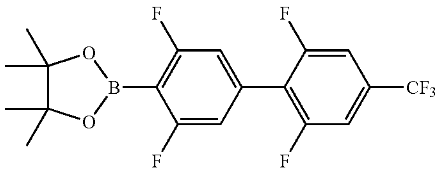 [SMILES: CC1(C)OB(c2c(F)cc(-c3c(F)cc(C(F)(F)F)cc3F)cc2F)OC1(C)C] | 45% |
| S91 | LS220<br>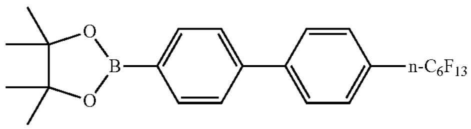 | 78% |

-continued

| Ex. | Reactant<br>Product | Yield |
|---|---|---|
| S92 | S114<br>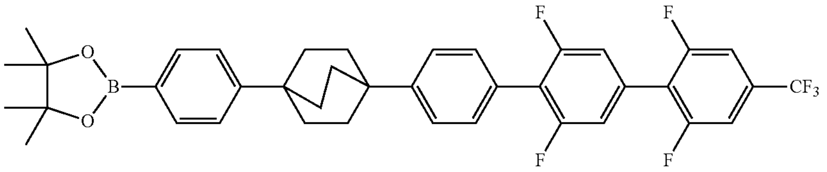 [SMILES: CC1(C)OB(c2ccc(C34CCC(c5ccc(-c6c(F)cc(-c7c(F)cc(C(F)(F)F)cc7F)cc6F)cc5)(CC3)CC4)cc2)OC1(C)C] | 85% |
| S93 | S115<br>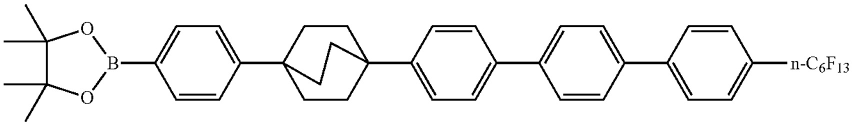 | 87% |

4. Synthesis of Bromide/Iodides by Suzuki Coupling

Example S100

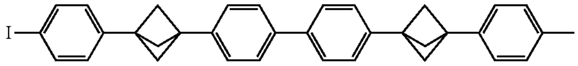

To a mixture of 39.6 g (100 mmol) of LS4, 36.0 g (100 mmol) of 821, 63.7 g (300 mmol) of tripotassium phosphate [7778-53-2], 500 ml of toluene, 200 ml of dioxane and 500 ml of water are added 1.83 g (6 mmol) of tri-o-tolylphosphine [6163-58-2] and 225 mg (1 mmol) of palladium(II) acetate [3975-31-3], and the mixture is stirred well at 100° C. for 18 h. After cooling, the precipitated solids are filtered off (a portion of the double-coupling product). The organic phase of the mother liquor is separated off, washed twice with 300 ml each time of water and once with 300 ml of saturated sodium chloride solution and dried over magnesium sulfate. The residue obtained after the desiccant has been filtered off with suction through a Celite bed in the form of a toluene slurry and the toluene has been removed is purified by flash chromatography (CombiFlash Torrent from Axel Semrau). Yield: 27.8 g (48 mmol), 48%; purity: 97% by HPLC.

The following compounds can be prepared in an analogous manner:

| Ex. | Reactants<br>Product | Yield |
|---|---|---|
| S101 | LS10 + S21<br>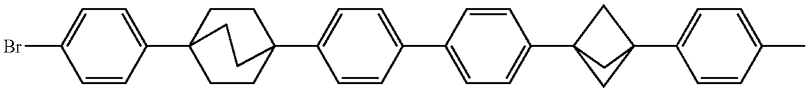 | 34% |
| S102 | LS10 + S25<br>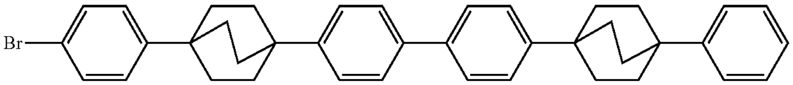 [SMILES: Brc1ccc(C23CCC(c4ccc(-c5ccc(C67CCC(c8ccccc8)(CC6)CC7)cc5)cc4)(CC2)CC3)cc1] | 49% |
| S103 | LS10 + S26<br>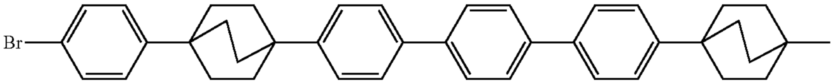 [SMILES: CC12CCC(c3ccc(-c4ccc(-c5ccc(C67CCC(c8ccc(Br)cc8)(CC6)CC7)cc5)cc4)cc3)(CC1)CC2] | 53% |
| S104 | LS10 + S27<br>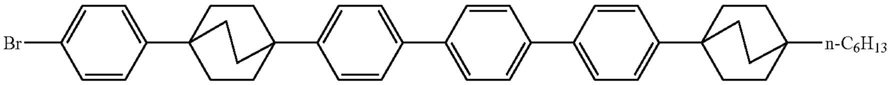 | 48% |

-continued
| Ex. | Reactants<br>Product | Yield |
| --- | --- | --- |
| S105 | LS10 + S29 | 50% |
| | 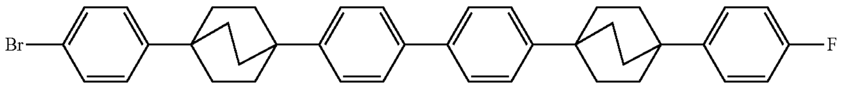 [SMILES: Fc1ccc(C23CCC(c4ccc(-c5ccc(C67CCC(c8ccc(Br)cc8)(CC6)CC7)cc5)cc4)(CC2)CC3)cc1] | |
| S106 | S6 + S27 | 51% |
| | 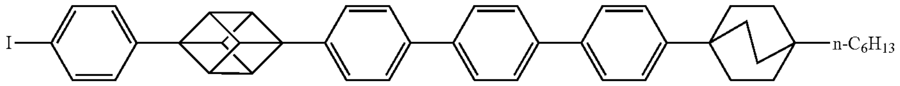 | |
| S107 | LS16 + S27 | 49% |
| | 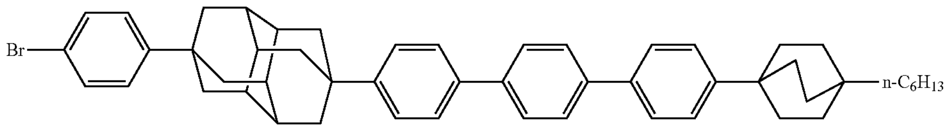 | |
| S108 | LS100 + S25 | 56% |
| | 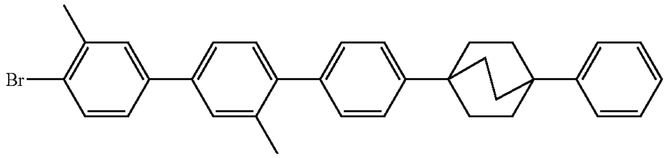 [SMILES: Cc1cc(-c2ccc(-c3ccc(C45CCC(c6ccccc6)(CC4)CC5)cc3)c(C)c2)ccc1Br] | |
| S109 | LS101 + S25 | 51% |
| | 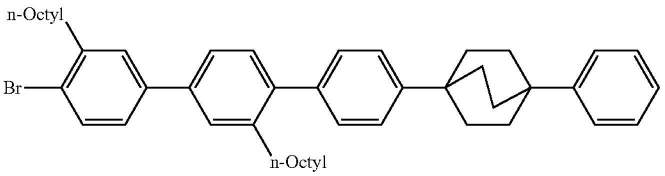 | |
| S110 | LS105 + S27 | 49% |
| | 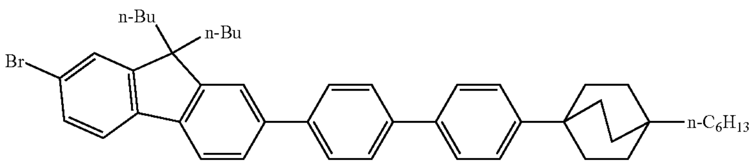 | |
| S111 | LS108 + S36 | 37% |
| | 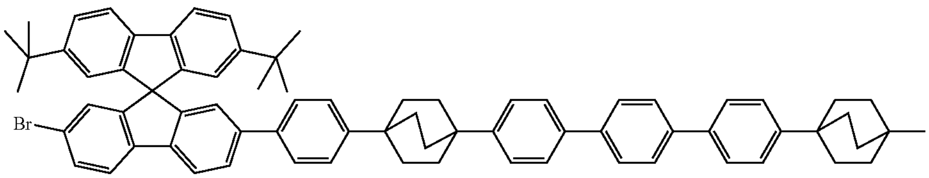 [SMILES: CC12CCC(c3ccc(-c4ccc(-c5ccc(C67CCC(c8ccc(-c9ccc%10c(c9)C9(c%11cc(Br)ccc%11-%10)c%10cc(C(C)(C)C)ccc%10-c%10ccc(C(C)(C)C)cc%109)cc8)(CC6)CC7)cc5)cc4)cc3)(CC1)CC2] | |

-continued

| Ex. | Reactants<br>Product | Yield |
|---|---|---|
| S112 | LS109 + S28 | 55% |
| | 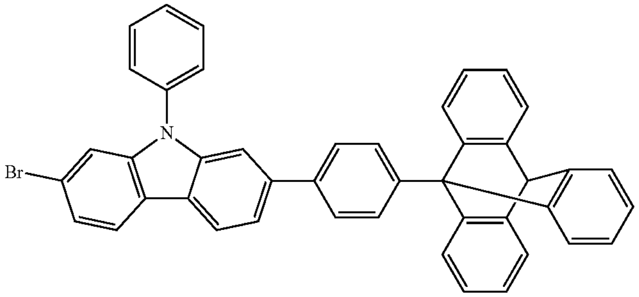 [SMILES: Brc1ccc2c3ccc(-c4ccc(C56c7ccccc7C(c7ccccc75)c5ccccc56)cc4)cc3n(-c3ccccc3)c2c1] | |
| S113 | LS110 + S37 | 43% |
| | 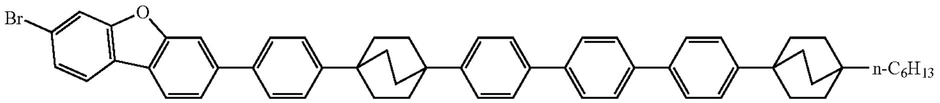 | |
| S114 | LS10 + S90 | 21% |
| | 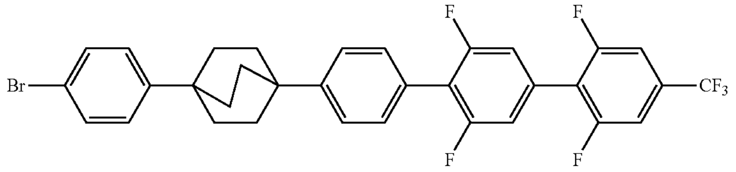 [SMILES: Fc1cc(-c2c(F)cc(C(F)(F)F)cc2F)cc(F)c1-c1ccc(C23CCC(c4ccc(Br)cc4)(CC2)CC3)cc1] | |
| S115 | LS10 + S91 | 40% |
| | 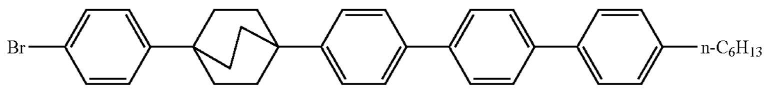 | |
| S116 | LS101 + S92 | 47% |
| | 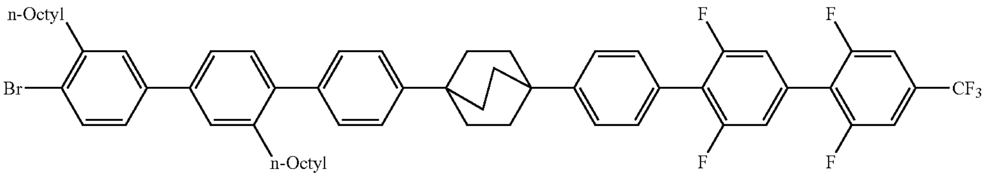 | |

5. Synthesis of Boronic Esters by Suzuki Coupling

Example S200

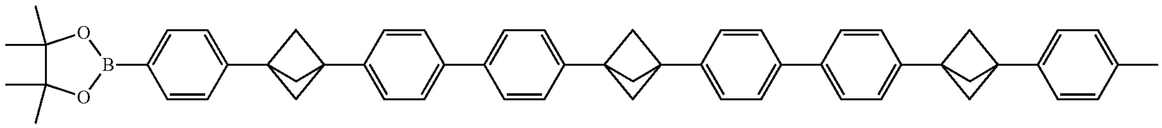

To a mixture of 47.2 g (100 mmol) of S24, 57.9 g (100 mmol) of S100, 23.0 g (100 mmol) of tripotassium phosphate monohydrate [27176-10-9] and 500 ml of DMSO are added 1.16 g (1 mmol) of tetrakis(triphenylphosphino)-palladium(0) [14221-01-3], and the mixture is stirred well at 80° C. for 18 h. After cooling, the DMSO is substantially removed under reduced pressure, and the residue is taken up in 1000 ml of hot toluene, filtered through a silica gel bed in the form of a hot toluene slurry and washed through with 500 ml of hot toluene, and then the organic phase is concentrated to dryness under reduced pressure. The residue is boiled with 500 ml of isopropanol. After the crude product has been filtered off with suction and dried under reduced pressure, it is purified by flash chromatography (CombiFlash Torrent from Axel Semrau) gereinigt. Yield: 22.3 g (28 mmol), 28%; purity about 97% by $^{1}$H NMR.

The following compounds can be prepared in an analogous manner:
| Ex. | Reactants<br>Product | Yield |
|---|---|---|
| S201 | LS11 + S102<br>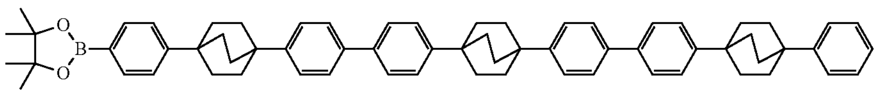 [SMILES: CC1(C)OB(c2ccc(C34CCC(c5ccc(-c6ccc(C78CCC(c9ccc(-c%10ccc(C%11%12CCC(c%13ccccc%13)(CC%11)CC%12)cc%10)cc9)(CC7)CC8)cc6)cc5)(CC3)CC4)cc2)OC1(C)C] | 33% |
| S202 | LS11 + S104<br>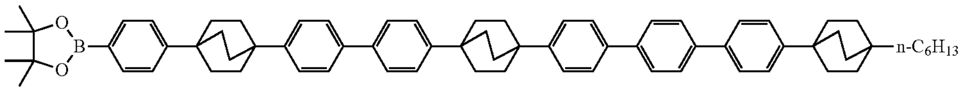 | 29% |
| S203 | S32 + S107<br>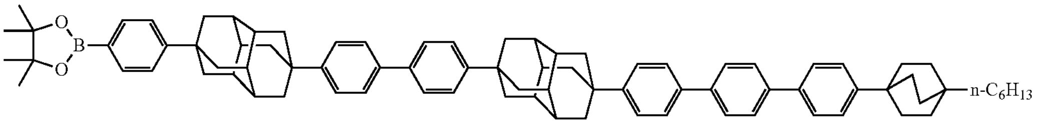 | 35% |
| S204 | LS11 + S108<br>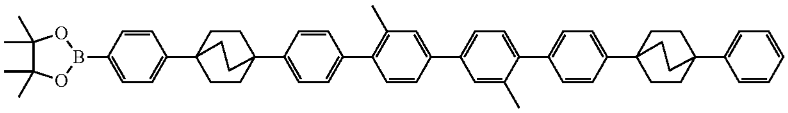 | 42% |
| S205 | LS11 + S109<br>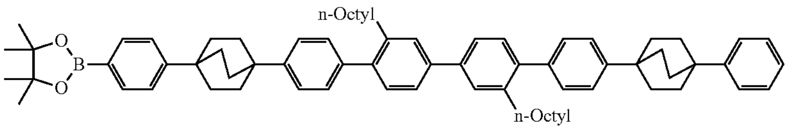 | 34% |
| S206 | S32 + S110<br>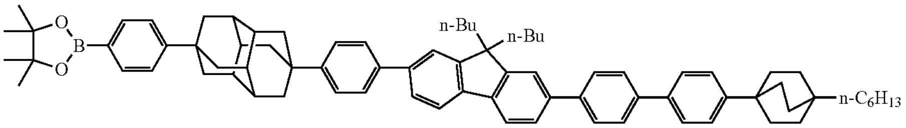 | 36% |
| S207 | LS11 + S92<br>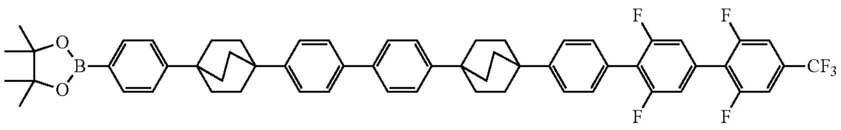 [SMILES: CC1(C)OB(c2ccc(C34CCC(c5ccc(-c6ccc(C78CCC(c9ccc(-c%10c(F)cc(-c%11c(F)cc(C(F)(F)F)cc%11F)cc%10F)cc9)(CC7)CC8)cc6)cc5)(CC3)CC4)cc2)OC1(C)C] | 27% |
| S208 | LS11 + S93<br>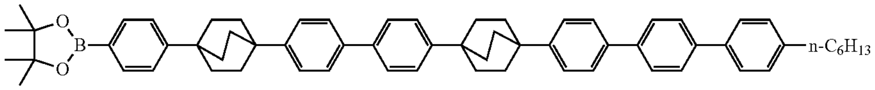 | 24% |

6. Synthesis of the Hexadentate Ligand 1

Example L1

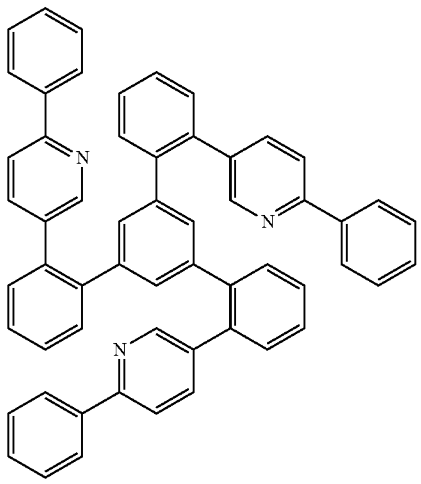 [SMILES: c1ccc(-c2ccc(-c3ccccc3-c3cc(-c4ccccc4-c4ccc(-c5ccccc5)nc4)cc(-c4ccccc4-c4ccc(-c5ccccc5)nc4)c3)cn2)cc1]

A mixture of 54.1 g (100 mmol) of 1,3,5-tris(2-bromophenyl)benzene [380626-56-2], 98.4 g (350 mmol) of 2-phenyl-5-(4,4,5,5-tetramethyl-[1,3,2]dioxaborolan-2-yl)pyridine [879291-27-7], 106.0 g (1 mol) of sodium carbonate, 5.8 g (5 mmol) of tetrakis(triphenylphosphino)palladium(0), 750 ml of toluene, 200 ml of ethanol and 500 ml of water is heated under reflux with very good stirring for 24 h. After 24 h, 300 ml of 5% by weight aqueous acetylcysteine solution are added, the mixture is stirred under reflux for a further 16 h and allowed to cool, the aqueous phase is removed and the organic phase is concentrated to dryness. After the organic phase from the Suzuki coupling has been concentrated, the brown foam is taken up in 300 ml of a mixture of dichloromethane:ethyl acetate (8:1, v/v) and filtered through a silica gel bed in the form of a dichloromethane:ethyl acetate slurry (8:1, v/v) (diameter 15 cm, length 20 cm), in order to remove brown components. After concentration, the remaining foam is recrystallized from 800 ml of ethyl acetate with addition of 400 ml of methanol at boiling and then for a second time from 1000 ml of pure ethyl acetate and then subjected to Kugelrohr sublimation under high vacuum (p about $10^{-5}$ mbar, T 280° C.). Yield: 50.6 g (66 mmol), 66%. Purity: about 99.7% by $^{1}H$ NMR.

Example L2

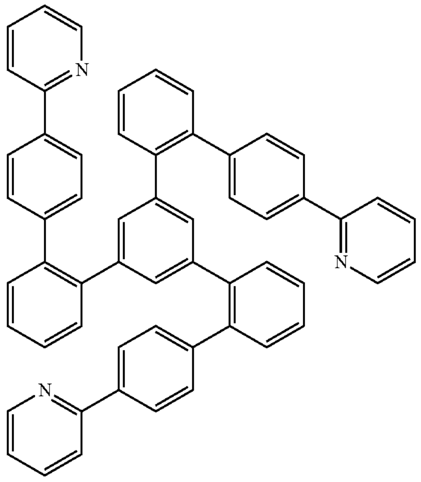 [SMILES: c1ccc(-c2ccc(-c3ccccc3-c3cc(-c4ccccc4-c4ccc(-c5ccccn5)cc4)cc(-c4ccccc4-c4ccc(-c5ccccn5)cc4)c3)cc2)nc1]

Ligand L2 can be prepared in an analogous manner. Rather than 2-phenyl-5-(4,4,5,5-tetramethyl-[1,3,2]dioxaborolan-2-yl)pyridine [879291-27-7], 2-[4-(4,4,5,5-tetramethyl-[1,3,2]dioxaborolan-2-yl)phenyl]pyridine [908350-80-1] is used. Yield: 56.0 g (73 mmol), 73%. Purity: about 99.7% by $^{1}H$ NMR.

Example L3

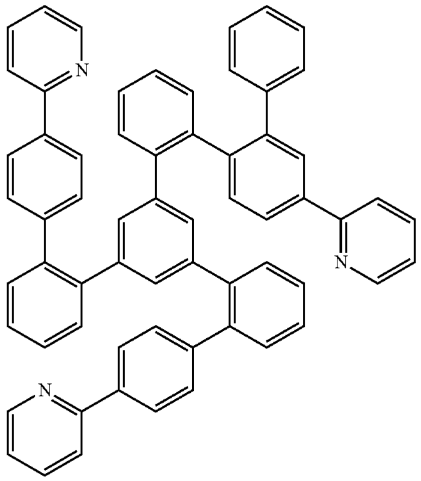 [SMILES: c1ccc(-c2cc(-c3ccccn3)ccc2-c2ccccc2-c2cc(-c3ccccc3-c3ccc(-c4ccccn4)cc3)cc(-c3ccccc3-c3ccc(-c4ccccn4)cc3)c2)cc1]

L3-Intermediate1

A mixture of 22.6 g (100 mmol) of (6-methoxy-[1,1'-biphenyl]-3-yl)boronic acid [459423-16-6], 16.6 g (105 mmol) of 2-bromopyridine [109-04-6], 21.2 g (200 mmol) of sodium carbonate, 1.2 g (1 mmol) of tetrakis(triphenylphosphino)palladium [14221-01-3], 300 ml of toluene, 100 mol of ethanol and 300 ml of water is heated under reflux with good stirring for 18 h. After cooling, the organic phase is removed, washed twice with 300 ml each time of water and once with 300 ml of saturated sodium chloride solution, and dried over magnesium sulfate. The oil obtained after concentration of the organic phase is dried on an oil-pump vacuum at 80° C. and converted without further purification. Yield: 25.6 g (98 mmol), 98%; purity: about 95% by $^1$H NMR.

L3-Intermediate2

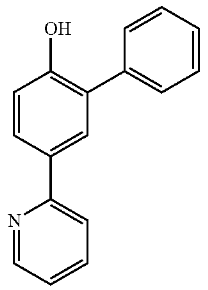 [SMILES: Oc1ccc(-c2ccccn2)cc1-c1ccccc1]

A mixture of 26.1 g (100 mmol) of L3-intermediate1 and 81.9 g (700 mmol) of pyridinium hydrochloride is heated to 190° C. for 3 h. After cooling, the reaction mixture is poured into 500 ml of water and extracted five times with 200 ml each time of dichloromethane, the organic phase is washed twice with 200 ml of water and once with 200 ml of saturated NaCl solution, the solvent is removed under reduced pressure, 300 ml of toluene are added for azeotropic drying and the latter is distilled off completely under reduced pressure. The viscous oil thus obtained is converted without further purification. Yield: 21.0 g (85 mmol), 85%; purity: about 95% by $^1$H NMR.

L3-Intermediate3

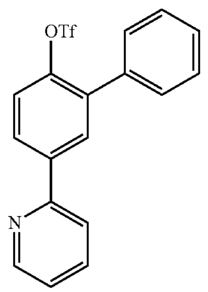 [SMILES: O=S(=O)(Oc1ccc(-c2ccccn2)cc1-c1ccccc1)C(F)(F)F]

To a solution, cooled to 0° C., of 24.7 g (100 mmol) of L3-intermediate2 in a mixture of 300 ml of dichloromethane and 80 ml of pyridine are added dropwise, with good stirring, 34 ml (200 mmol) of trifluoromethanesulfonic anhydride [358-23-6]. The reaction mixture is allowed to warm up to RT and stirred for a further 16 h, poured into 1000 ml of ice-water while stirring and then extracted three times with 300 ml each time of dichloromethane. The combined organic phases are washed twice with 300 ml each time of ice-water and once with 500 ml of saturated NaCl solution and then dried over sodium sulfate. The wax that remains after removal of the dichloromethane under reduced pressure is recrystallized from acetonitrile. Yield: 32.6 g (86 mmol), 86%; purity: about 95% by $^1$H NMR.

L3-Intermediate4

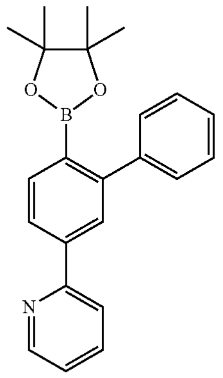 [SMILES: CC1(C)OB(c2ccc(-c3ccccn3)cc2-c2ccccc2)OC1(C)C]

To a solution of 37.9 g (100 mmol) of L3-intermediate3 und 2.2 g (3 mmol) of (DPPF)PdCl$_2$ in 250 ml of dioxane are added, while stirring, 41.6 ml (300 mmol) of triethylamine and then 29.0 ml (200 mmol) of 4,4,5,5-tetramethyl-[1,3,2] dioxaborolane [25015-63-8], and then the mixture is heated under reflux for 18 h. After cooling, the solvent is largely removed under reduced pressure, and the residue is taken up in 300 ml of ethyl acetate, washed three times with 100 ml each time of water and once with 200 ml of saturated sodium chloride solution, and dried over magnesium sulfate. After the desiccant has been filtered off, the solvent is removed under reduced pressure. The oily residue thus obtained is converted further without purification. Yield: 33.9 g (95 mmol), 95%; purity: about 95% by $^1$H NMR.

L3-Intermediate5

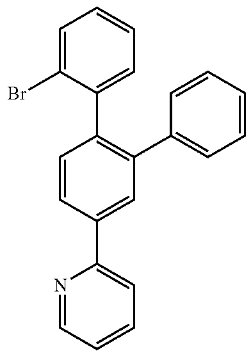 [SMILES: Brc1ccccc1-c1ccc(-c2ccccn2)cc1-c1ccccc1]

A mixture of 35.7 g (100 mmol) of L3-intermediate4, 28.3 g (100 mmol) of 1-bromo-2-iodobenzene [583-55-1], 31.8 g (300 mmol) of sodium carbonate, 787 mg (3 mmol) of triphenylphosphine, 225 mg (1 mmol) of palladium(II) acetate, 300 ml of toluene, 100 ml of ethanol and 300 ml of water is heated under reflux for 48 h. after cooling, the organic phase is removed, washed three times with 100 ml each time of water and once with 100 ml of saturated sodium chloride solution, and dried over magnesium sulfate. The desiccant is filtered off through a Celite bed in the form of a toluene slurry, the toluene is removed under reduced pressure and excess 1-bromo-2-iodobenzene is removed at 80° C. under reduced pressure (about 0.1 mbar).

Yield: 36.7 g (95 mmol), 95%; purity: about 95% by $^{1}$H NMR.

L3

A mixture of 66.3 g (100 mmol) of 2-[4-[2-[3-[2-[4-(2-pyridyl)phenyl]phenyl]-5-(4,4,5,5-tetramethyl-1,3,2-dioxaborolan-2-yl)phenyl]phenyl]-phenyl]pyridine [1989597-72-9], 38.6 g (100 mmol) of L3-intermediate5, 63.7 g (300 mmol) of tripotassium phosphate, 1.6 g (4 mmol) of SPhos, 449 mg (2 mmol) of palladium(II) acetate, 500 ml of toluene, 250 ml of dioxane and 500 ml of water is heated under reflux for 18 h. After cooling, the organic phase is separated off, washed three times with 200 ml each time of water and once with 200 ml saturated sodium chloride solution and dried over magnesium sulfate, the desiccant is filtered off using a Celite bed in the form of a toluene slurry, the solvent is removed under reduced pressure, and the residue is recrystallized from 300 ml of acetonitrile with addition of about 80 ml of ethyl acetate at boiling. Yield: 69.9 g (83 mmol), 83%; purity: about 95% by $^{1}$H NMR.

Example L4

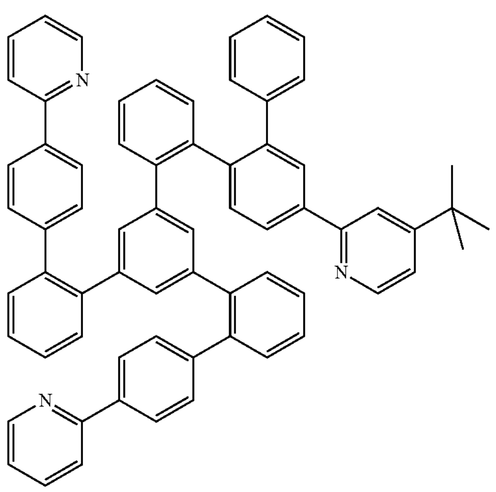 [SMILES: CC(C)(C)c1ccnc(-c2ccc(-c3ccccc3-c3cc(-c4ccccc4-c4ccc(-c5ccccn5)cc4)cc(-c4ccccc4-c4ccc(-c5ccccn5)cc4)c3)c(-c3ccccc3)c2)c1]

L4 can be obtained analogously to L3, except using 2-bromo-4-tert-butylpyridine [50488-34-1] rather than 2-bromopyridine.

Example L5

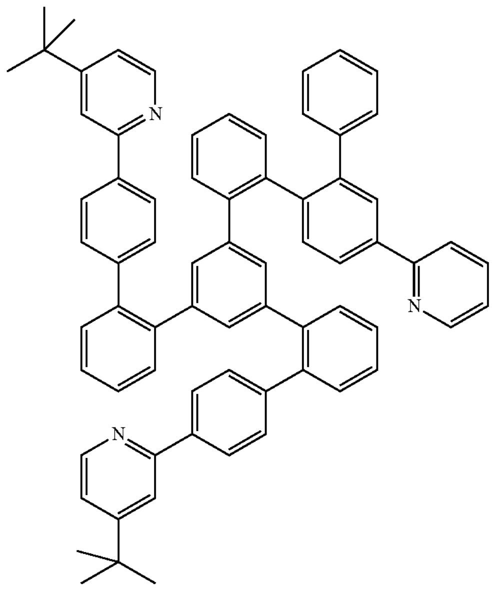 [SMILES: CC(C)(C)c1ccnc(-c2ccc(-c3ccccc3-c3cc(-c4ccccc4-c4ccc(-c5cc(C(C)(C)C)ccn5)cc4)cc(-c4ccccc4-c4ccc(-c5ccccn5)cc4-c4ccccc4)c3)cc2)c1]

L5 can be obtained analogously to L3, except using 4-tert-butyl-2-[4-[2-[3-[2-[4-(4-tert-butyl-2-pyridyl)phenyl]phenyl]-5-(4,4,5,5-tetramethyl-1,3,2-dioxaborolan-2-yl)phenyl]phenyl]phenyl]pyridine [1989597-75-2] rather than 2-[4-[2-[3-[2-[4-(2-pyridyl)phenyl]phenyl]-5-(4,4,5,5-tetramethyl-1,3,2-dioxaborolan-2-yl)phenyl]phenyl]phenyl]pyridine [1989597-72-9].

B: Organometallic Synthons

1. Metal Complex Synthons MS Known from the Literature

MS1

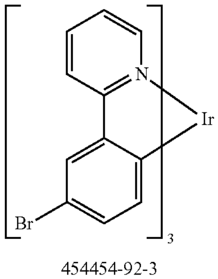

454454-92-3

MS2

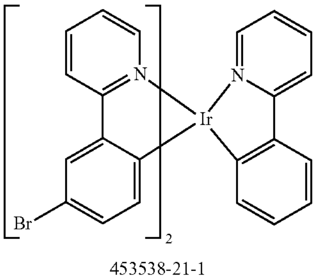

453538-21-1

-continued
MS3
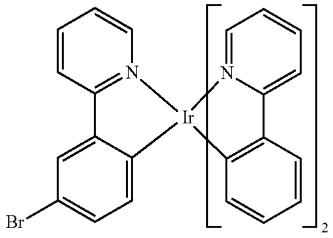
454454-89-8
MS4
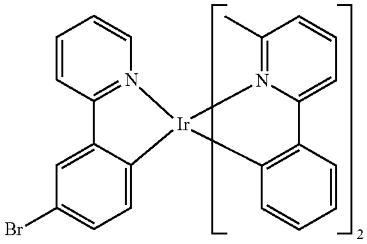
1149344-63-7
MS5
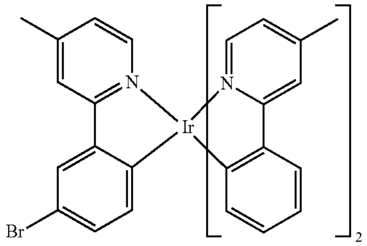
1149344-49-9
MS6
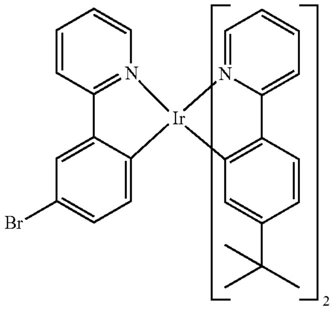
1252029-12-1
MS7
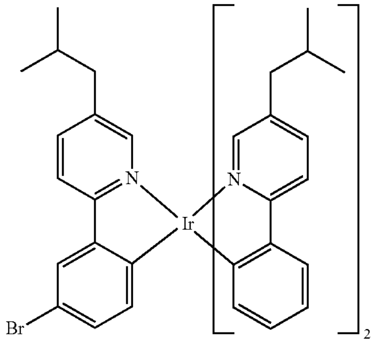
1149344-55-7
MS8
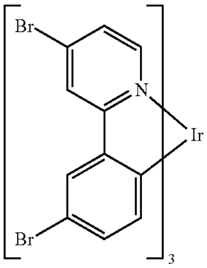
1309878-11-1
MS9
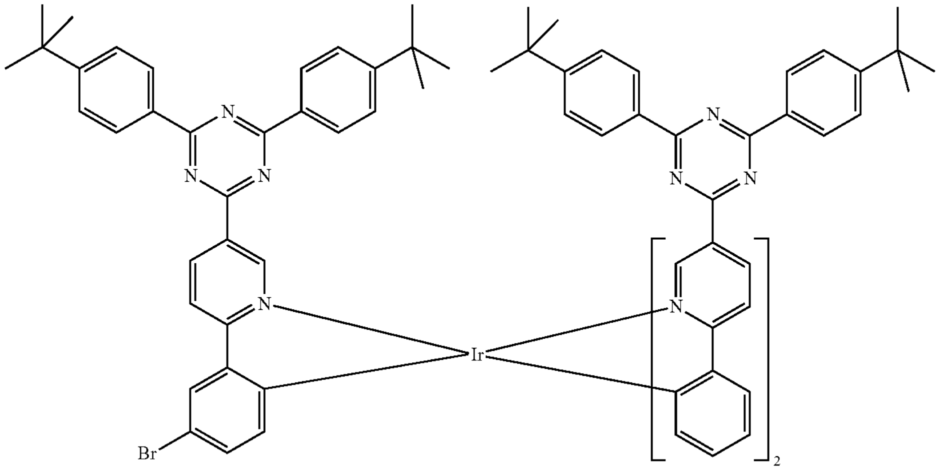
1820909-79-2

-continued
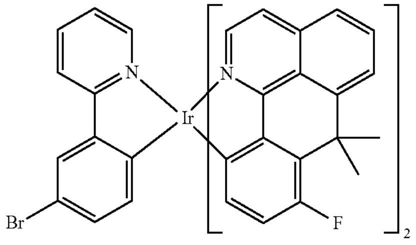
1423076-38-3
MS10
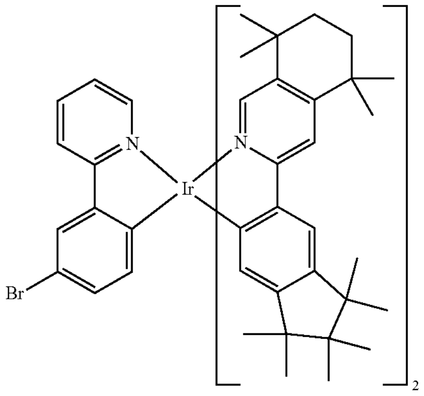
1803296-02-7
MS11
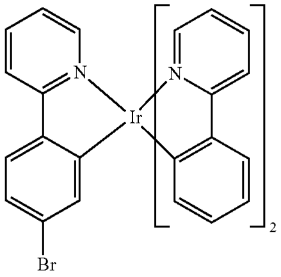
501330-36-5
MS12
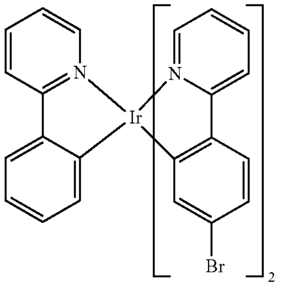
1627953-70-1
MS13
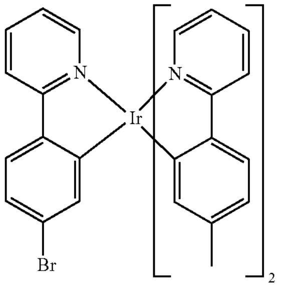
1455513-03-7
MS14
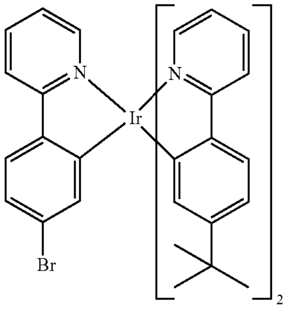
1252029-10-9
MS15
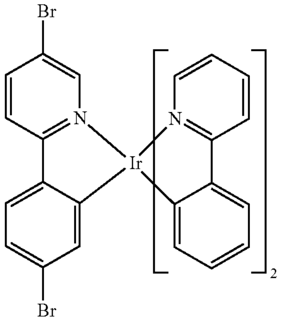
929088-09-5
MS16
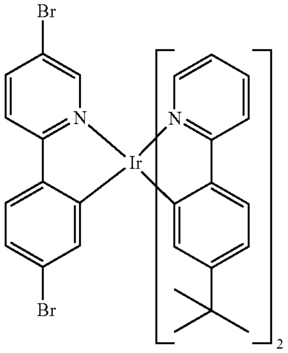
1252029-11-0
MS17

-continued
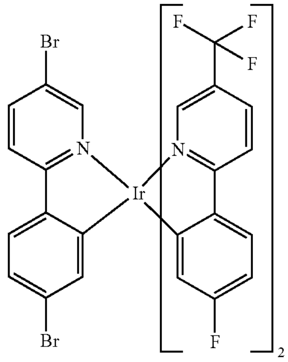
387859-69-0
MS18
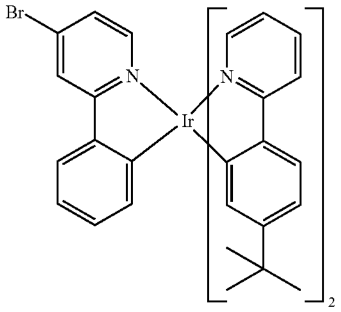
1651859-59-4
MS19
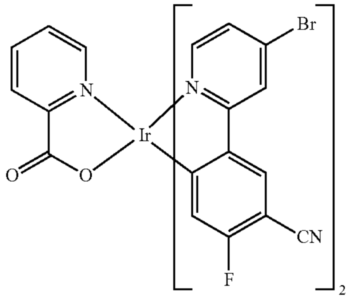
1783850-02-1
MS20
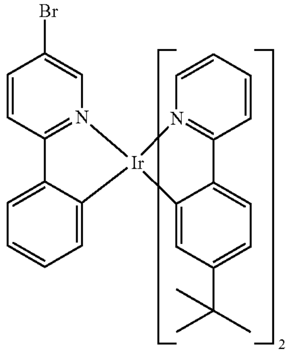
1252029-09-6
MS21
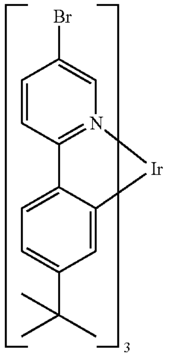
1651859-63-0
MS22
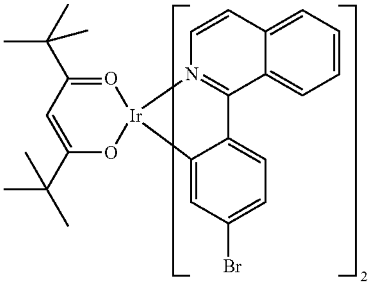
881882-67-3
MS23
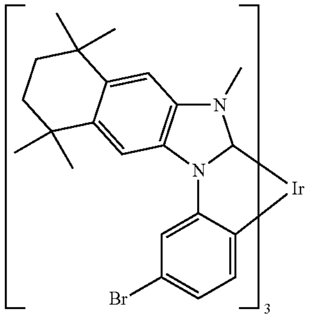
1803319-99-4
MS24
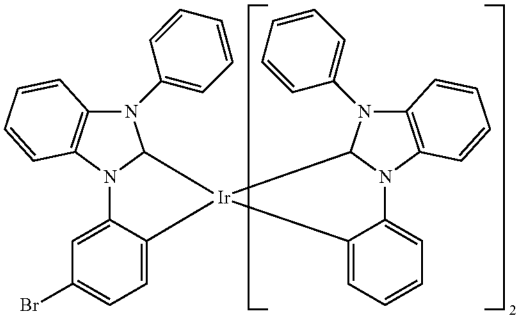
1651822-19-3
MS25

-continued
MS26
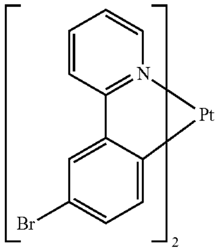
690269-08-0
MS27
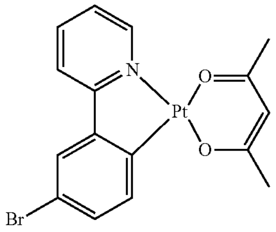
1364058-57-0
MS28
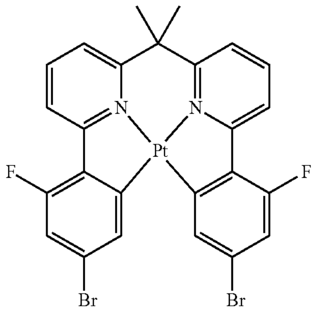
1285719-18-7
MS29
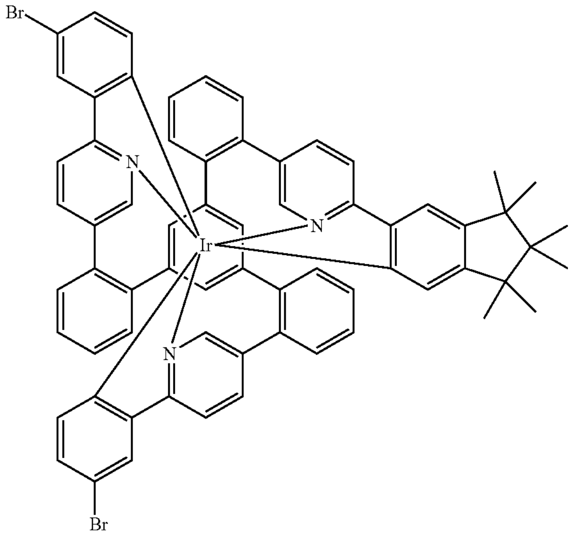
1989601-69-5
2. Synthesis of the metal complex Ir(L1)
Example Ir(L1)
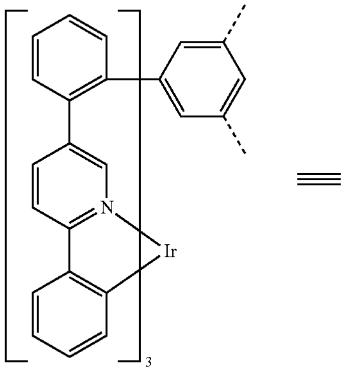
-continued
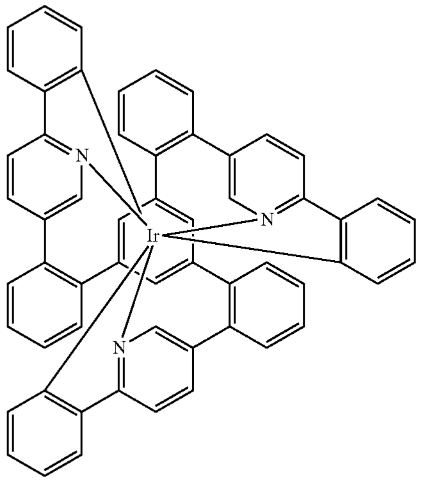

A mixture of 7.66 g (10 mmol) of ligand L1, 4.90 g (10 mmol) of trisacetylacetonatoiridium(III) [15635-87-7] and 120 g of hydroquinone [123-31-9] is initially charged in a 500 ml two-neck round-bottomed flask with a glass-sheathed magnetic core. The flask is provided with a water separator (for media of lower density than water) and an air condenser with argon blanketing. The flask is placed in a metal heating bath. The apparatus is purged with argon from the top via the argon blanketing system for 15 min, allowing the argon to flow out of the side neck of the two-neck flask. Through the side neck of the two-neck flask, a glass-sheathed Pt-100 thermocouple is introduced into the flask and the end is positioned just above the magnetic stirrer core. Then the apparatus is thermally insulated with several loose windings of domestic aluminium foil, the insulation being run up to the middle of the riser tube of the water separator. Then the apparatus is heated rapidly with a heated laboratory stirrer system to 250-260° C., measured with the Pt-100 thermal sensor which dips into the molten stirred reaction mixture. Over the next 1.5 h, the reaction mixture is kept at 250-260° C., in the course of which a small amount of condensate is distilled off and collects in the water separator. After cooling, the melt cake is mechanically comminuted and extracted by boiling with 500 ml of methanol. The beige suspension thus obtained is filtered through a double-ended frit, and the beige solid is washed once with 50 ml of methanol and then dried under reduced pressure. Crude yield: quantitative. The solid thus obtained is dissolved in 1500 ml of dichloromethane and filtered through about 1 kg of silica gel in the form of a dichloromethane slurry (column diameter about 18 cm) with exclusion of air in the dark, leaving dark-coloured components at the start. The core fraction is cut out, substantially concentrated on a rotary evaporator, with simultaneous continuous dropwise addition of MeOH until crystallization. After removal with suction, washing with a little MeOH and drying under reduced pressure, the yellow product is purified further by continuous hot extraction three times with toluene/acetonitrile (3:1, v/v) and hot extraction five times with toluene (amount initially charged in each case about 150 ml, extraction thimble: standard Soxhlet thimbles made from cellulose from Whatman) with careful exclusion of air and light. Yield: 8.52 g (8.9 mmol), 89%. Purity: >99.9% by HPLC.

Example Ir(L2)

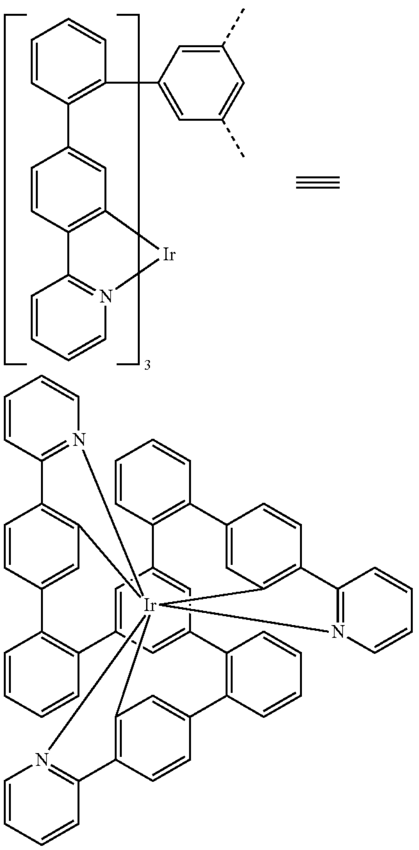

Analogously, Ir(L2) can be prepared using L2 rather than L1. The purification is effected by recrystallization from NMP three times with addition of methanol in the cooling of the solution. Yield: 8.04 g (8.4 mmol), 84%. Purity: >99.7% by HPLC.

In an analogous manner, it is possible to prepare the following metal complexes, with purification as described for Ir (L1).

| Ex. | Ligand | Complex | Yield |
|---|---|---|---|
| Ir(L3) | L3 | 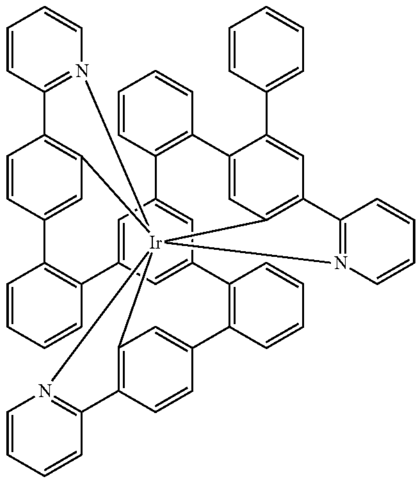 | 87% |

-continued
| Ex. | Ligand | Complex | Yield |
| --- | --- | --- | --- |
| Ir(L4) | L4 | 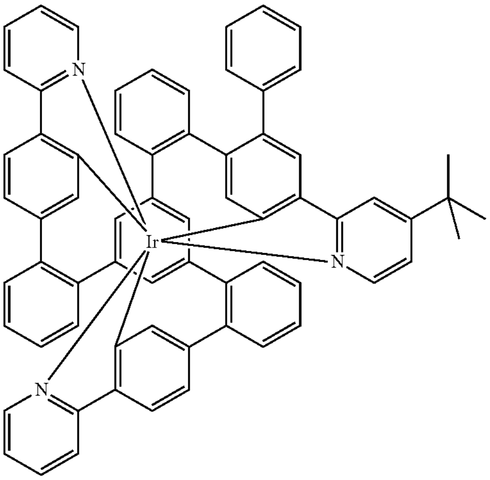 | 89% |
| Ir(L5) | L5 | 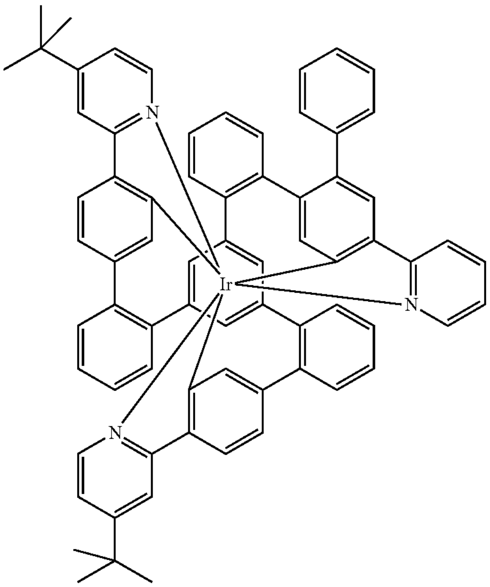 | 86% |

3. Halogenation of the Metal Complex Ir (L1)

General Procedure:

To a solution or suspension of 10 mmol of a complex bearing A×C—H groups in the para position to the iridium in 500 ml to 2000 ml of DCM (dichloromethane) according to the solubility of the metal complex is added, in the dark and with exclusion of air, at −30 to +30° C., A×10.5 mmol of N-halosuccinimide (halogen: Cl, Br, I; A=1 corresponds to monohalogenation, A=2 corresponds to dihalogenation, A=3 corresponds to trihalogenation), and the mixture is stirred for 20 h. Complexes of sparing solubility in DCM may also be converted in other solvents (TCE, THF, DMF, chlorobenzene, etc.) and at elevated temperature. Subsequently, the solvent is substantially removed under reduced pressure. The residue is extracted by boiling with 100 ml of methanol, and the solids are filtered off with suction, washed three times with about 30 ml of methanol and then dried under reduced pressure. Substoichiometric brominations, for example mono- and dibrominations of complexes having 3 C—H groups in the para position to iridium, usually proceed less selectively than the stoichiometric brominations. The crude products of these brominations can be separated by chromatography (CombiFlash Torrent from A. Semrau).

Example Ir(L1-3Br)

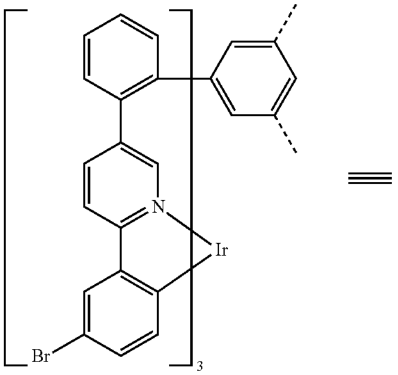

-continued

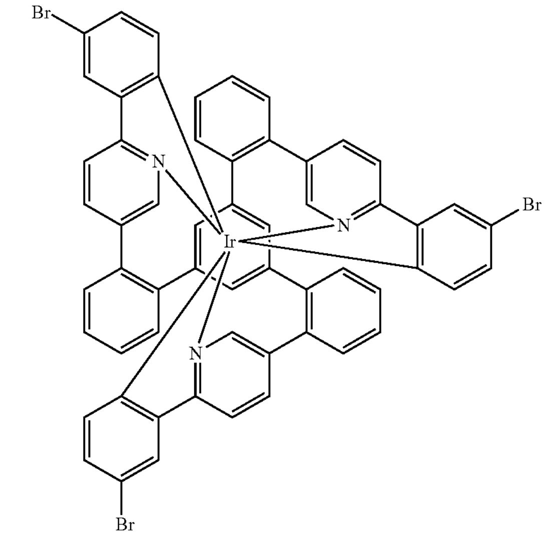

To a suspension, stirred at 0° C., of 9.6 g (10 mmol) of Ir(L1) in 2000 ml of DCM are added 5.6 g (31.5 mmol) of N-bromosuccinimide all at once and then the mixture is stirred for a further 20 h. After removing about 1900 ml of the DCM under reduced pressure, 100 ml of methanol are added to the yellow suspension, which is boiled while stirring, and the solids are filtered off with suction, washed three times with about 30 ml of methanol and then dried under reduced pressure. Yield: 11.3 g (9.5 mmol), 95%; purity: >99.0% by NMR.

In an analogous manner, it is possible to prepare the following complexes:

| Ex. | Reactant > brominated complex | Yield |
|---|---|---|
| | Tribromination | |
| Ir(L2-3Br) | 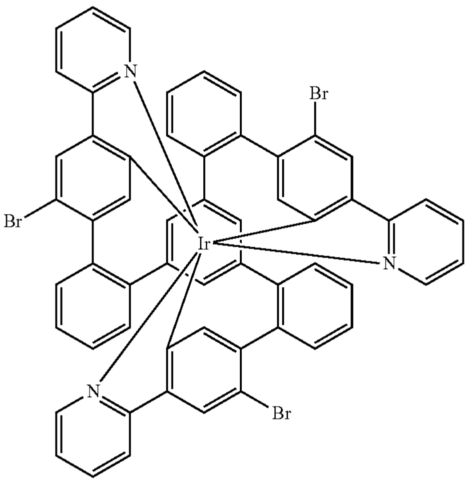<br>Ir(L2) + 40 mmol NBS > Ir(L2-3Br)<br>solvent DCM | 94% |

-continued
| Ex. | Reactant > brominated complex | Yield |
|---|---|---|
| | Dibromination | |
| Ir(L1-2Br) | 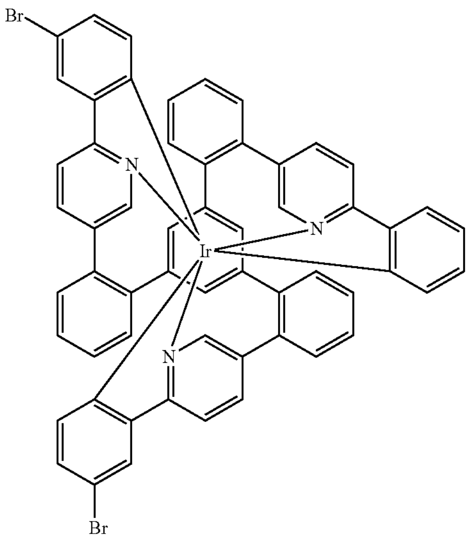 Ir(L1) + 21 mmol NBS > Ir(L1-2Br) solvent MSO | 33% |
| Ir(L2-2Br) | 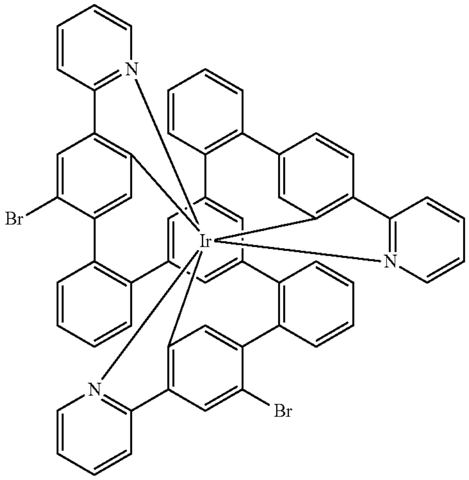 Ir(L2) + 21 mmol NBS > Ir(L2-2Br) solvent DMSO/60° C. | 26% |

-continued
| Ex. | Reactant > brominated complex | Yield |
|---|---|---|
| Ir(L3-2Br) | 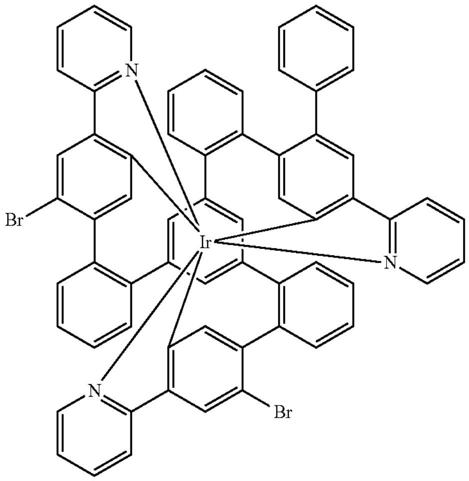 Ir(L3) + 21 mmol NBS > Ir(L3-2Br) solvent DCM/RT | 95% |
| Ir(L4-2Br) | 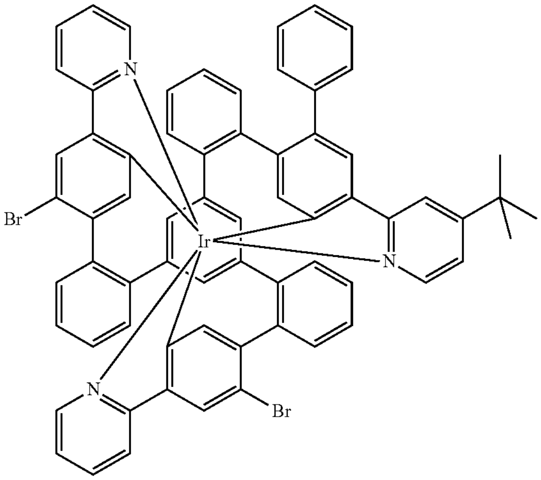 Ir(L4) + 21 mmol NBS > Ir(L4-2Br) solvent DCM/RT | 96% |

-continued
| Ex. | Reactant > brominated complex | Yield |
|---|---|---|
| Ir(L5-2Br) | 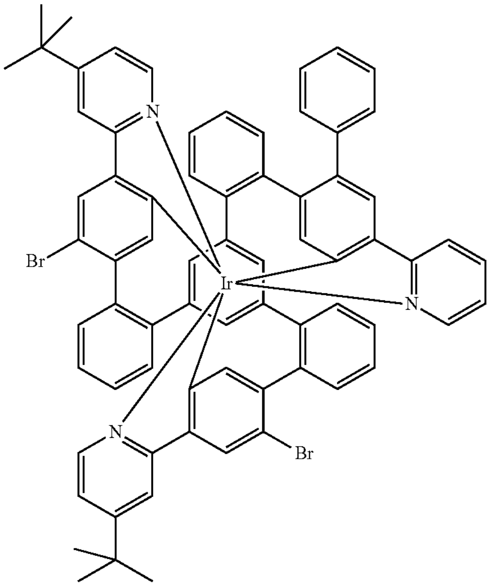<br>Ir(L5) + 21 mmol NBS > Ir(L5-2Br)<br>solvent DCM/RT | 95% |
Monobromination
| | | |
|---|---|---|
| Ir(L1-1Br) | 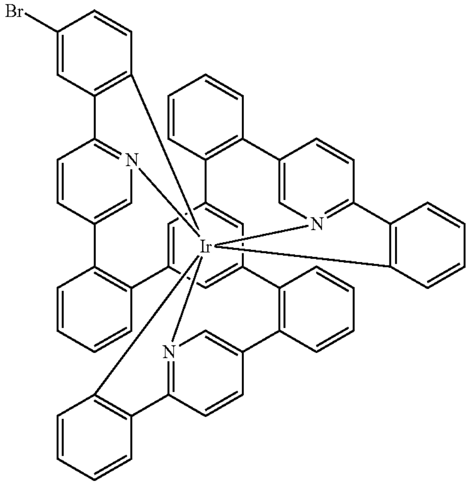<br>Ir(L1) + 10.5 mmol NBS > Ir(L1-1Br)<br>solvent DMSO | 24% |

-continued

| Ex. | Reactant > brominated complex | Yield |
|---|---|---|
| Ir(L2-1 Br) | 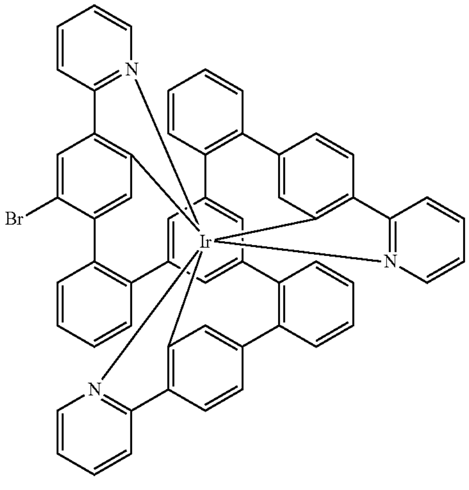 Ir(L2) + 10.5 mmol NBS > Ir(L2-1Br) solvent DMSO/60° C. | 19% |

4. Preparation of the Metal Complexes of the Invention

Variant 1: Suzuki Coupling in a Biphasic Aqueous-Organic Medium

To a mixture of 10 mmol of the brominated metal complex, A×11 mmol of the monoboronic ester with A=1, 2 or 3 for mono-, di- or tribromides, A×30 mmol of tripotassium phosphate [7778-53-2], 300 ml of toluene, 100 ml of dioxane and 100 ml of water are added A×0.6 mmol of tri-o-tolylphosphine [6163-58-2] and A×0.1 mmol of palladium(II) acetate [3975-31-3], and the mixture is stirred well at 100° C. for 18 h. After cooling, the precipitated solids are filtered off with suction. If no solid precipitates out, the organic phase is removed, washed twice with 300 ml each time of water and once with 300 ml of saturated sodium chloride solution and then dried over magnesium sulfate, the magnesium sulfate is filtered off, and the filtrate is concentrated to dryness. The crude product thus obtained is purified by chromatography or flash chromatography (CombiFlash Torrent from Axel Semrau). Further purification is effected by repeated continuous hot extraction, wherein the product is introduced into a cellulose thimble (from Whatman) in a hot extractor and repeatedly hot-extracted (typically 3-6 times) with a suitable hot extractant, for example toluene, chlorobenzene, anisole, ethyl acetate, butyl acetate, acetonitrile, dichloromethane, etc. (initial amount about 150-200 ml), until a purity of >99.5%, preferably >99.9%, is attained.

Variant 2: Suzuki Coupling in a Monophasic Dipolar Aprotic Medium

To a mixture of 10 mmol of the metal complex, A×11 mmol of the monoboronic ester with A=1, 2 or 3 for mono-, di- or tribromides, A×30 mmol of tripotassium phosphate trihydrate [22763-03-7] and 200 ml of DMSO are added A×0.1 mmol of tetrakis(triphenylphosphino)palladium(0) [14221-01-3], and the mixture is stirred well at 80° C. for 18 h. After cooling, the DMSO is substantially removed under reduced pressure, the residue is taken up in 1000 ml of dichloromethane and filtered through a silica gel bed in the form of a dichloromethane slurry, the bed is washed through with 500 ml of dichloromethane and then the organic phase is concentrated to dryness under reduced pressure. The further purification of the crude product thus obtained is effected as described under variant 1.

Example Ir1: MS1+3×S20→(MS1-3×S20)=Ir1

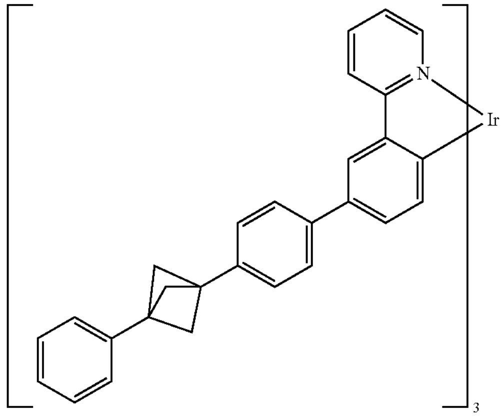

Procedure according to variant 1. Use of 8.92 g (10.0 mmol) of MS1, 11.43 g (33.0 mmol) of S20, 19.12 g (90.0 mmol) of tripotassium phosphate, 548 mg (1.8 mmol) of tri-o-tolylphosphine, 67 mg (0.3 mmol) of palladium(II) acetate. Hot extraction: 5× from toluene. Yield: (4.8 mmol), 48%. Purity: >99.8% by HPLC.

In an analogous manner, it is possible to prepare the following compounds:

| Ex. | Reactants → Product<br>Hot extractant* | Yield |
|---|---|---|
| Ir2 | MS1 + 3xS26 → (MS1-3xS26) = Ir2 | 44% |
| | 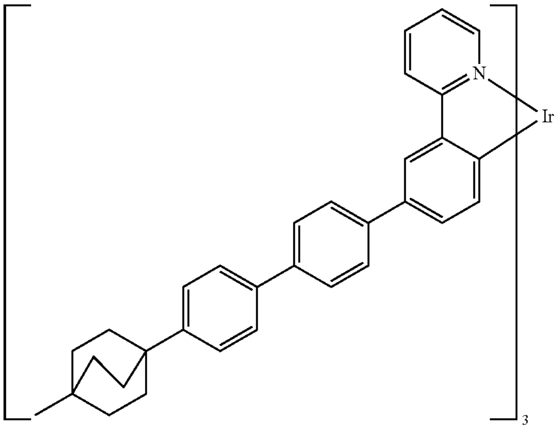 | |
| | xylene | |
| Ir3 | MS1 + 3xS27 → (MS1-3xS27) = Ir3 | 45% |
| Ir4 | MS1 + 3xS41 → (MS1-3xS41) = Ir4 | 41% |
| Ir5 | MS1 + 3xS92 → (MS1-3xS92) = Ir5 | 46% |
| Ir6 | MS1 + 3xS208 → (MS1-3xS208) = Ir6 | 39% |
| Ir7 | MS2 + 2xS37 → (MS2-2xS37) = Ir7 | 59% |
| Ir8 | MS2 + 2xS46 → (MS3-2xS46) = Ir8 | 61% |
| Ir9 | MS3 + 1xS25 → (MS3-1xS25) = Ir9 | 70% |
| Ir10 | MS3 + 1xS92 → (MS3-1xS92) = Ir10 | 68% |
| Ir11 | MS3 + 1xS212 → (MS3-1xS212) = 101 | 71% |
| Ir12 | MS4 + 1xS205 → (MS4-1xS205) = Ir12 | 75% |
| Ir13 | MS5 + 1xS29 → (MS51xS29) = Ir13 | 67% |
| Ir14 | MS6 + 1xS39 → (MS6-1xS39) = Ir14 | 70% |
| Ir15 | MS7 + 1xS42 → (MS7-1xS42) = Ir15 | 72% |
| Ir16 | MS8 + 6S28 → (MS8-6xS28) = Ir16 | 24% |
| Ir17 | MS9 + 1xS211 → (MS9-1xS211) = Ir17 | 66% |
| Ir18 | MS10 + 1xS46 → (MS10-1xS46) = Ir18 | 67% |
| Ir19 | MS11 + 1xS43 → (MS11-1xS43) = Ir19 | 70% |
| Ir20 | MS12 + 1xS93 → (MS12-1xS93) = Ir20 | 67% |
| | 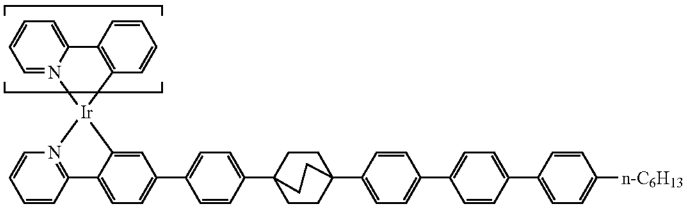 | |
| | mesitylene | |
| Ir21 | MS13 + 2xS26 → (MS13-2xS26) = Ir21 | 53% |
| Ir22 | MS14 + 1xS210 → (MS14-1xS210) = Ir22 | 62% |
| Ir23 | MS15 + 1xS207 → (MS15-1xS207) = Ir23 | 66% |
| Ir24 | MS16 + 2xS27 → (MS16-2xS27) = Ir24 | 53% |
| | 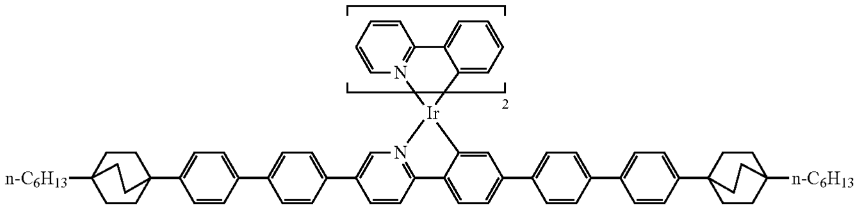 | |

-continued
| Ex. | Reactants → Product<br>Hot extractant* | Yield |
|---|---|---|
| Ir25 | MS17 + 2xS205 → (MS17-2xS205) = Ir25 | 51% |
| Ir26 | MS18 + 2xS209 → (MS18-2xS209) = Ir26 | 54% |
| Ir27 | MS19 + 1xS203 → (MS19-1xS203) = Ir27<br>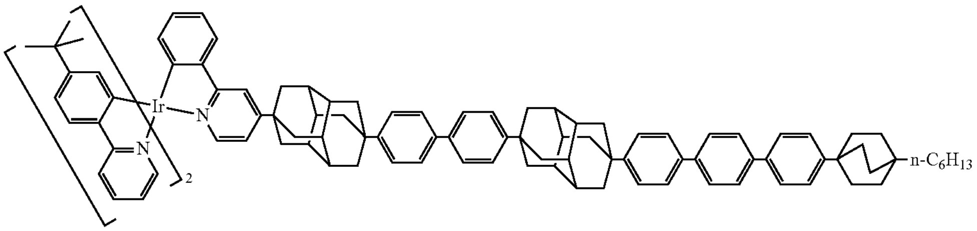 | 68% |
| Ir28 | MS20 + 2xS91 → (MS20-2xS91) = Ir28 | 50% |
| Ir29 | MS21 + 1xS204 → (MS21-1xS204) = Ir29<br>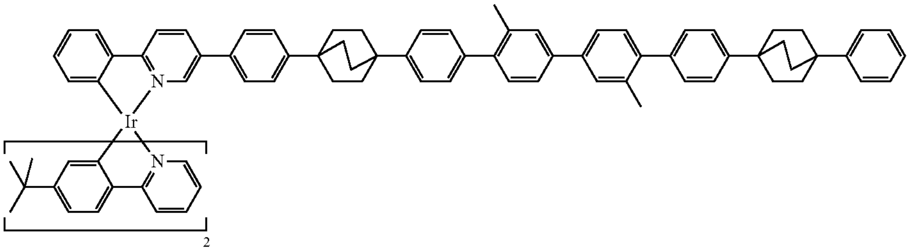 | 62% |
| Ir30 | MS22 + 3xS22 → (MS22-3xS22) = Ir30 | 43% |
| Ir31 | MS23 + 2xS45 → (MS23-2xS45) = Ir31 | 49% |
| Ir32 | MS24 + 3xS41 → (MS24-3xS41) = Ir32<br>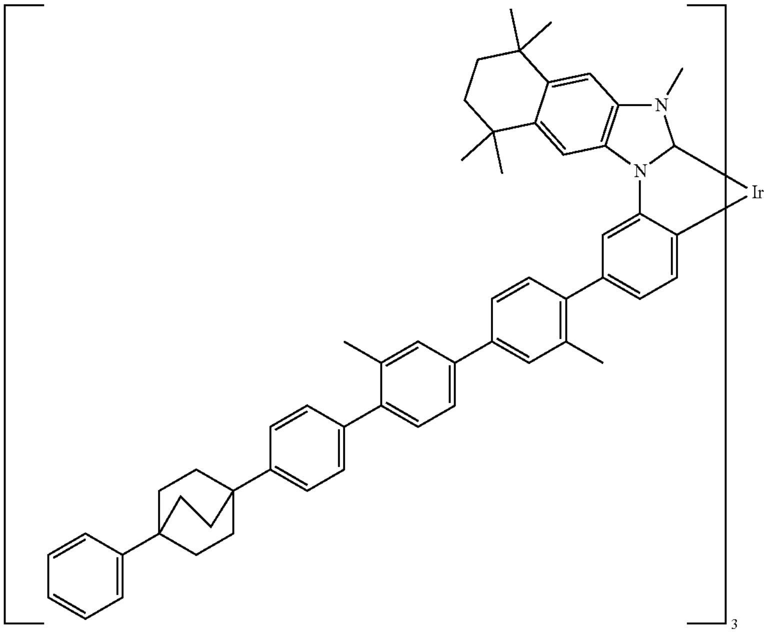 | 54% |

-continued
| Ex. | Reactants → Product<br>Hot extractant* | Yield |
|---|---|---|
| Pt2 | MS27 + 1xS37 → (MS27-1xS37) = Pt2 | 56% |
| Pt3 | MS28 + 2xS205 → (MS28-2xS205) = Pt3 | 34% |
| | 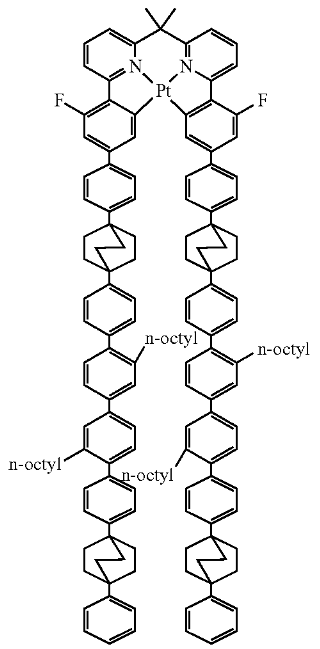 | |
| | Butyl acetate | |
| Ir37 | Ir(L1-3Br) + 3xS28 → Ir(L1-3xS28) = Ir37 | 44% |
| | 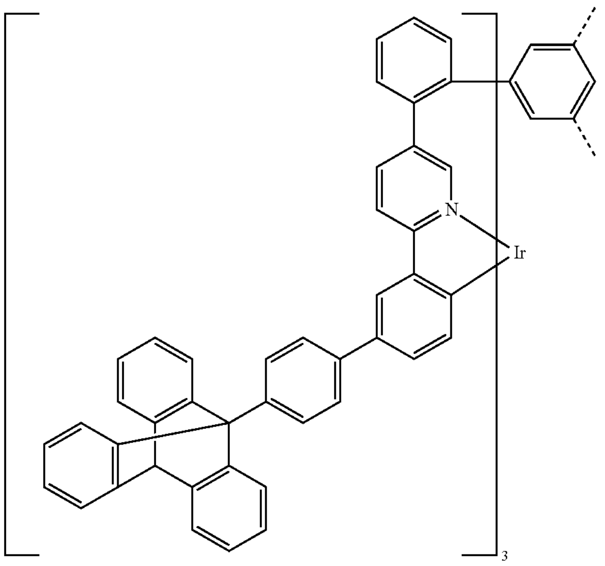 | |
| | Variant 2 - also Ir38 to Ir55 | |
| Ir38 | Ir(L1-3Br) + 3xS26 → Ir(L1-3xS26) = Ir38 | 46% |
| Ir39 | Ir(L1-3Br) + 3xS42 → Ir(L1-3xS42) = Ir39 | 40% |

-continued

| Ex. | Reactants → Product<br>Hot extractant* | Yield |
|---|---|---|
| Ir40 | Ir(L1-3Br) + 3xS205 → Ir(L1-3xS205) = Ir40 | 41% |
| Ir41 | Ir(L1-2Br) + 2xS29 → Ir(L1-2xS29) = Ir41 | 57% |
| | 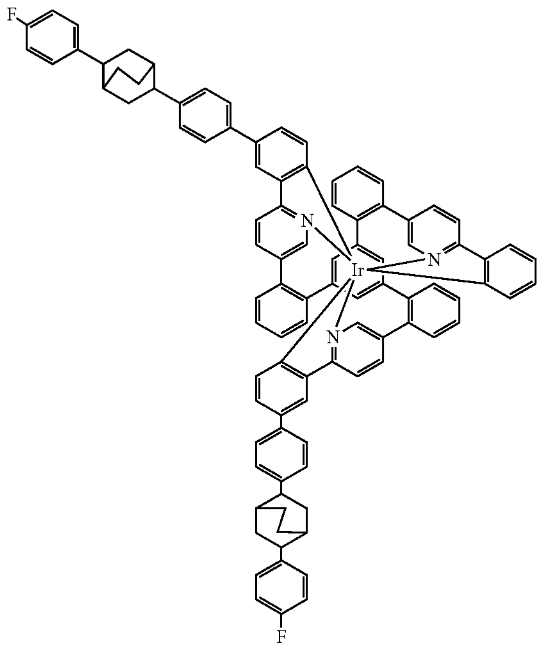<br>Variant 2 | |
| Ir42 | Ir(L1-2Br) + 2xS40 → Ir(L1-2xS40) = Ir42 | 55% |
| Ir43 | Ir(L1-2Br) + 2xS44 → Ir(L1-2xS44) = Ir43 | 55% |
| Ir44 | Ir(L1-2Br) + 2xS2052 → Ir(L1-2xS205) = Ir44 | 58% |
| Ir45 | Ir(L1-1Br) + 1xS29 → Ir(L1-1xS29) = Ir45 | 64% |
| | 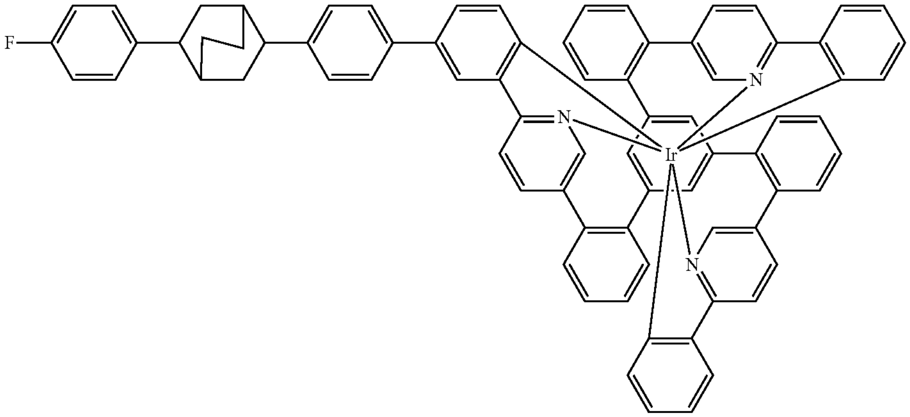<br>Variant 2 | |
| Ir46 | Ir(L1-1Br) + 1xS35 → Ir(L1-1xS35) = Ir46 | 66% |
| Ir47 | Ir(L1-1Br) + 1xS40 → Ir(L1-1xS40) = Ir47 | 70% |
| Ir48 | Ir(L1-1Br) + 1xS44 → Ir(L1-1xS44) = Ir48 | 72% |
| Ir49 | Ir(L1-1Br) + 1xS92 → Ir(L1-1xS92) = Ir49 | 67% |
| Ir50 | Ir(L1-1Br) + 1xS202 → Ir(L1-1xS202) = Ir50 | 65% |
| Ir51 | Ir(L1-1Br) + 1xS203 → Ir(L1-1xS203) = Ir51 | 70% |
| Ir52 | Ir(L1-1Br) + 1xS205 → Ir(L1-1xS205) = Ir52 | 71% |
| Ir53 | Ir(L1-1Br) + 1xS207 → Ir(L1-1xS207) = Ir53 | 76% |

-continued
| Ex. | Reactants → Product<br>Hot extractant* | Yield |
|---|---|---|
| Ir54 | Ir(L1-1Br) + 1xS210 → Ir(L1-1xS210) = Ir54 | 73% |
| Ir55 | Ir(L1-1Br) + 1xS212 → Ir(L1-1xS212) = Ir55 | 69% |
| Ir56 | Ir(L2-3Br) + 3xS27 → Ir(L1-3xS27) = Ir56 | 42% |
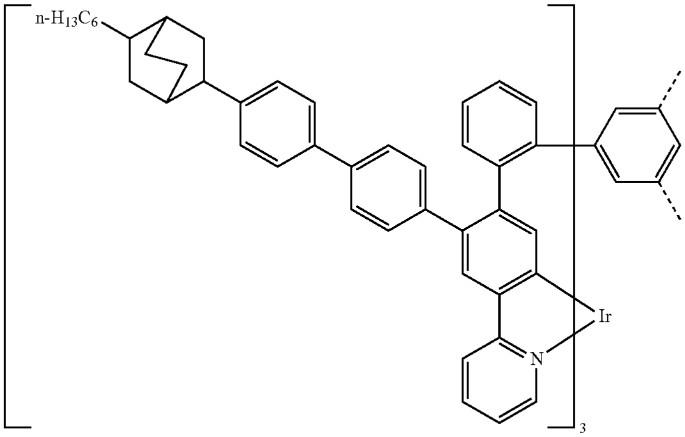
Variant 2 - also Ir57 to Ir60
| | | |
|---|---|---|
| Ir57 | Ir(L2-2Br) + 2xS26 → Ir(L2-2xS26) = Ir57 | 54% |
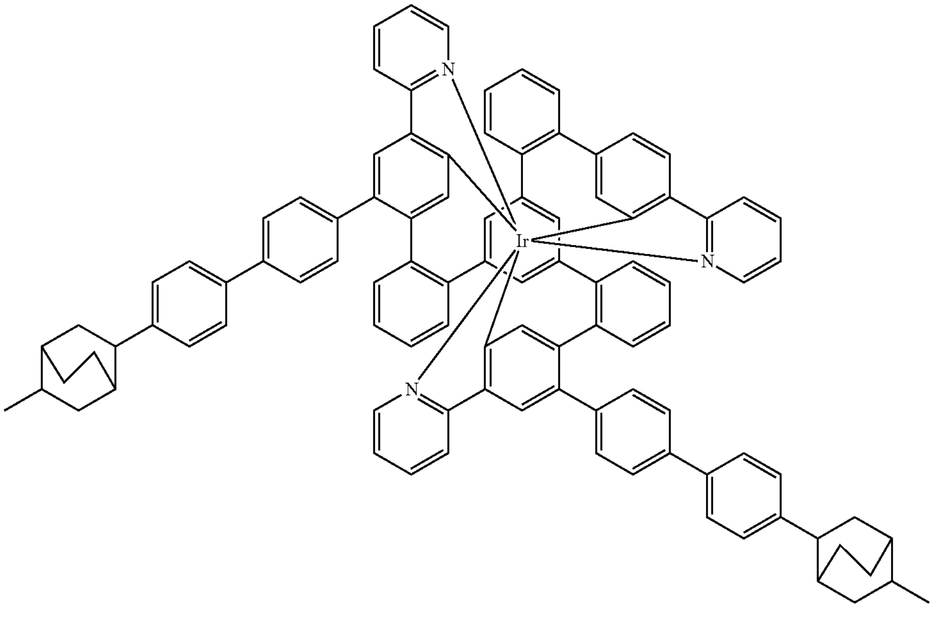

-continued
| Ex. | Reactants → Product<br>Hot extractant* | Yield |
|---|---|---|
| Ir58 | Ir(L2-1Br) + 1xS23 → Ir(L1-1xS23) = Ir58 | 69% |
| | 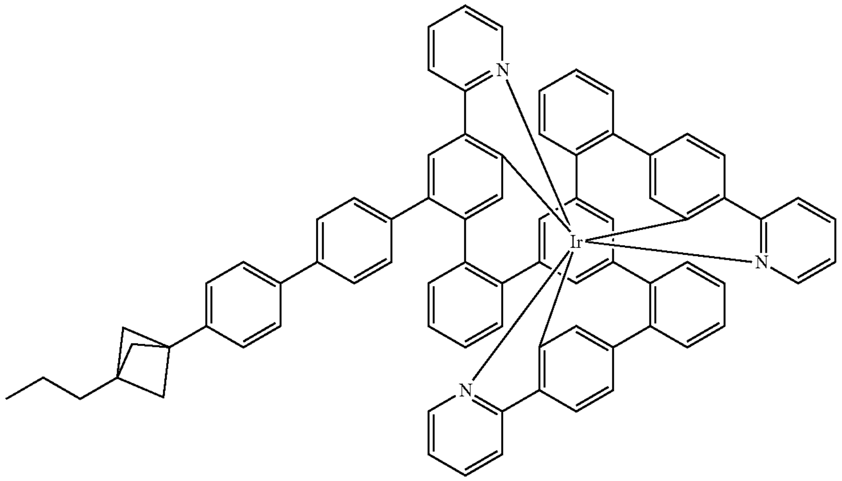 | |
| Ir59 | Ir(L2-1Br) + 1xS210 → Ir(L1-1xS10) = Ir59 | 67% |
| Ir60 | Ir(L2-1Br) + 1xS212 → Ir(L1-1xS212) = Ir60 | 69% |
| Ir61 | MS29 + 2xS205 → (MS29-2xS205) = Ir61 | 55% |
| Ir62 | Ir(L3-2Br) + 2xS26 → Ir(L3-2xS26) = Ir62 | 53% |
| Ir63 | Ir(L3-2Br) + 2xS42 → Ir(L3-2xS42) = Ir63 | 49% |
| Ir64 | Ir(L4-2Br) + 2xS37 → Ir(L4-2xS37) = Ir64 | 51% |
| Ir65 | Ir(L5-2Br) + 2xS46 → Ir(L5-2xS46) = Ir65 | 57% |
| IrRef4 | Ir(L3-2Br) + 2x[5122-95-2] = IrRef4 | |
| | 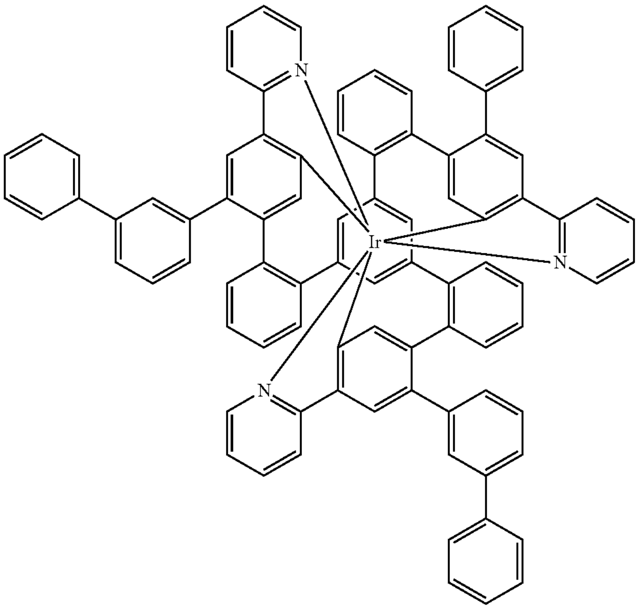 | |

-continued
| Ex. | Reactants → Product<br>Hot extractant* | Yield |
|---|---|---|
| IrRef5 | Ir(L4-2Br) + 2x[5122-94-1] = IrRef5<br>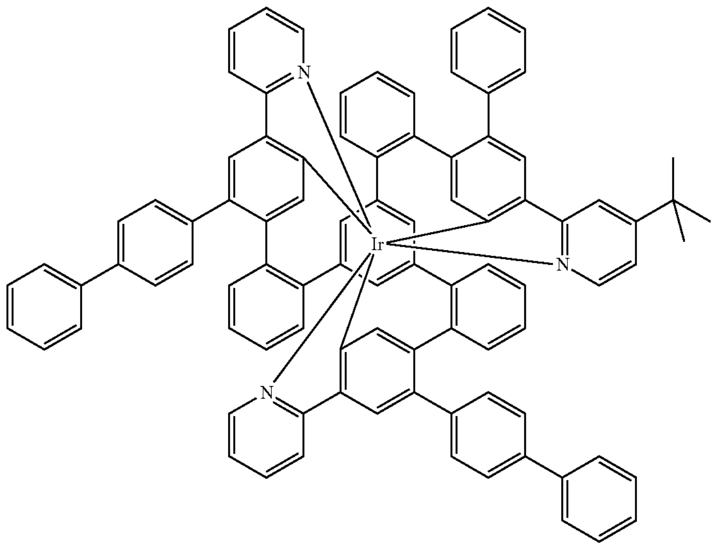 | |
| IrRef6 | Ir(L5-2Br) + 2x[100124-06-9] = IrRef6<br>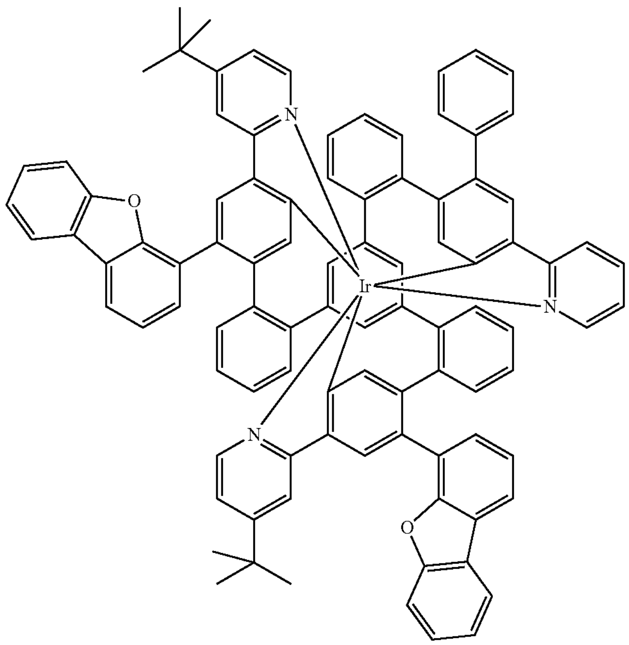 | |

-continued

| Ex. | Reactants → Product<br>Hot extractant* | Yield |
|---|---|---|
| IrRef7 | Ir(L5-2Br) + 2x[395087-89-5] = IrRef7<br>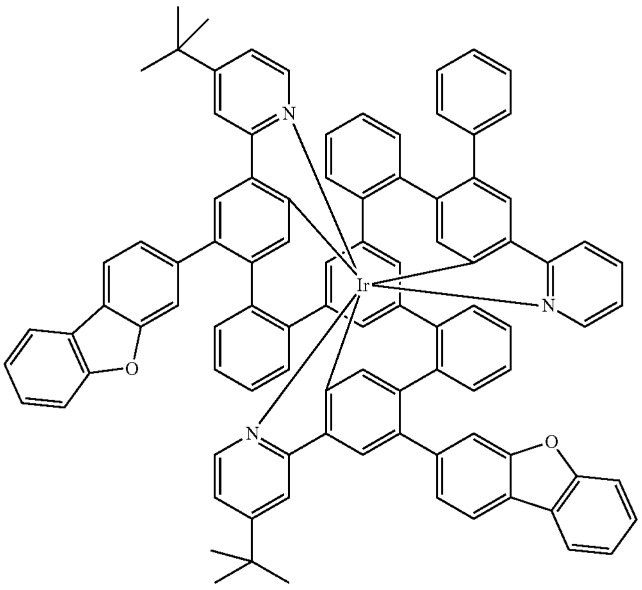 | |

*if different from Example Ir1

5) Oligomeric/Polymeric Metal Complexes

General Polymerization Method for the Bromides or Boronic Acid Derivatives as Polymerizable Group, Suzuki Polymerization Variant A—Biphasic Reaction Mixture The procedure is in accordance with WO 2002/077060 and WO 2003/048225 under inert conditions with carefully degassed solvents. The monomers (bromides and boronic acids or boronic esters, purity by HPLC>99.8%) are converted in the composition specified in the following table in a total concentration of about 100 mmol/l in a mixture of 3 parts by volume of toluene:6 parts by volume of dioxane:2 parts by volume of water. The monomer M1 and the monomer M2 are always initially charged in full. Then 2 molar equivalents of tripotassium phosphate are added per Br functionality used overall, the mixture is stirred for a further 5 min, then 0.06 molar equivalent of tri-ortho-tolylphosphine and then 0.01 molar equivalent of palladium (II) acetate per Br functionality used are added and the mixture is heated under reflux with very good stirring. After 1 h, the rest of the monomers according to the table are added all at once and the mixture is heated under reflux for a further 4 h. If the viscosity of the mixture rises too significantly, dilution is possible with a mixture of 2 parts by volume of toluene:3 parts by volume of dioxane. After a total reaction time of 4-6 h, for end-capping, 0.05 molar equivalent per boronic acid functionality used of a monobromoaromatic, 3-bromobiphenyl [2113-57-7] here, and then, after 30 min, 0.05 molar equivalent per Br functionality used of a monoboronic acid or a monoboronic ester, 3-biphenylboronic acid pinacol ester [912844-88-3] here, are added and the mixture is boiled for a further 1 h. After cooling, the mixture is diluted with 500 ml of toluene, the aqueous phase is removed and the organic phase is washed twice with 300 ml each time of water. The organic phase is stirred at 80° C. with 300 ml of an aqueous 5% by weight N-acetylcysteine solution for 16 h, and the organic phase is removed, dried over magnesium sulfate, filtered through a Celite bed and then concentrated to dryness. The crude polymer is dissolved in THE (concentration about 10-30 g/l) and the solution is allowed to run gradually into twice the volume of methanol with very good stirring. The polymer is filtered off with suction and washed three times with methanol and dried. The reprecipitation operation is repeated five times, then the polymer is dried under reduced pressure to constant weight at 30-50° C.

Variant B—Monophasic Reaction Mixture

The monomers (bromides and boronic acids or boronic esters, purity by HPLC>99.8%) are dissolved or suspended in the composition specified in the table below in a total concentration of about 100 mmol/l in a solvent (THF, dioxane, xylene, mesitylene, dimethylacetamide, NMP, DMSO, etc.). Then 3 molar equivalents of base (potassium fluoride, tripotassium phosphate (anhydrous, monohydrate or trihydrate), potassium carbonate, caesium carbonate, etc., each in anhydrous form) per Br functionality and the equivalent weight of glass beads (diameter 3 mm) are added, the mixture is stirred for a further 5 min, then 0.03 to 0.003 molar equivalent of tri-ortho-tolylphosphine and then 0.005 to 0.0005 molar equivalent of palladium(II) acetate (ratio of phosphine to Pd preferably 6:1) per Br functionality are added and the mixture is heated up to 80° C. to reflux with very good stirring for 2-3 h. Alternatively, it is possible to use other phosphines such as tri-tert-butylphosphine, SPhos, XPhos, RuPhos, XanthPhos, etc., the preferred phosphine: palladium ratio in the case of these phosphines being 2:1 to 1.3:1. After a total reaction time of 4-12 h, for end-capping, 0.05 molar equivalent of a monobromoaromatic (see above) and then, 30 min thereafter, 0.05 molar equivalent of a monoboronic acid or a monoboronic ester (see above) are added and the mixture is boiled for a further 1 h thereafter. The solvent is substantially removed under reduced pressure, the residue is taken up in toluene and the polymer is purified as described in Variant A.

Oligomer/polymer P and the composition thereof composed of monomers M1 to M5, FIGURES in mmol:

| Ex. | M1 | M2 | M3 | M4 | M5 | Yield |
|---|---|---|---|---|---|---|
| IrP1 | MS5<br>20 mmol | LS11<br>100 mmol | LS101<br>90 mmol | — | — | 89% |
| IrP2 | Ir(L1-Br)<br>10 mmol | LS11<br>100 mmol | LS105<br>95 mmol | — | — | 94% |
| IrP3 | Ir(L1-Br)<br>2 mmol | LS11<br>100 mmol | LS106<br>99 mmol | — | — | 90% |
| IrP4 | Ir(L1-Br)<br>10 mmol | S32<br>100 mmol | LS106<br>50 mmol | LS109<br>45 mmol | — | 95% |
| IrP5 | Ir(L1-Br)<br>20 mmol | LS11<br>70 mmol | LS202<br>30 mmol | LS101<br>45 mmol | LS107<br>45 mmol | 96% |
| IrP6 | Ir(L2-Br)<br>1 mmol | LS11<br>100 mmol | LS106<br>99 mmol | — | — | 88% |
| IrP7 | Ir(L2-Br)<br>6 mmol | LS208<br>100 mmol | LS10<br>97 mmol | — | — | 90% |
| IrP8 | S210<br>10 mmol | LS11<br>95 mmol | LS101<br>95 mmol | MS9<br>10 mmol | — | 92% |
| IrP9 | MS9<br>20 mmol | LS11<br>100 mmol | LS113<br>90 mmol | — | — | 92% |

Stereochemistry:

Typically, the mononuclear complex synthesis units are used in the form of a racemate of the Δ and Λ isomers. This leads to diastereomer mixtures in the polynuclear compounds of the invention, for example to Δ,Δ/Λ,Λ and (meso)-Δ,Λ forms for dinuclear compounds. Unless stated otherwise, these are converted or used further as a diastereomer mixture. In addition, it is possible to separate these by chromatographic methods or by fractional crystallization.

Example: Production of the OLEDs

1) Vacuum-Processed Devices

OLEDs of the invention and OLEDs according to the prior art are produced by a general method according to WO 04/058911, which is adapted to the circumstances described here (variation in layer thickness, materials used).

In the examples which follow, the results for various OLEDs are presented. Glass plaques coated with structured ITO (indium tin oxide) of thickness 50 nm form the substrates to which the OLEDs are applied. The OLEDs basically have the following layer structure: substrate/hole transport layer 1 (HTL) consisting of HTN doped with 5% NDP-9 (commercially available from Novaled), 20 nm/hole transport layer 2 (HTL2)/optional electron blocker layer (EBL)/emission layer (EML)/optional hole blocker layer (HBL)/electron transport layer (ETL)/optional electron injection layer (EIL) and finally a cathode. The cathode is formed by an aluminum layer of thickness 100 nm.

There will first be a description of vacuum-processed OLEDs. For this purpose, all materials are applied by thermal vapour deposition in a vacuum chamber. In this case, the emission layer always consists of at least one matrix material (host material) and an emitting dopant (emitter) which is added to the matrix material(s) in a particular proportion by volume by co-evaporation. Details given in such a form as M3:M2:Ir(L2) (55%:35%:10%) mean here that the material M3 is present in the layer in a proportion by volume of 55%, M2 in a proportion by volume of 35% and Ir(L2) in a proportion of 10%. In an analogous manner, the electron transport layer may also consist of a mixture of two materials. The exact structure of the OLEDs can be found in Table 1. The materials used for production of the OLEDs are shown in Table 4.

The OLEDs are characterized in a standard manner. For this purpose, the electroluminescence spectra, the current efficiency (measured in cd/A) and the voltage (measured at 1000 cd/m$^2$) are determined from current-voltage-luminance characteristics (IUL characteristics). For selected experiments, the lifetime is determined. The lifetime is defined as the time after which the luminance has dropped from a particular starting luminance to a certain fraction. The lifetime LD50 means that the lifetime quoted is the time at which the luminance has dropped to 50% of the starting luminance, i.e. from, for example, 1000 cd/m$^2$ to 500 cd/m$^2$. According to the emission colour, different starting brightnesses are chosen. The values for the lifetime can be converted to a FIGURE for other starting luminances with the aid of conversion formulae known to the person skilled in the art. In this context, the lifetime for a starting luminance of 1000 cd/m$^2$ is a customary FIGURE.

Use of Compounds of the Invention as Emitter Materials in Phosphorescent OLEDs

The compounds of the invention can be used inter alia as phosphorescent emitter materials in the emission layer in OLEDs. The comparison used according to the prior art is the iridium compounds according to Table 4. The results for the OLEDs are summarized in Table 2.

TABLE 1

Structure of the OLEDs

| Ex. | HTL2 thickness | EBL thickness | EML thickness | HBL thickness | ETL thickness |
|---|---|---|---|---|---|
| Ref.-D1 | HTM<br>40 nm | — | M1:IrPPy<br>(90%:10%)<br>30 nm | — | ETM1:ETM2<br>(50%:50%)<br>30 nm |
| Ref.-D2 | HTM<br>40 nm | — | M1:IrPPy<br>(90%:10%)<br>30 nm | HBM1<br>10 nm | ETM1:ETM2<br>(50%:50%)<br>30 nm |
| Ref.-D3 | HTM<br>40 nm | — | M1:IrPPy<br>(85%:15%)<br>30 nm | HBM1<br>10 nm | ETM1:ETM2<br>(50%:50%)<br>30 nm |
| D1 | HTM<br>40 nm | — | M1:Ir9<br>(90%:10%)<br>30 nm | — | ETM1:ETM2<br>(50%:50%)<br>30 nm |
| D2 | HTM<br>40 nm | — | M1:Ir9<br>(90%:10%)<br>30 nm | HBM1<br>10 nm | ETM1:ETM2<br>(50%:50%)<br>30 nm |
| D3 | HTM<br>40 nm | — | M1:Ir9<br>(85%:15%)<br>30 nm | HBM1<br>10 nm | ETM1:ETM2<br>(50%:50%)<br>30 nm |
| D4 | HTM<br>40 nm | — | M1:M3:Ir9<br>(60%:30%:10%)<br>30 nm | HBM1<br>10 nm | ETM1:ETM2<br>(50%:50%)<br>30 nm |
| D5 | HTM<br>40 nm | — | M1:M2:Ir13<br>(60%:30%:10%)<br>30 nm | HBM1<br>10 nm | ETM1:ETM2<br>(50%:50%)<br>30 nm |

TABLE 2

Results for the vacuum-processed OLEDs

| Ex. | EQE (%) 1000 cd/m$^2$ | Voltage (V) 1000 cd/m$^2$ | CIE x/y 1000 cd/m$^2$ | LD50 (h) 1000 cd/m$^2$ |
|---|---|---|---|---|
| Ref.-D1 | 15.8 | 2.7 | 0.33/062 | 55000 |
| Ref.-D2 | 15.6 | 3.3 | 0.33/062 | 70000 |

TABLE 2-continued

| Results for the vacuum-processed OLEDs | | | | |
|---|---|---|---|---|
| Ex. | EQE (%) 1000 cd/m$^2$ | Voltage (V) 1000 cd/m$^2$ | CIE x/y 1000 cd/m$^2$ | LD50 (h) 1000 cd/m$^2$ |
| Ref.-D3 | 16.0 | 3.3 | 0.33/062 | 85000 |
| D1 | 20.6 | 2.9 | 0.36/061 | 100000 |
| D2 | 21.5 | 3.4 | 0.36/062 | 105000 |
| D3 | 22.0 | 3.2 | 0.37/060 | 125000 |
| D4 | 21.8 | 3.1 | 0.37/061 | 185000 |
| D5 | 22.3 | 3.3 | 0.36/061 | 175000 |

Solution-Processed Devices

A: Made from Soluble Functional Materials of Low Molecular Weight

The iridium complexes of the invention can also be processed from solution and lead to OLEDs which are significantly simpler in process terms compared to the vacuum-processed OLEDs but nevertheless have very good properties. The production of such components is based on the production of polymeric light-emitting diodes (PLEDs), which has already been described many times in the literature (for example in WO 2004/037887). The structure is composed of substrate/ITO/hole injection layer (60 nm)/interlayer (20 nm)/emission layer (60 nm)/hole blocker layer (10 nm)/electron transport layer (40 nm)/cathode. For this purpose, substrates from Technoprint (soda-lime glass) are used, to which the ITO structure (indium tin oxide, a transparent conductive anode) is applied. The substrates are cleaned in a cleanroom with DI water and a detergent (Deconex 15 PF) and then activated by a UV/ozone plasma treatment. Thereafter, likewise in a cleanroom, a 20 nm hole injection layer is applied by spin-coating. The required spin rate depends on the degree of dilution and the specific spin-coater geometry. In order to remove residual water from the layer, the substrates are baked on a hotplate at 200° C. for 30 minutes. The interlayer used serves for hole transport; in this case, HL-X092 from Merck is used. The interlayer may alternatively also be replaced by one or more layers which merely have to fulfil the condition of not being leached off again by the subsequent processing step of EML deposition from solution. For production of the emission layer, the triplet emitters of the invention are dissolved together with the matrix materials in toluene or chlorobenzene. The typical solids content of such solutions is between 16 and 25 g/I if, like here, the a device is to attain the typical layer thickness of 60 nm by means of spin-coating. The solution-processed type 1a devices contain an emission layer composed of M4:M5:IrL (42%:45%:13%), the type 1b devices contain and emission layer composed of M4:M5:IrL (40%:32%:28%), and the type 2 devices contain an emission layer composed of M4:M5:IrLa:IrLb (30%:35%:30%:5%), meaning that they contain two different Ir complexes. The emission layer is spun on in an inert gas atmosphere, argon in the present case, and baked at 160° C. for 10 min. Vapour-deposited above the latter are the hole blocker layer (10 nm ETM1) and the electron transport layer (40 nm ETM1 (50%)/ETM2 (50%)) (vapour deposition systems from Lesker or the like, typical vapour deposition pressure $5\times10^{-6}$ mbar). Finally, a cathode of aluminium (100 nm) (high-purity metal from Aldrich) is applied by vapour deposition. In order to protect the device from air and air humidity, the device is finally encapsulated and then characterized. The OLED examples cited have not yet been optimized. Table 1 summarizes the data obtained.

TABLE 3

| Results with materials processed from solution | | | | | |
|---|---|---|---|---|---|
| Ex. | Emitter Device | EQE (%) 1000 cd/m$^2$ | Voltage (V) 1000 cd/m$^2$ | CIE x/y | LD50 (h) 1000 cd/m$^2$ |
| Sol-Ref-Red1 | IrRef3 Typ1a | 15.0 | 6.2 | 0.61/0.38 | 4000 |
| Sol-Ref-Red2 | IrRef1 IrRef3 Typ2 | 17.3 | 6.4 | 0.61/0.39 | 240000 |
| Sol-RedD1 | IrRef1 Ir17 Typ2 | 19.9 | 6.2 | 0.64/0.35 | 310000 |
| Sol-RedD2 | IrRef1 Ir18 Typ2 | 20.4 | 6.3 | 0.61/0.38 | 160000 |
| Sol-Ref-Green1 | IrRef1 Typ1a | 19.6 | 5.2 | 0.36/0.61 | 190000 |
| Sol-Ref-Green2 | IrRef1 Typ1b | 19.8 | 4.9 | 0.36/0.61 | 210000 |
| Sol-Ref-Green3 | IrRef4 Typ1b | 22.0 | 5.3 | 0.33/0.64 | 310000 |
| Sol-Ref-Green4 | IrRef5 Typ1b | 21.9 | 5.4 | 0.33/0.62 | 340000 |
| Sol-Ref-Green5 | IrRef6 Typ1b | 21.7 | 5.4 | 0.34/0.62 | 320000 |
| Sol-Ref-Green6 | IrRef7 Typ1b | 21.9 | 5.5 | 0.34/0.62 | 300000 |
| Sol-GreenD1 | Ir5 Typ1a | 20.4 | 5.7 | 0.38/0.58 | 170000 |
| Sol-GreenD2 | Ir6 Typ1b | 21.4 | 5.1 | 0.37/0.60 | 270000 |
| Sol-GreenD3 | Ir11 Typ1b | 21.4 | 5.1 | 0.37/0.60 | 190000 |
| Sol-GreenD4 | Ir12 Typ1b | 22.1 | 5.1 | 0.37/0.60 | 250000 |
| Sol-GreenD5 | Ir15 Typ1b | 22.0 | 5.1 | 0.37/0.60 | 260000 |
| Sol-GreenD6 | Ir19 Typ1b | 21.5 | 5.0 | 0.40/0.58 | 300000 |
| Sol-GreenD7 | Ir23 Typ1b | 22.1 | 5.3 | 0.39/0.58 | 180000 |
| Sol-GreenD8 | Ir25 Typ1b | 24.6 | 5.2 | 0.43/0.55 | 290000 |
| Sol-GreenD9 | Ir29 Typ1b | 23.1 | 5.2 | 0.40/0.58 | 270000 |
| Sol-GreenD10 | Pt3 Typ1b | 25.0 | 5.0 | 0.29/0.64 | — |
| Sol-GreenD11 | Ir37 Typ1b | 20.3 | 5.3 | 0.37/0.60 | 340000 |
| Sol-GreenD12 | Ir44 Typ1b | 24.3 | 5.2 | 0.37/0.60 | 380000 |
| Sol-GreenD13 | Ir54 Typ1b | 25.2 | 5.2 | 0.37/0.60 | 400000 |
| Sol-GreenD14 | Ir55 Typ1b | 24.0 | 5.4 | 0.38/0.58 | 340000 |
| Sol-GreenD15 | IrP1 Typ1b | 22.9 | 5.5 | 0.37/0.60 | 300000 |
| Sol-GreenD16 | IrP3 Typ1b | 25.1 | 5.6 | 0.37/0.59 | 210000 |
| Sol-GreenD17 | Ir61 Typ1b | 22.3 | 5.3 | 0.39/0.59 | 280000 |
| Sol-GreenD18 | Ir62 Typ1b | 22.8 | 5.3 | 0.34/0.62 | 300000 |
| Sol-GreenD19 | Ir63 Typ1b | 22.9 | 5.4 | 0.34/0.62 | 330000 |
| Sol-GreenD20 | Ir64 Typ1b | 23.4 | 5.2 | 0.34/0.62 | 360000 |
| Sol-GreenD21 | Ir65 Typ1b | 23.6 | 5.1 | 0.34/0.61 | 320000 |

TABLE 4
| Structural formulae of the materials used |
| --- |
| 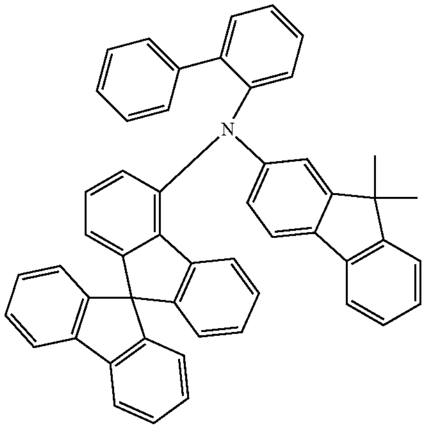 [SMILES: CC1(C)c2ccccc2-c2ccc(N(c3ccccc3-c3ccccc3)c3cccc4c3-c3ccccc3C43c4ccccc4-c4ccccc43)cc21]<br>HTM = M9<br>1450933-44-4 |
| 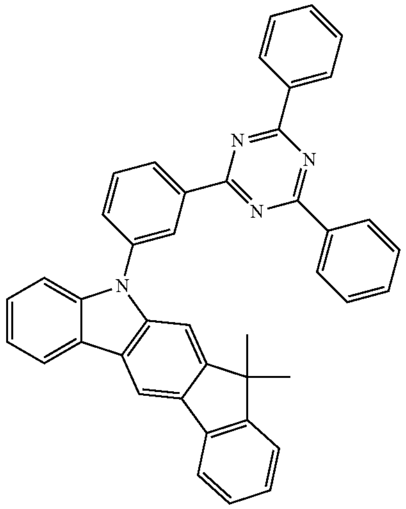 [SMILES: CC1(C)c2ccccc2-c2cc3c4ccccc4n(-c4cccc(-c5nc(-c6ccccc6)nc(-c6ccccc6)n5)c4)c3cc21]<br>M1<br>1257248-13-7 |
| 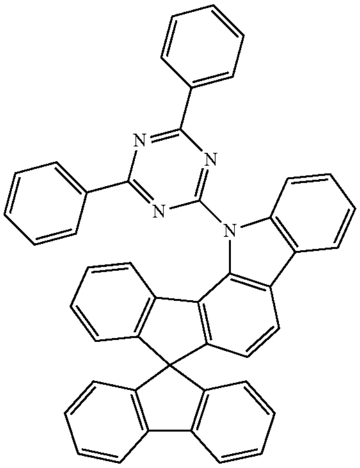 [SMILES: c1ccc(-c2nc(-c3ccccc3)nc(-n3c4ccccc4c4ccc5c(c43)-c3ccccc3C53c4ccccc4-c4ccccc43)n2)cc1]<br>M2<br>1615703-29-1 |
TABLE 4-continued
| Structural formulae of the materials used |
| --- |
| 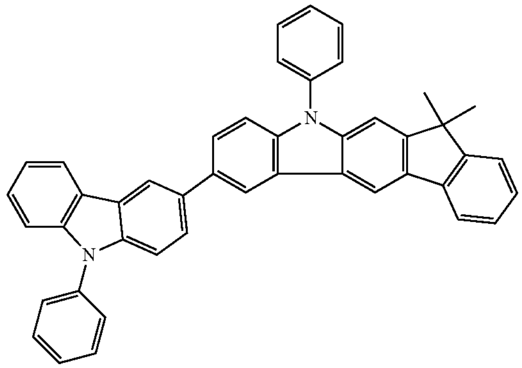 [SMILES: CC1(C)c2ccccc2-c2cc3c4cc(-c5ccc6c(c5)c5ccccc5n6-c5ccccc5)ccc4n(-c4ccccc4)c3cc21]<br>M3<br>1357150-54-9 |
| 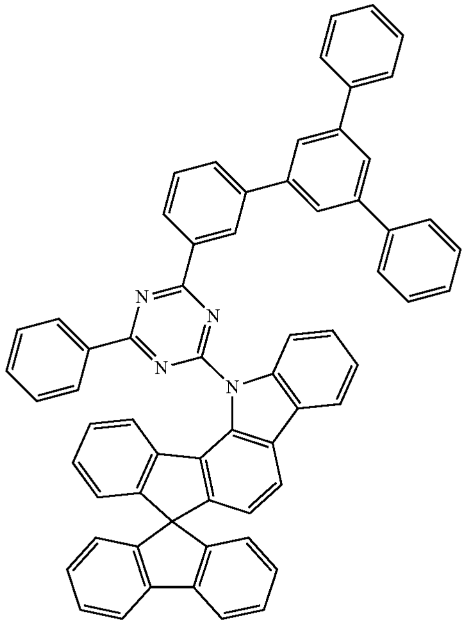 [SMILES: c1ccc(-c2cc(-c3ccccc3)cc(-c3cccc(-c4nc(-c5ccccc5)nc(-n5c6ccccc6c6ccc7c(c65)-c5ccccc5C75c6ccccc6-c6ccccc65)n4)c3)c2)cc1]<br>M4<br>1616231-60-7 |
| 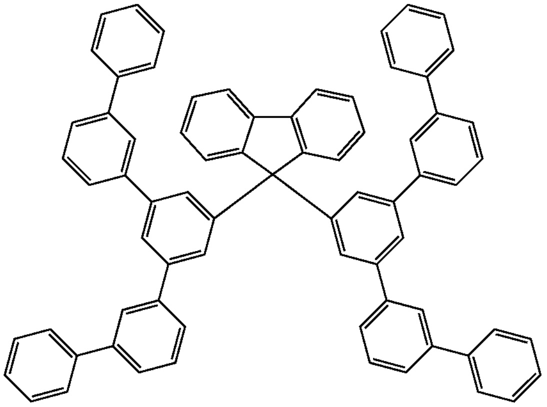 [SMILES: c1ccc(-c2cccc(-c3cc(-c4cccc(-c5ccccc5)c4)cc(C4(c5cc(-c6cccc(-c7ccccc7)c6)cc(-c6cccc(-c7ccccc7)c6)c5)c5ccccc5-c5ccccc54)c3)c2)cc1]<br>M5<br>1246496-85-4 |

TABLE 4-continued

Structural formulae of the materials used

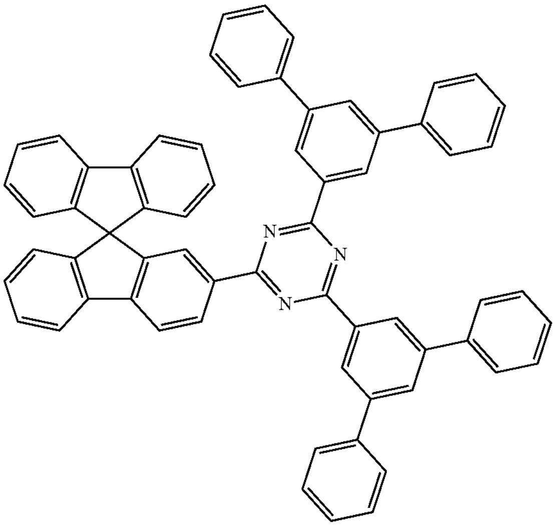 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]

ETM1 = HBM1 = M10
1233200-52-6

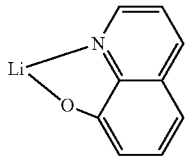

ETM2
25387-93-3

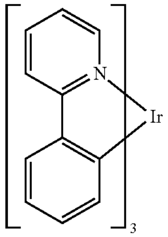

IrPPy
693794-98-8

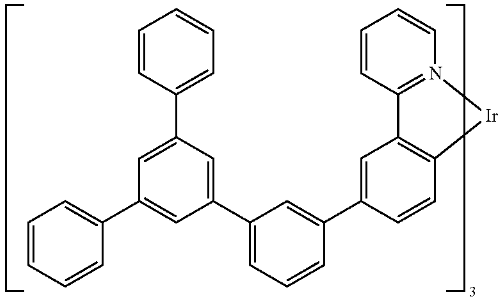

IrRef1
1269508-30-6

TABLE 4-continued

Structural formulae of the materials used

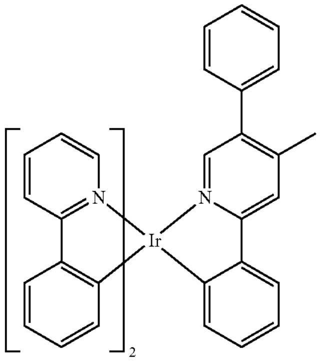

IrRef2
1215692-34-4

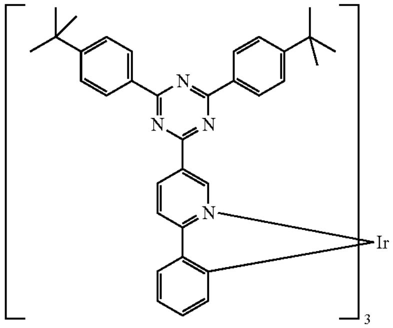

IrRef3
1202823-72-0

The invention claimed is:

1. A compound of formula (1):

Formula (1)

$$M - [[[Ar]_p - B - [Ar]_q]_m - R^B]_n \quad (1)$$

wherein

M is the same or different in each instance and is an organometallic iridium complex comprising three bidentate, monoanionic ligands or one tripodal, hexadentate, trianionic ligand;

Ar is the same or different in each instance and is a linear-bonded arylene or a linear-bonded heteroarylene group which has 6 to 30 aromatic ring atoms and is optionally substituted by one or more R radicals;

B is a group of formula (2):

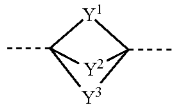

(2)

wherein the dotted lines denote the linkages of this group to Ar or to $R^B$;

$Y^1$, $Y^2$, and $Y^3$ are the same or different in each instance and are $CR_2$, $CR_2—CR_2$, $CR_2—CR_2—CR_2$, $CR_2—CR_2—CR_2—CR_2$, CR—CR, or an ortho-bonded phenylene group which is optionally substituted by one or more R radicals; and wherein the $Y^1$, $Y^2$, and/or $Y^3$ groups are optionally joined to one another by a single bond or via R radicals so as to define an oligocyclic group;

$R^B$ is the same or different in each instance and is M or H, D, a straight-chain alkyl group having 1 to 20 carbon atoms or a branched or cyclic alkyl group having 3 to 20 carbon atoms, wherein the alkyl group is optionally substituted in each case by one or more $R^1$ radicals, or an aromatic or heteroaromatic ring system which has 5 to 40 aromatic ring atoms and is optionally substituted in each case by one or more $R^1$ radicals;

R is the same or different in each instance and is H, D, F, Cl, Br, I, $N(R^1)_2$, CN, $NO_2$, $OR^1$, $SR_1$, COOH, C(═O) $N(R^1)_2$, $Si(R^1)_3$, $B(OR^1)_2$, C(═O) $R^1$, P(═O) $(R^1)_2$, S(═O) $R^1$, $S(═O)_2R^1$, $OSO_2R^1$, a straight-chain alkyl group having 1 to 20 carbon atoms or a branched or cyclic alkyl group having 3 to 20 carbon atoms, wherein the alkyl group is optionally substituted in each case by one or more $R^1$ radicals, wherein one or more nonadjacent $CH_2$ groups are optionally replaced by $R^1C═CR_1$, C≡C, $Si(R^1)_2$, C═O, $NR^1$, O, S, or $CONR^1$, or an aromatic or heteroaromatic ring system which has 5 to 40 aromatic ring atoms and is optionally substituted in each case by one or more $R^1$ radicals; and wherein two R radicals together optionally define a ring system;

$R^1$ is the same or different in each instance and is H, D, F, Cl, Br, I, $N(R^2)_2$, CN, $NO_2$, $OR^2$, $SR^2$, $Si(R^2)_3$, $B(OR^2)_2$, C(═O) $R^2$, P(═O) $(R^2)_2$, S(═O) $R^2$, $S(═O)_2R^2$, $OSOR^2$, a straight-chain alkyl group having 1 to 20 carbon atoms or a branched or cyclic alkyl group having 3 to 20 carbon atoms, wherein the alkyl group is optionally substituted in each case by one or more $R^2$ radicals, wherein one or more nonadjacent $CH_2$ groups are optionally replaced by $R^2C≡CR_2$, C≡C, $Si(R^2)_2$, C—O, $NR^2$, O, S, or $CONR^2$, or an aromatic or heteroaromatic ring system which has 5 to 40 aromatic ring atoms and is optionally substituted in each case by one or more $R^2$ radicals; and wherein two or more $R^1$ radicals together optionally define a ring system;

$R^2$ is the same or different in each instance and is H, D, F, or an aliphatic, aromatic, or heteroaromatic organic radical having 1 to 20 carbon atoms, wherein one or more hydrogen atoms are optionally replaced by F;

n is 1, 2, 3, 4, 5, or 6;

p is the same or different in each instance and has a value from 1 to 100;

q is the same or different in each instance and has a value from 0 to 100; and m is the same or different in each instance and has a value from 1 to 100; and provided that Ar is substituted by at least two alkyl groups.

2. The compound of claim 1, wherein the triplet energy of M is not more than 0.1 eV greater than the triplet energy of $—[[Ar]_p\text{-B-}[Ar]_q]_m—R^B$ when q is 0 or than that of $—[[Ar]_p—B—[Ar]_q]_m—R^B$ when q has a value from 1 to 100.

3. The compound of claim 1, wherein the complex is an iridium complex comprising three bidentate, monoanionic ligands.

4. The compound of claim 1, wherein Mis an iridium complex having a tripodal, hexadentate ligand, where the tripodal, hexadentate ligand comprises three bidentate sub-ligands, which are optionally the same or different, and coordinate to an iridium atom and the three bidentate sub-ligands are joined via a bridge of formula (3) or (4):

(3)

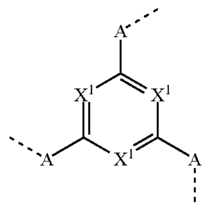

(4)

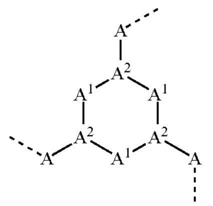

wherein the dotted line denotes the bond of the bidentate sub-ligands to this structure;

X is the same or different in each instance and is CR or N;

$A^1$ is the same or different in each instance and is $C(R)_2$ or O;

$A^2$ is the same or different in each instance and is CR, P(═O), B, or SiR, with the proviso that, when $A^2$ is P(═O), B, or SiR, $A^1$ is O and the A bonded to said $A^2$ is not-C(═O)—NR'— or —C(═O)—O—;

A is the same or different in each instance and is —CR═CR—, —C(═O)—NR'—, —C(═O)—O—, $—CR_2—CR_2—$, or a group of formula (5):

(5)

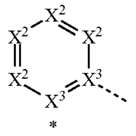

wherein the dotted line denotes the position of the bond of the bidentate sub-ligands to this structure and * denotes the position of the linkage of a direct bond from the group of formula (5) to the central cyclic group in formula (3) or formula (4);

$X^2$ is the same or different in each instance and is CR or N or two adjacent $X^2$ groups together are NR, O, or S, so as to define a five-membered ring, and the remaining $X^2$ groups are the same or different in each instance and are CR or N; or two adjacent $X^2$ groups together are CR or N when one of the $X^3$ groups in the cycle is N so as to define a five-membered ring; with the proviso that not more than two adjacent $X^2$ groups are N;

$X^3$ is C in each instance or one $X^3$ group is N and the other $X^3$ group in the same cycle is C; with the proviso that two adjacent $X^2$ groups together are CR or N when one of the $X^3$ groups in the cycle is N;

R' is the same or different in each instance and is H, D, a straight-chain alkyl group having 1 to 20 carbon atoms or a branched or cyclic alkyl group having 3 to 20 carbon atoms, wherein the alkyl group in each case is optionally substituted by one or more $R^1$ radicals and wherein one or more nonadjacent $CH_2$ groups are optionally replaced by $Si(R^1)_2$, or an aromatic or heteroaromatic ring system which has 5 to 40 aromatic ring atoms and is optionally substituted in each case by one or more $R^1$ radicals; and wherein the three bidentate sub-ligands, in addition to via the bridges of formula (3) or (4), are also optionally closed via a further bridge to form a cryptate.

5. The compound of claim 4, wherein the group of formula (3) is selected from the group consisting of structures of formulae (6) through (9) and wherein the group of formula (4) is selected from the group consisting of structures of formulae (10) through (14):

Formula (6)

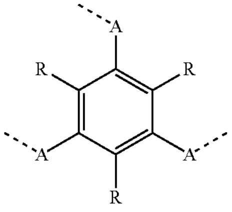

Formula (7)

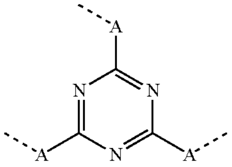

Formula (8)

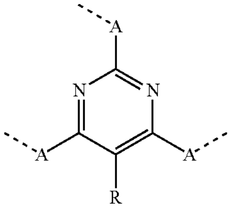

Formula (9)

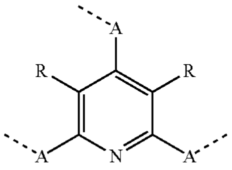

Formula (10)

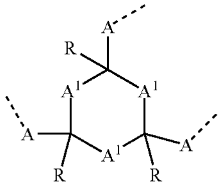

-continued

Formula (11)

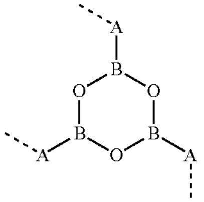

Formula (12)

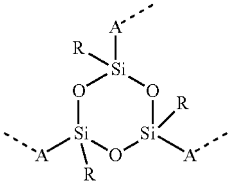

Formula (13)

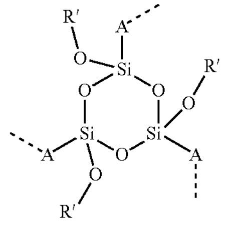

Formula (14)

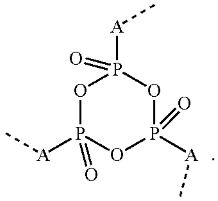

6. The compound of claim 4, wherein two A groups are the same and also have the same substitution and the third A group is different from the first two A groups, or wherein all three A groups are the same and also have the same substitution, or wherein A is the same or different in each instance and is selected from the group consisting of —C(═O)—O—, —C(═O)—NR'—, or a group of formulae (15) through (39):

Formula (15)

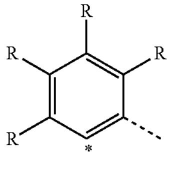

Formula (16)

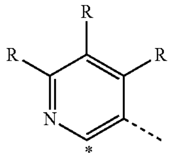

-continued
Formulas (17)
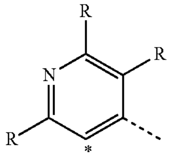
Formula (18)
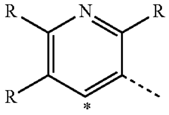
Formula (19)
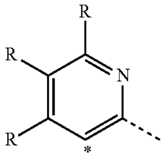
Formula (20)
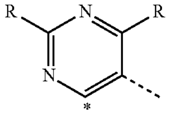
Formula (21)
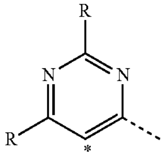
Formula (22)
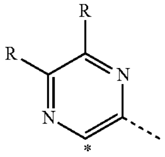
Formula (23)
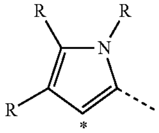
Formula (24)
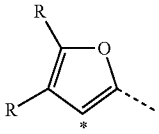
Formula (25)
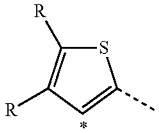
Formula (26)
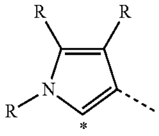
-continued
Formula (27)
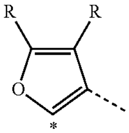
Formula (28)
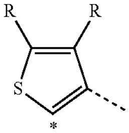
Formula (29)
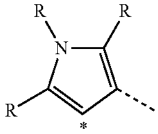
Formula (30)
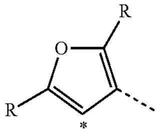
Formula (31)
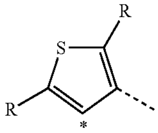
Formula (32)
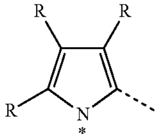
Formlua (33)
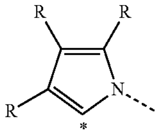
Formula(34)
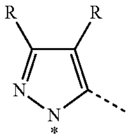
Formula (35)
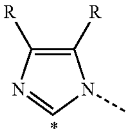
Formula (36)
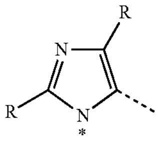

-continued

Formula (37)

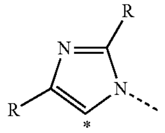

Formula (38)

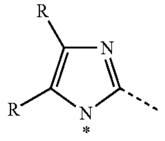

Formula (39)

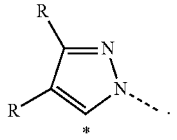

7. The compound of claim 4, wherein the bidentate sub-ligands are the same or different in each instance and are selected from the group consisting of structures formulae (L-1), (L-2), and (L-3):

(L-1)

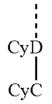

(L-2)

(L-3)

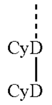

wherein the dotted lines denotes the bond of the sub-ligand to the bridge of formula (3) or (4);

CyC is the same or different in each instance and is a substituted or unsubstituted aryl or heteroaryl group which has 5 to 14 aromatic ring atoms, each of which coordinates to the metal via a carbon atom and which is bonded in each case to CyD via a covalent bond;

CyD is the same or different in each instance and is a substituted or unsubstituted heteroaryl group which has 5 to 14 aromatic ring atoms and coordinates to the metal via a nitrogen atom or via a carbene carbon atom and which is bonded to CyC via a covalent bond; and wherein two or more of the optional substituents together optionally define a ring system.

8. The compound of claim 1 wherein three bidentate ligands, which are optionally the same or different, coordinate to one iridium atom, wherein the —$[[Ar]_p$—B—$[Ar]_q]_m$-$R^B$ group binds to one of the three bidentate ligands or, when n is greater than 1, the —$[[Ar]_p$—B—$[Ar]_q]_m$—$R^B$ group also binds to two or three of the bidentate ligands, wherein the bidentate ligands are selected from the group consisting of structures formulae (L-1') and (L-3'):

(L-1')

(L-3')

wherein

CyC is the same or different in each instance and is a substituted or unsubstituted aryl or heteroaryl group which has 5 to 14 aromatic ring atoms, each of which coordinates to the metal via a carbon atom and which is bonded in each case to CyD via a covalent bond;

CyD is the same or different in each instance and is a substituted or unsubstituted heteroaryl group which has 5 to 14 aromatic ring atoms and coordinates to the metal via a nitrogen atom or via a carbene carbon atom and which is bonded to CyC via a covalent bond; and wherein two or more of the optional substituents together optionally define a ring system.

9. The compound of claim 1, wherein Ar is the same or different in each instance and is selected from the group consisting of groups of formulae (Ar-1) through (Ar-10);

(Ar-1)

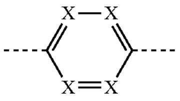

(Ar-2)

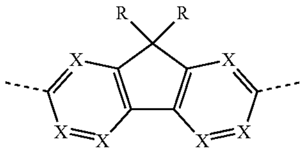

(Ar-3)

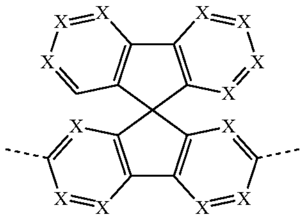

(Ar-4)

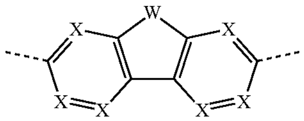

(Ar-5)

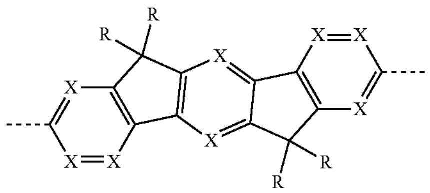

-continued (Ar-6)

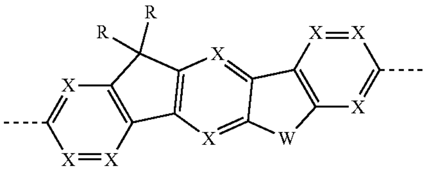

(Ar-7)

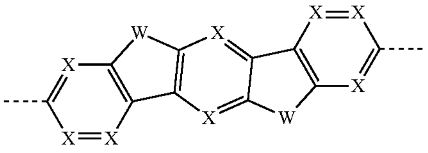

(Ar-8)

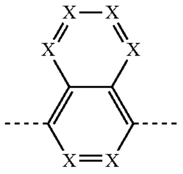

(Ar-9)

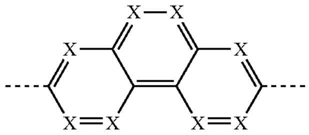

(Ar-10)

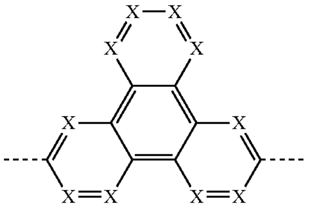

wherein the dotted lines denote the linkages of these groups;

X is the same or different in each instance and is CR or N, wherein not more than two X per Ar group are N; and W is the same or different in each instance and is NR, O, or S.

10. The compound of claim 1, wherein the $Y^1$, $Y^2$ and $Y^3$ groups are the same and are $CH_2$, $CH_2—CH_2$, $CH_2—CH_2—CH_2$, $CH_2—CH_2—CH_2—CH_2$ or an unsubstituted ortho-phenylene group.

11. The compound of claim 1, wherein the groups of formula (2) are selected from the group consisting of structures (B-1) through (B-6):

(B-1)

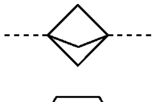

(B-2)

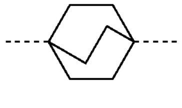

(B-3)

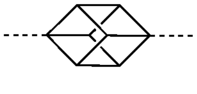

-continued (B-4)

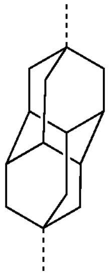

(B-5)

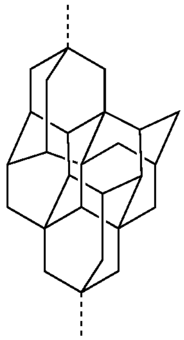

(B-6)

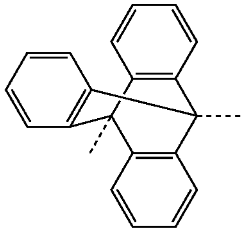

wherein the dotted lines in each case represent the linkages of these groups.

12. The compound of claim 1, wherein $R^B$ is selected from the group consisting of H, M, a straight-chain alkyl group having 1 to 10 carbon atoms or a branched or cyclic alkyl group having 3 to 10 carbon atoms, wherein the alkyl group are optionally substituted in each case by one or more $R^1$ radicals, or an aromatic or heteroaromatic ring system which has 6 to 24 aromatic ring atoms and is optionally substituted in each case by one or more $R^1$ radicals.

13. An oligomer, polymer, or dendrimer comprising one or more compounds of claim 1, wherein one or more bonds of the one or more compounds to the polymer, oligomer, or dendrimer are present.

14. A formulation comprising at least one compound of claim 1 and at least one further compound.

15. A formulation comprising an oligomer, polymer, or dendrimer of claim 13 and at least one further compound.

16. An electronic device comprising at least one compound of claim 1.

17. An electronic device comprising at least one oligomer, polymer, or dendrimer of claim 15.

18. The electronic device of claim 16, wherein the electronic device is selected from the group consisting organic electroluminescent devices, organic integrated circuits, organic field-effect transistors, organic thin-film transistors, organic light-emitting transistors, organic solar cells, organic optical detectors, organic photoreceptors, organic field-quench devices, light-emitting electrochemical cells, oxygen sensors, and organic laser diodes.

19. The electronic device of claim 17, wherein the electronic device is selected from the group consisting organic electroluminescent devices, organic integrated circuits, organic field-effect transistors, organic thin-film transistors, organic light-emitting transistors, organic solar cells, organic optical detectors, organic photoreceptors, organic field-quench devices, light-emitting electrochemical cells, oxygen sensors, and organic laser diodes.

20. The electronic device of claim 16, wherein the electronic device is an organic electroluminescent device, wherein the organic electroluminescent device comprises one or more emitting layers comprising the at least one compound.

* * * * *